US012787882B2

(12) United States Patent
Jung et al.

(10) Patent No.: US 12,787,882 B2
(45) Date of Patent: Nov. 3, 2026

(54) SEMICONDUCTOR PACKAGE AND METHOD OF MANUFACTURING THE SEMICONDUCTOR PACKAGE

(71) Applicant: SAMSUNG ELECTRONICS CO., LTD., Suwon-si (KR)

(72) Inventors: Jaemok Jung, Suwon-si (KR); Dowan Kim, Suwon-si (KR); Sungkeun Park, Suwon-si (KR); Jongho Park, Suwon-si (KR); Juil Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 374 days.

(21) Appl. No.: 18/516,367

(22) Filed: Nov. 21, 2023

(65) Prior Publication Data

US 2024/0213223 A1 Jun. 27, 2024

(30) Foreign Application Priority Data

Dec. 22, 2022 (KR) ........................ 10-2022-0182247

(51) Int. Cl.
*H10W 10/17* (2026.01)
*H10W 20/42* (2026.01)
(Continued)

(52) U.S. Cl.
CPC ........... *H10W 90/00* (2026.01); *H10W 20/42* (2026.01); *H10W 70/65* (2026.01);
(Continued)

(58) Field of Classification Search
CPC ..... H10W 90/00; H10W 20/42; H10W 70/65; H10W 74/111; H10W 90/701;
(Continued)

(56) References Cited

U.S. PATENT DOCUMENTS 6,191,023 B1 2/2001 Chen
6,242,813 B1 6/2001 Huang et al.
(Continued)

FOREIGN PATENT DOCUMENTS

KR 10-2017-0028901 3/2017
KR 10-2423324 B1 7/2022

OTHER PUBLICATIONS

Office Action dated Aug. 24, 2026 issued by Korean Patent Office in Application No. 10-2022-0182247.

*Primary Examiner* — Theresa T Doan
(74) *Attorney, Agent, or Firm* — Sughrue Mion, PLLC

(57) ABSTRACT

A semiconductor package includes a first redistribution wiring layer having a first region and a second region surrounding the first region, a semiconductor chip disposed on the first region of the first redistribution wiring layer, a sealing member covering the semiconductor chip on the first redistribution wiring layer, vertical conductive wires penetrating the sealing member on the second region of the first redistribution wiring layer, a second redistribution wiring layer disposed on the sealing member and including second redistribution wirings electrically connected to the vertical conductive wires, and bonding pads provided on an upper surface of the first redistribution wiring layer or a lower surface of the second redistribution wiring layer, each bonding pad having a concavo-convex pattern on an upper surface of the bonding pad. The vertical conductive wires are bonded to the concavo-convex patterns of the bonding pads, respectively.

20 Claims, 42 Drawing Sheets

(51) Int. Cl.

| | |
|---|---|
| ***H10W 70/65*** | (2026.01) |
| ***H10W 74/10*** | (2026.01) |
| ***H10W 90/00*** | (2026.01) |
| *H10W 72/00* | (2026.01) |
| *H10W 72/90* | (2026.01) |
| *H10W 74/00* | (2026.01) |
| *H10W 74/15* | (2026.01) |
| *H10W 80/00* | (2026.01) |
| *H10W 90/20* | (2026.01) |

(52) U.S. Cl.

CPC ........ *H10W 74/111* (2026.01); *H10W 90/701* (2026.01); *H10W 72/884* (2026.01); *H10W 72/932* (2026.01); *H10W 74/00* (2026.01); *H10W 74/15* (2026.01); *H10W 80/732* (2026.01); *H10W 90/297* (2026.01); *H10W 90/726* (2026.01); *H10W 90/732* (2026.01); *H10W 90/736* (2026.01); *H10W 90/752* (2026.01); *H10W 90/754* (2026.01); *H10W 90/796* (2026.01)

(58) Field of Classification Search

CPC . H10W 72/884; H10W 72/932; H10W 74/00; H10W 74/15; H10W 80/732; H10W 90/297; H10W 90/726; H10W 90/732; H10W 90/736; H10W 90/752; H10W 90/754; H10W 90/796; H10W 90/24; H10W 90/722; H10W 70/09; H10W 70/60; H10W 70/614; H10W 72/30; H10W 72/50; H10W 72/851; H10W 74/117

USPC .......................................................... 257/678

See application file for complete search history.

(56) References Cited

U.S. PATENT DOCUMENTS

| | | | | |
|---|---|---|---|---|
| 6,844,631 | B2 | 1/2005 | Yong et al. | |
| 9,385,077 | B2 | 7/2016 | Kim et al. | |
| 11,145,620 | B2 | 10/2021 | Goh et al. | |
| 2007/0134903 | A1 | 6/2007 | Ryan | |
| 2009/0079082 | A1 | 3/2009 | Liu et al. | |
| 2012/0061835 | A1 | 3/2012 | Hosseini et al. | |
| 2013/0200528 | A1* | 8/2013 | Lin | H01L 25/50 257/774 |
| 2022/0130786 | A1* | 4/2022 | Jung | H01L 25/16 |

* cited by examiner

11

13

SEMICONDUCTOR PACKAGE AND METHOD OF MANUFACTURING THE SEMICONDUCTOR PACKAGE

CROSS-REFERENCE TO RELATED APPLICATION

This application claims priority under 35 U.S.C. § 119 to Korean Patent Application No. 10-2022-0182247, filed on Dec. 22, 2022 in the Korean Intellectual Property Office (KIPO), the contents of which being herein incorporated by reference in their entirety.

BACKGROUND

Example embodiments relate to a semiconductor package and a method of manufacturing the semiconductor package. More particularly, example embodiments relate to a fan out package and a method of manufacturing the same.

In manufacturing a fan out package, a sealing member may be formed on a lower redistribution wiring layer to covering a semiconductor chip, and vertical conductive structures may be formed to penetrate the sealing member. Bonding wires formed by a wire bonding process may be provided as the vertical conductive structures. When the bonding pad for bonding with the bonding wire includes copper, structural stability of the bonding wire may be low, resulting in a decrease in yield in the wire bonding process.

SUMMARY

It is an aspect to provide a semiconductor package that has improved structural stability and can improve the yield of the manufacturing process.

According an aspect of one or more example embodiments, there is provided a semiconductor package comprising a first redistribution wiring layer having a first region and a second region surrounding the first region, the first redistribution wiring layer including a plurality of first redistribution wirings; a semiconductor chip disposed on the first region of the first redistribution wiring layer and electrically connected to the plurality of first redistribution wirings; a sealing member on the first redistribution wiring layer, the sealing member covering the semiconductor chip on the first redistribution wiring layer; a plurality of vertical conductive wires penetrating the sealing member on the second region of the first redistribution wiring layer and electrically connected to the plurality of first redistribution wirings; a second redistribution wiring layer disposed on the sealing member, the second redistribution wiring layer including a plurality of second redistribution wirings electrically connected to the plurality of vertical conductive wires; and a plurality of bonding pads provided on an upper surface of the first redistribution wiring layer or a lower surface of the second redistribution wiring layer, each of the plurality of bonding pads having a concavo-convex pattern on a surface of the bonding pad, wherein the plurality of vertical conductive wires are bonded to the concavo-convex patterns of the plurality of bonding pads, respectively.

According to another aspect of one or more example embodiments, there is provided a semiconductor package comprising a first redistribution wiring layer including a plurality of first redistribution wirings; a semiconductor chip disposed on the first redistribution wiring layer such that a first surface of the semiconductor chip on which a plurality of chip pads are formed faces the first redistribution wiring layer; a sealing member on the first redistribution wiring layer, the sealing member covering the semiconductor chip on the first redistribution wiring layer; a plurality of vertical conductive wires penetrating the sealing member and electrically connected to the plurality of first redistribution wirings; a second redistribution wiring layer disposed on the sealing member; and a plurality of bonding pads bonded to first end portions of the plurality of vertical conductive wires respectively, wherein each of the plurality of bonding pads has a concavo-convex pattern in a bonding surface thereof, and the concavo-convex pattern has a plurality of grooves filled with a metal of the corresponding vertical conductive wire.

According to yet another aspect of one or more example embodiments, there is provided a semiconductor package comprising a lower redistribution wiring layer having a first region and a second region surrounding the first region, the lower redistribution wiring layer including a plurality of first redistribution wirings; a semiconductor chip disposed on the first region of the lower redistribution wiring layer and disposed such that a first surface of the semiconductor chip on which a plurality of chip pads are formed faces the lower redistribution wiring layer; a sealing member on the lower redistribution wiring layer, the sealing member covering the semiconductor chip on the lower redistribution wiring layer; a plurality of vertical conductive wires penetrating the sealing member on the second region of the lower redistribution wiring layer and electrically connected to the plurality of first redistribution wirings; an upper redistribution wiring layer disposed on the sealing member, the upper redistribution wiring layer including a plurality of second redistribution wirings electrically connected to the plurality of vertical conductive wires; and a plurality of bonding pads bonded to first end portions of the plurality of vertical conductive wires respectively, wherein each of the plurality of bonding pads has a concavo-convex pattern in a bonding surface thereof, and the concavo-convex pattern has a plurality of grooves filled with a metal of the corresponding vertical conductive wire.

BRIEF DESCRIPTION OF THE DRAWINGS

Various example embodiments will be more clearly understood from the following detailed description taken in conjunction with the accompanying drawings.

FIG. 1 is a cross-sectional view illustrating a semiconductor package in accordance with some example embodiments.

FIGS. 48 to 52 are cross-sectional views illustrating a method of manufacturing a semiconductor package in accordance with some example embodiments.

DETAILED DESCRIPTION

Figure 1:
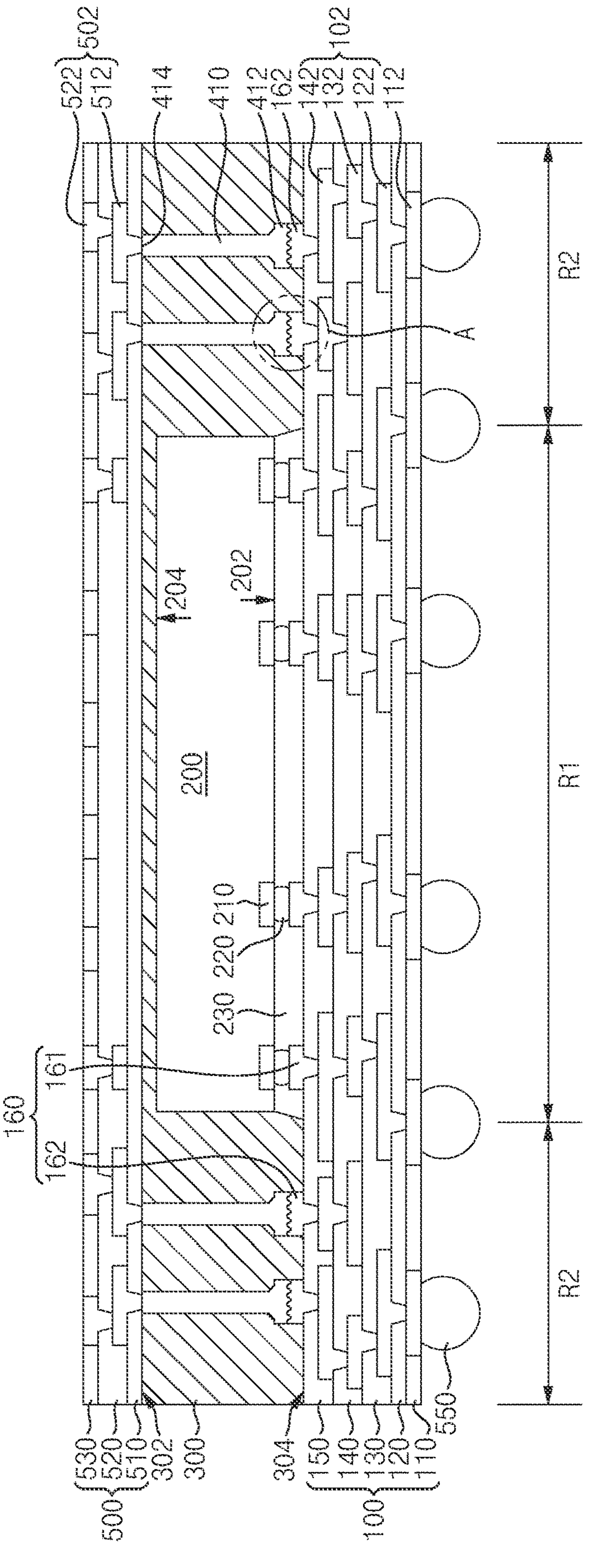
FIGS. 1 to 52 represent non-limiting, example embodiments as described herein.

Hereinafter, various example embodiments will be explained in detail with reference to the accompanying drawings. In this specification, the phrase "at least one of A, B, and C" includes within its scope "only A", "only B", "only C", "both A and B", "both B and C", "both A and C", and "all of A, B, and C".

Some example embodiments provide a method of manufacturing the semiconductor package.

According to some example embodiments, a semiconductor package includes a lower redistribution wiring layer having a first region and a second region surrounding the first region, the lower redistribution wiring layer including first redistribution wirings, a semiconductor chip disposed on the first region of the lower redistribution wiring layer and electrically connected to the first redistribution wirings, a sealing member covering the semiconductor chip on the lower redistribution wiring layer, a plurality of vertical conductive wires penetrating the sealing member on the second region of the lower redistribution wiring layer and electrically connected to the first redistribution wirings, an upper redistribution wiring layer disposed on the sealing member, the upper redistribution wiring layer including second redistribution wirings electrically connected to the plurality of vertical conductive wires, and a plurality of bonding pads provided on an upper surface of the lower redistribution wiring layer or a lower surface of the upper redistribution wiring layer, each of the bonding pads having a concavo-convex pattern on an upper surface of the bonding pad. The vertical conductive wires are bonded to the concavo-convex patterns of the bonding pads, respectively.

According to some example embodiments, a semiconductor package includes a lower redistribution wiring layer including first redistribution wirings, a semiconductor chip disposed on the lower redistribution wiring layer such that a first surface on which chip pads are formed faces the lower redistribution wiring layer, a sealing member covering the semiconductor chip on the lower redistribution wiring layer, a plurality of vertical conductive wires penetrating the sealing member and electrically connected to the first redistribution wirings, an upper redistribution wiring layer disposed on the sealing member, and a plurality of bonding pads bonded to one end portions of the vertical conductive wires respectively. Each of the bonding pads has a concavo-convex pattern in a bonding surface, and the concavo-convex pattern has grooves filled with metal of the vertical conductive wire.

According to some example embodiments, a semiconductor package includes a lower redistribution wiring layer having a first region and a second region surrounding the first region, the lower redistribution wiring layer including first redistribution wirings, a semiconductor chip disposed on the first region of the lower redistribution wiring layer and disposed such that a first surface on which chip pads are formed faces the lower redistribution wiring layer, a sealing member covering the semiconductor chip on the lower redistribution wiring layer, a plurality of vertical conductive wires penetrating the sealing member on the second region of the lower redistribution wiring layer and electrically connected to the first redistribution wirings, an upper redistribution wiring layer disposed on the sealing member, the upper redistribution wiring layer including second redistribution wirings electrically connected to the plurality of vertical conductive wires, and a plurality of bonding pads bonded to one end portions of the vertical conductive wires respectively. Each of the bonding pads has a concavo-convex pattern in a bonding surface, and the concavo-convex pattern has grooves filled with metal of the vertical conductive wire.

According to some example embodiments, in a method of manufacturing a semiconductor package, a lower redistribution wiring layer having a first region and a second region surrounding the first region and including first redistribution wirings is formed. Bonding pads are formed on uppermost first redistribution wirings among the first redistribution wirings in the second region of the lower redistribution wiring layer. Concavo-convex patterns are formed in upper surfaces of the bonding pads, respectively. Vertical conductive wires are formed on the bonding pads having the concavo-convex patterns formed thereon. A semiconductor chip having chip pads electrically connected to the first redistribution wirings is mounted on the lower redistribution wiring layer. A sealing member is formed on the lower redistribution wiring layer to cover the semiconductor chip and the vertical conductive wires. An upper redistribution wiring layer having second redistribution wirings electrically connected to the vertical conductive wires is formed on an upper surface of the sealing member.

According to some example embodiments, a semiconductor package as a fan out wafer level package may include a lower redistribution wiring layer, a semiconductor chip disposed on the lower redistribution wiring layer, a sealing member covering at least a portion of the semiconductor chip on an upper surface of the lower redistribution wiring layer, a plurality of vertical conductive wires penetrating the sealing member, and an upper redistribution wiring layer disposed on an upper surface of the sealing member.

Bonding pads for wire connection may be provided on uppermost first redistribution wirings in a fan out region of the lower redistribution wiring layer. The vertical conductive wires may be bonded to the bonding pads for wire connection. A concavo-convex pattern may be provided in an upper surface of the bonding pad for wire connection. The concavo-convex pattern may have grooves filled with metal of the vertical conductive wire.

Accordingly, in various example embodiments, a contact area between the bonding pad for wire connection and the vertical conductive wire may be increased, and the wire metal may fill the grooves of the concave-convex pattern to generate an anchoring effect. Thus, according to various example embodiments, adhesion between the bonding pad for wire connection and the vertical conductive wire is improved, so that structural stability of the vertical conductive wires can be secured.

Figure 2:
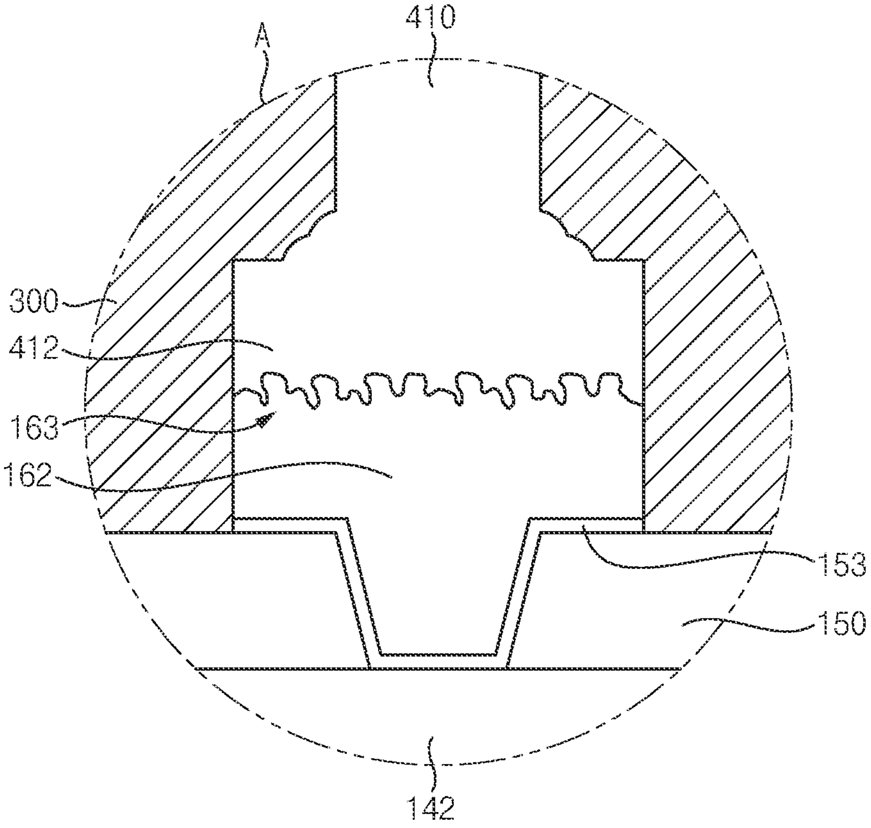
FIG. 2 is an enlarged cross-sectional view illustrating portion 'A' in FIG. 1.

FIG. 1 is a cross-sectional view illustrating a semiconductor package in accordance with some example embodiments. FIG. 2 is an enlarged cross-sectional view illustrating portion 'A' in FIG. 1.

Referring to FIGS. 1 and 2, a semiconductor package 10 may include a lower redistribution wiring layer 100, a semiconductor chip 200 disposed on the lower redistribution wiring layer 100, a sealing member 300 on an upper surface of the lower redistribution wiring layer 100 and covering at least a portion of the semiconductor chip 200 on the upper surface of the lower redistribution wiring layer 100, an upper redistribution wiring layer 500 disposed on an upper surface 302 of the sealing member 300, and a plurality of vertical conductive wires 410 penetrating the sealing member 300 and electrically connecting the lower redistribution wiring layer 100 and the upper redistribution wiring layer 500. In some example embodiments, the semiconductor package 10 may further include external connection members 550 disposed on an outer surface of the lower redistribution wiring layer 100. The lower redistribution wiring layer 100 may also be referred to herein as a first redistribution wiring layer, and the upper redistribution wiring layer 500 may also be referred to herein as a second redistribution wiring layer.

In some example embodiments, the semiconductor package 10 may be a fan out package in which the lower redistribution wiring layer 100 extends to the sealing member 300 that covers a side surface of the semiconductor chip 200. The lower redistribution wiring layer 100 may be formed by a wafer level redistribution wiring process. In some example embodiments, the semiconductor package 10 may be provided as a unit package on which a second package is stacked.

In some example embodiments, the semiconductor package 10 may be provided as a System In Package (SIP). For example, one or more semiconductor chips may be disposed on the lower redistribution wiring layer 100. The semiconductor chips may include a logic chip including a logic circuit and/or a memory chip. The logic chip may be a controller that controls memory chips. The memory chip may include various types of memory circuits, such as DRAM, SRAM, flash, PRAM, ReRAM, FeRAM, or MRAM.

In some example embodiments, the lower redistribution wiring layer 100 may have a plurality of first redistribution wirings 102. The semiconductor chip 200 may be disposed on the lower redistribution wiring layer 100 and may be electrically connected to the first redistribution wirings 102. The lower redistribution wiring layer 100 may be provided on a front surface 202 of the semiconductor chip 200 to serve as a front redistribution wiring layer. Accordingly, the lower redistribution wiring layer 100 may be a front redistribution wiring layer (FRDL) of the fan out package.

In some example embodiments, the lower redistribution wiring layer 100 may include a first lower insulating layer 110, a second lower insulating layer 120, a third lower insulating layer 130, a fourth lower insulating layer 140, and a fifth lower insulating layer 150, and the lower redistribution wiring layer 100 may include the plurality of first redistribution wirings 102 provided in the first to fifth lower insulating layers 110, 120, 130, 140, and 150. In some example embodiments, the first redistribution wirings 102 may include a first lower redistribution wiring 122, a second lower redistribution wiring 132, and a third lower redistribution wiring 142.

The first to fifth lower insulating layers 110, 120, 130, 140, and 150 may include a polymer or a dielectric layer. For example, the first to fifth lower insulating layers 110, 120, 130, 140, and 150 may include a photosensitive insulating layer such as photo imagable dielectric (PID). The first to fifth lower insulating layers 110, 120, 130, 140, and 150 may be formed by a vapor deposition process, a spin coating process, etc. The first redistribution wirings 102 may include aluminum (Al), copper (Cu), tin (Sn), nickel (Ni), gold (Au), platinum (Pt), or an alloy thereof. The first redistribution wirings 102 may be formed by an electro plating process, an electroless plating process, a vapor deposition process, etc.

In some example embodiments, a first bonding pad 112 may be provided in the first lower insulating layer 110. The first bonding pad 112 may be a bump pad. The bump pad may include a solder pad or a pillar pad. For example, the first bonding pad may include copper (Cu), aluminum (Al), tin (Sn), nickel (Ni), gold (Au), platinum (Pt), or an alloy thereof.

The second lower insulating layer 120 may be formed on the first lower insulating layer 110, and the first lower redistribution wirings 122 may be formed on the second lower insulating layer 120. The first lower redistribution wirings 122 may be electrically connected to the first bonding pads 112 through first openings formed in the second lower insulating layer 120.

The third lower insulating layer 130 may be formed on the second lower insulating layer 120, and the second lower redistribution wirings 132 may be formed on the third lower insulating layer 130. The second lower redistribution wirings 132 may be electrically connected to the first lower redistribution wirings 122 through second openings formed in the third lower insulating layer 130.

The fourth lower insulating layer 140 may be formed on the third lower insulating layer 130, and the third lower redistribution wirings 142 may be formed on the fourth lower insulating layer 140. The third lower redistribution wirings 142 may be electrically connected to the second lower redistribution wirings 132 through third openings formed in the fourth lower insulating layer 130.

A second bonding pad 160 may be disposed on the third lower redistribution wiring 142. A solder resist layer may be formed as the fifth lower insulating layer 150 on the fourth lower insulating layer 140 and may expose at least a portion of the second bonding pad 160. The fifth lower insulating layer 150 (e.g., the solder resist layer) may serve as a passivation layer.

The numbers and arrangements of the lower insulating layers and the lower redistribution wirings of the lower redistribution wiring layer illustrated in FIG. 1 are provided as examples, and it will be understood that example embodiments are not limited thereto.

In some example embodiments, the lower redistribution wiring layer 100 includes a first region R1 overlapping the semiconductor chip 200 mounted on the upper surface of the lower redistribution wiring layer 100 and a second region R2 surrounding the first region R1, when viewed from a plan view. The second region R2 may be a fan out region outside a region where the semiconductor chip 200 is disposed.

The second bonding pads 160 may be exposed from the upper surface of the lower redistribution wiring layer 100. The second bonding pads 160 may include chip connection-bonding pads 161 formed on the uppermost first redistribution wirings 142 located in the first region R1 and wire connection-bonding pads 162 formed on the uppermost first redistribution wirings 142 located in the second region R2.

In some example embodiments, the semiconductor chip 200 may have a plurality of chip pads 210 on a first surface 202 thereof, that is, an active surface thereof. The semiconductor chip 200 may be mounted on the lower redistribution wiring layer 100 such that the first surface 202 on which the chip pads 210 are formed faces the lower redistribution wiring layer 100.

The semiconductor chip 200 may be mounted on the lower redistribution wiring layer 100 by a flip chip bonding method. The semiconductor chip 200 may be mounted on the lower redistribution wiring layer 100 via conductive bumps 220. The conductive bump 220 may be disposed between the chip connection-bonding pad 161 on the third lower redistribution wiring 142 of the lower redistribution wiring layer 100 and the chip pad 210 of the semiconductor chip 200 to electrically connect the semiconductor chip 200 and the first redistribution wirings 102. For example, in some example embodiments, each of the conductive bumps 220 may include a pillar bump formed on the chip pad 210 of the semiconductor chip 200 and a solder bump formed on the pillar bump. In some example embodiments, the conductive bumps 220 may include solder bumps formed on the chip pads 210 of the semiconductor chip 200. An underfill member 230 may be disposed between the semiconductor chip 200 and the lower redistribution wiring layer 100.

Although only a few chip pads are illustrated in the figures, the structures and arrangements of the chip pads are provided as examples, and it will be understood that example embodiments are not limited thereto. Also, although only one semiconductor chip is illustrated, example embodiments are not limited thereto, and in some example embodiments, a plurality of semiconductor chips may be stacked or disposed on the lower redistribution wiring layer 100.

In some example embodiments, the sealing member 300 may cover the at least a portion of the semiconductor chip 200 on the upper surface of the lower redistribution wiring layer 100. In some example embodiments, the sealing member 300 may include a first molding portion covering an upper surface 204 of the semiconductor chip 200 and a second sealing portion covering the upper surface of the lower redistribution wiring layer 100 around the semiconductor chip 200. In some example embodiments, a thickness of the first sealing portion may be less than a thickness of the second sealing portion.

For example, the sealing member 300 may include an epoxy mold compound (EMC). The sealing member 300 may be formed by a molding process, a screen printing process, a lamination process, etc.

In some example embodiments, the plurality of vertical conductive wires 410 may extend in a vertical direction to extend through the sealing member 300. The vertical conductive wires 410 may be formed on the wire connection-bonding pads 162 on the uppermost first redistribution wirings 142 located in the second region R2.

The vertical conductive wires 410 may be provided to penetrate the sealing member 300 to serve as an electrical connection path. The vertical conductive wires 410 may serve as a through mold via (TMV) formed to extend through the second sealing portion of the sealing member 300. That is, the vertical conductive wires 410 may be provided in the fan out region R2 outside the area where the semiconductor chip 200 is disposed, to electrically connect the lower redistribution wiring layer 100 and the upper redistribution wiring layer 500.

In some example embodiments, the upper redistribution wiring layer 500 may be disposed on the sealing member 300 and may include a plurality of second redistribution wirings 502 electrically connected to the vertical conductive wires 410 respectively. The second redistribution wirings 502 may include upper redistribution wirings stacked in at least two layers on the upper surface 302 of the sealing member 300. The second redistribution wirings 502 may be provided on the sealing member 300 to serve as rear redistribution wirings. Accordingly, the upper redistribution wiring layer 500 may be a backside redistribution wiring layer (BRDL) of the fan out package.

The second redistribution wirings 502 may include a first upper redistribution wiring 512 and a second upper redistribution wiring 522 stacked in two layers. In this case, the second upper redistribution wiring 522 may correspond to the uppermost second redistribution wiring among the second redistribution wirings.

A first upper insulating layer 510 may be provided on the upper surface 302 of the sealing member 300 and may have openings that expose upper surfaces of the vertical conductive wires 410. The first upper redistribution wiring 512 may be formed on the first upper insulating layer 510 and at least portions of the first upper redistribution wiring 512 may directly contact the vertical conductive wires 410 through the openings of the first upper insulating layer 510.

A second upper insulating layer 520 may be provided on the first upper insulating layer 510 and may have openings that expose the first upper redistribution wiring 512. The second upper redistribution wiring 522 may be formed on the first upper insulating layer 510 and at least portions of the second upper redistribution wiring 522 may directly contact the first upper redistribution wiring 512 through the openings of the second upper insulating layer 520.

Although not illustrated in the figures, upper bonding pads may be respectively provided on the second upper redistribution wiring 522. A third upper insulating layer 530 may be provided on the second upper insulating layer 520 and may expose at least portions of the upper bonding pads. The third upper insulating layer 530 may serve as a passivation layer.

For example, the first to third upper insulating layers 510, 520, and 530 may include a polymer or a dielectric layer. The first to third upper insulating layers 510, 520, and 530 may include a photosensitive insulating material such as PID or an insulating film such as ABF. The second redistribution wirings 502 may include copper (Cu), aluminum (Al), tin (Sn), nickel (Ni), gold (Au), platinum (Pt), or an alloy thereof.

The numbers and arrangements of the upper insulating layers and the upper redistribution wirings of the upper redistribution wiring layer 500 are provided as examples, and it will be understood that example embodiments are not limited thereto.

As illustrated in FIG. 2, the wire connection-bonding pads 162 located in the second region R2 and exposed from the upper surface of the lower redistribution wiring layer 100 may include concavo-convex patterns 163 in upper surfaces of thereof.

The concavo-convex pattern 163 may be formed by performing a special roughness treatment such as a CZ treatment on the upper surface of the wire connection-bonding pad 162. The concavo-convex pattern 163 may have grooves that are formed in the upper surface of the wire connection-bonding pad 162 and filled with a ductile metal.

The vertical conductive wires 410 may extend upwardly on the wire connection-bonding pad 162 having the concave-convex pattern 163. The vertical conductive wires 410 may be formed by a bonding wire process. Since the concavo-convex pattern 163 is formed in the upper surface of the wire connection-bonding pad 162, a contact area between the wire connection-bonding pad 162 and the vertical conductive wires 410 may be increased and the metal of the bonding wire metal may fill the groove of the concavo-convex pattern 163 to generate an anchoring effect. Accordingly, adhesion between the wire connection-bonding pad 162 and the vertical conductive wires 410 may be improved.

The vertical conductive wires 410 may include a bonding wire formed by the bonding wire process and a plating pattern conformally plated on a surface of the bonding wire. Accordingly, the rigidity of the vertical conductive wires 410 may be increased to prevent wire sweep by mold flow in a following mold process for forming the sealing member 300.

For example, the wire connection-bonding pad 162 may include copper, and the vertical conductive wires 410 may include copper, gold, or silver. The wire connection-bonding pad 162 may have a diameter of 2.5 μm to 500 μm, and the vertical conductive wires 410 may have a diameter of 1 μm to 100 μm.

In some example embodiments, the external connection members 550 may be disposed on the first bonding pads 112 on the outer surface of the lower redistribution wiring layer 100. For example, the external connection member 550 may include a solder ball. The solder ball may have a diameter of 300 μm to 500 μm. The semiconductor package 10 may be mounted on a module substrate (not illustrated) via the solder balls to form a memory module.

As mentioned above, the semiconductor package 10 as a fan out wafer level package may include the lower redistribution wiring layer 100, the semiconductor chip 200 disposed on the lower redistribution wiring layer 100, the sealing member 300 on the upper surface of the lower redistribution wiring layer 100 to cover at least a portion of the semiconductor chip 200, the plurality of vertical conductive wires 410 penetrating the sealing member 300, and the upper redistribution wiring layer 500 on the upper surface 302 of the sealing member 300.

The wire connection-bonding pads 162 may be respectively provided on the uppermost first redistribution wirings 142 in the second region R2 of the lower redistribution wiring layer 100. The vertical conductive wires 410 may be bonded to the wire connection-bonding pads 162. A concave-convex pattern 163 may be provided in the upper surface of the wire connection-bonding pad 162. The concavo-convex pattern 163 may have grooves which are filled with the metal of the vertical conductive wire.

Accordingly, a contact area between the wire connection-bonding pad 162 and the vertical conductive wires 410 may be increased, and the wire metal may fill the grooves of the concavo-convex pattern 163 to generate an anchoring effect. Thus, adhesion between the wire connection-bonding pad 162 and the vertical conductive wires 410 may be improved to secure the structural stability of the vertical conductive wires 410.

Hereinafter, a method of manufacturing the semiconductor package of FIG. 1 will be described.

FIGS. 3 to 17 are views illustrating a method of manufacturing a semiconductor package in accordance with some example embodiments. FIGS. 3, 5, 12, and 15 to 17 are cross-sectional views illustrating a method of manufacturing a semiconductor package in accordance with some example embodiments. FIG. 4 is an enlarged cross-sectional view illustrating portion 'B' in FIG. 3. FIGS. 6 to 8, 10 and 11 are enlarged cross-sectional views illustrating portion 'C' in FIG. 5. FIG. 13 is an enlarged cross-sectional view illustrating portion 'D' in FIG. 12.

Figure 3:
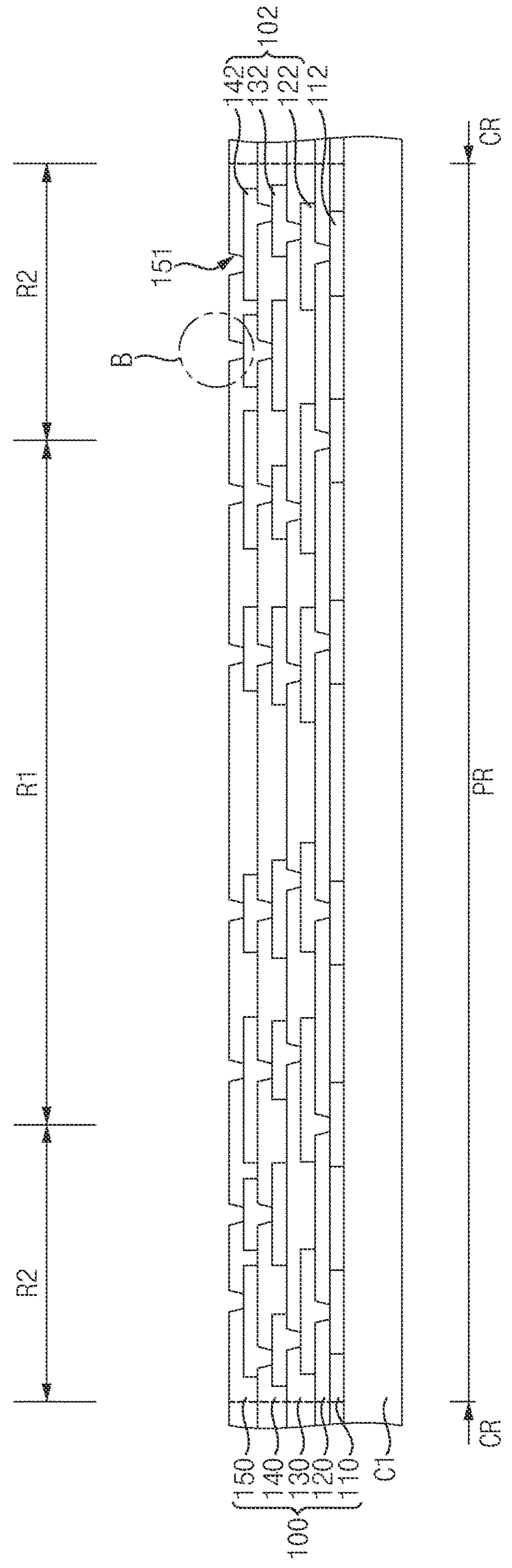
FIGS. 3 to 17 are views illustrating a method of manufacturing a semiconductor package in accordance with some example embodiments.
Figure 4:
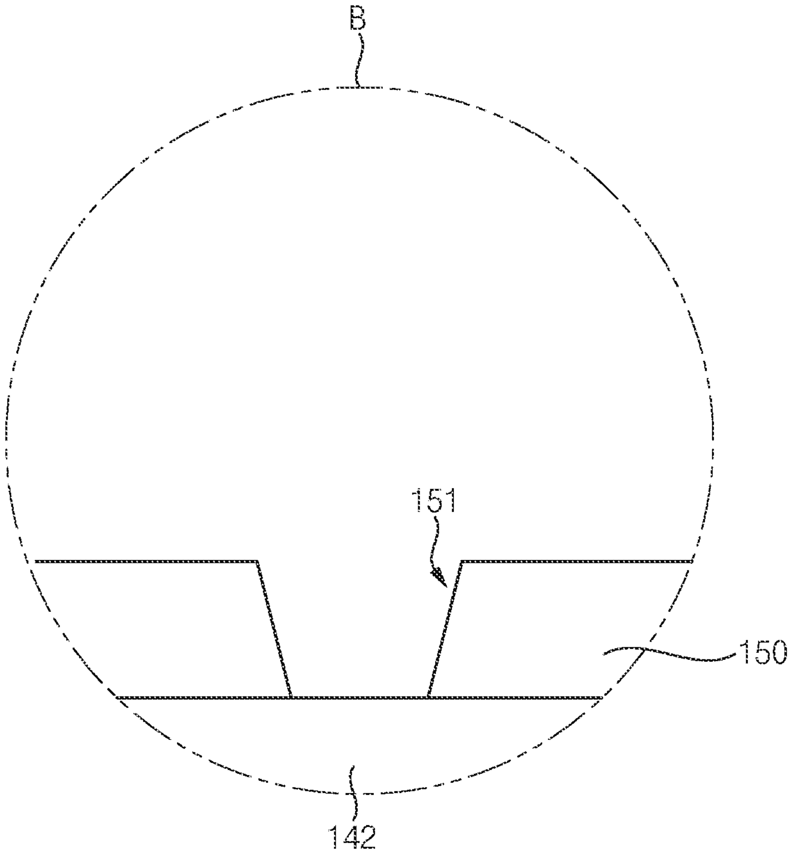

Referring to FIGS. 3 and 4, a lower redistribution wiring layer 100 having a plurality of first redistribution wirings 102 may be formed on a carrier substrate C1.

In some example embodiments, the carrier substrate C1 may include a wafer substrate as a base substrate for disposing a plurality of semiconductor chips on the lower redistribution wiring layer and forming a sealing member covering the semiconductor chips. The carrier substrate C1 may have a shape corresponding to a wafer on which a semiconductor process is performed. For example, the carrier substrate C1 may include a silicon substrate, a glass substrate, a non-metal or metal plate, etc.

The carrier substrate C1 may include a package region PR on which the semiconductor chip is mounted and a cutting region CR surrounding the package region PR. As will be described later, the lower redistribution wiring layer 100 and the sealing member formed on the carrier substrate C1 may be cut along the cutting region CR dividing the plurality of package regions MR to be individualized.

In some example embodiments, a first lower insulating layer 110 having a plurality of first bonding pads 112 formed therein may be formed on the carrier substrate C1. Although not illustrated in the figures, after a release film, a barrier metal layer, a seed layer and a first lower insulating layer are formed on the carrier substrate C1, the first lower insulating layer may be patterned to form openings that expose first bonding pad regions. Then, a plating process may be performed on the seed layer to form the first bonding pads 112 in the openings.

For example, the first lower insulating layer 110 may include a polymer or a dielectric layer. The first lower insulating layer 110 may include a photosensitive insulating material such as photo imagable dielectric (PID) or an insulating film such as ABF. The first lower insulating layer 110 may be formed by a spin coating process, a vapor deposition process, etc.

The first bonding pad 112 may be a bump pad. The bump pad may include a solder pad or a pillar pad. For example, the first bonding pad may include copper (Cu), aluminum (Al), tin (Sn), nickel (Ni), gold (Au), platinum (Pt), or an alloy of copper (Cu), aluminum (Al), tin (Sn), nickel (Ni), gold (Au), or platinum (Pt).

Then, after a second lower insulating layer 120 is formed on the first lower insulating layer 110 to cover the first bonding pads 112, the second lower insulating layer 120 may be patterned to form first openings that expose at least portions of the first bonding pads 112. Then, first lower redistribution wiring 122 may be formed on the second lower insulating layer 120 to directly contact the first lower redistribution wirings 122 through the first openings.

For example, the second lower insulating layer 120 may include a polymer or a dielectric layer. The second lower insulating layer 120 may include a photosensitive insulating material such as PID or an insulating film such as ABF. The second lower insulating layer may be formed by a spin coating process, a vapor deposition process, etc.

Then, a third lower insulating layer 130 may be formed on the second lower insulating layer 120 to cover the first lower redistribution wirings 122, and the third lower insulating layer 130 may be patterned to form second openings that expose at least portions of the first lower redistribution wirings 126. Then, second lower redistribution wirings 132 may be formed on the third lower insulating layer 130 to directly contact the first lower redistribution wirings 122 through the second openings.

Then, a fourth lower insulating layer 140 may be formed on the third lower insulating layer 130 to cover the second lower redistribution wirings 132, and the fourth lower insulating layer 140 may be patterned to form third openings that expose at least portions of the second lower redistribution wirings 132. Then, third lower redistribution wirings 142 may be formed on the fourth lower insulating layer 140 to directly contact the second lower redistribution wirings 132 through the third openings.

Then, after a fifth lower insulating layer 150 is formed on the fourth lower insulating layer 140 to cover the third lower redistribution wirings 142, the fifth lower insulating layer 150 may be patterned to form fourth openings 151 that expose at least portions of the third lower redistribution wirings 142.

Thus, the lower redistribution wiring layer 100 having the first to fifth lower insulating layers 110, 120, 130, 140 and 150 may be formed. The lower redistribution wiring layer 100 may be a front redistribution wiring layer (FRDL) of a fan out package. The lower redistribution wiring layer 100 may include the first redistribution wirings 122, 132 and 142 stacked in at least two layers. The first bonding pads 112 may be exposed from a lower surface of the lower redistribution wiring layer 100.

When viewed from a plan view, the lower redistribution wiring layer 100 may have a first region R1 overlapping a semiconductor chip to be mounted on the lower redistribution wiring layer 100 and a second region R2 surrounding the first region R1, as will be described later. The second region R2 may be a fan out region outside a region where the semiconductor chip is disposed.

Referring to FIGS. 5 to 13, second bonding pads 160 may be formed on uppermost first redistribution wirings 142 of the lower redistribution wiring layer 100, and vertical conductive wires 410 may be formed on the uppermost first redistribution wirings, that is, the third lower redistribution wirings 142 provided in the fan out region R2.

Figure 5:
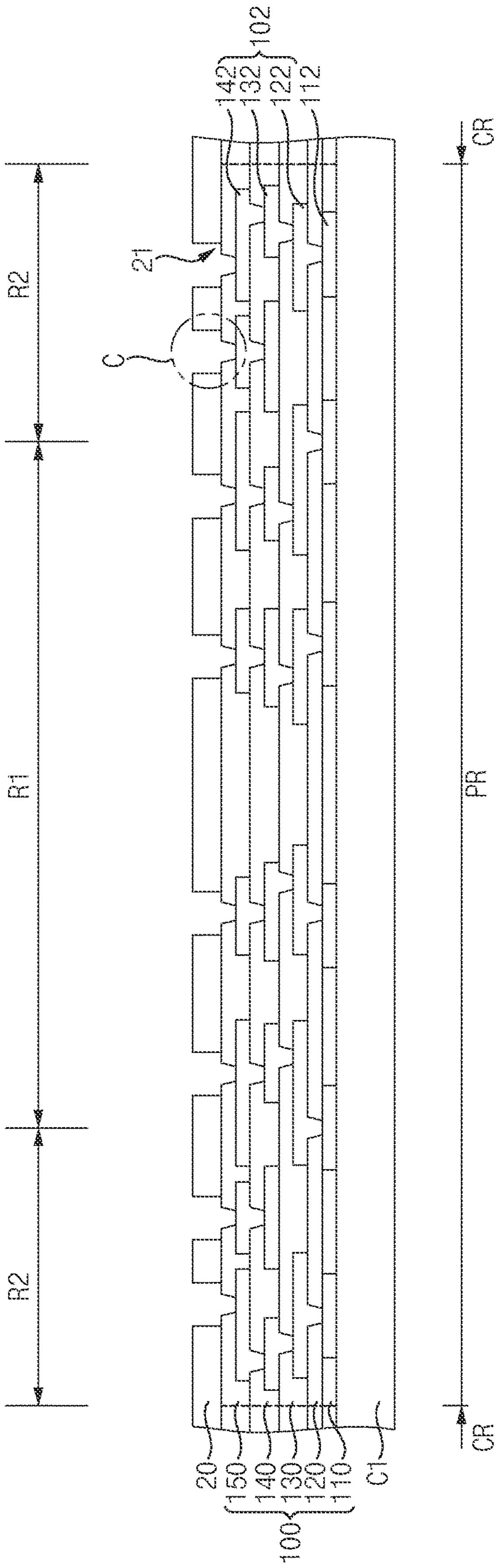
Figure 6:
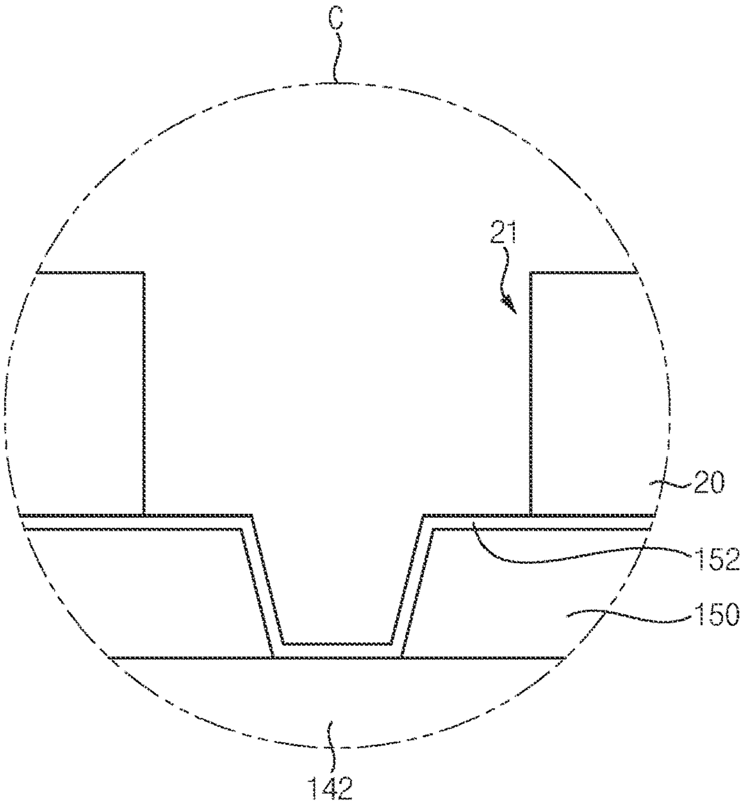
Figure 7:
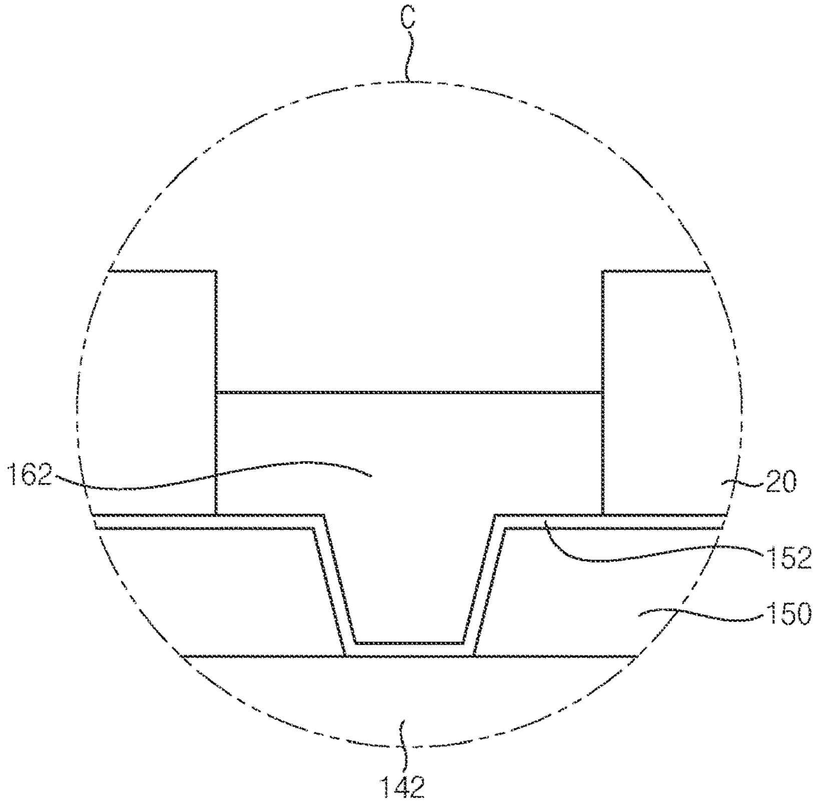

First, as illustrated in FIGS. 5 to 7, a seed layer 152 may be formed on the fifth lower insulating layer 150, and a photoresist pattern 20 having openings 21 that expose second bonding pad regions on the seed layer 152. Then, second bonding pads 160 (including the chip connection-bonding pads 161 and the wire connection-bonding pads 162) may be formed in the openings 21 of the photoresist pattern 20 by a plating process. A portion of the wire connection-bonding pad 162 may be formed in the fifth opening 151 of the fifth lower insulating layer 150.

Accordingly, the second bonding pads may be formed on the uppermost first redistribution wirings 142 positioned in the first region R1 and the second region R2 of the lower redistribution wiring layer 100.

Figure 8:
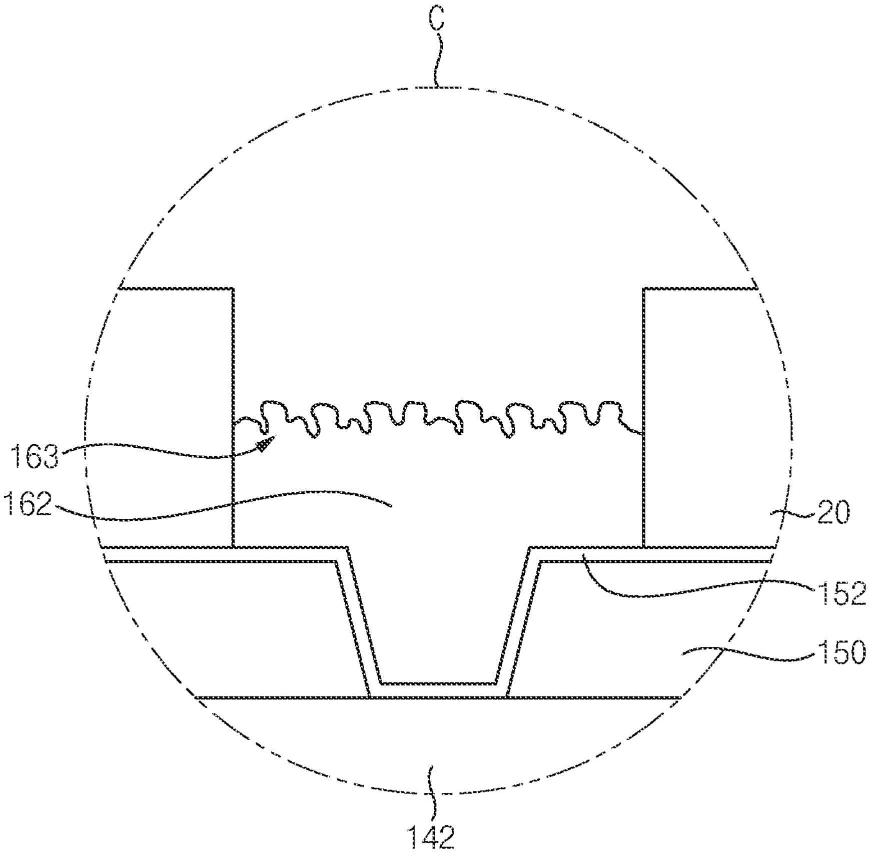

Then, as illustrated in FIG. 8, a surface treatment may be performed on an exposed surface of the wire connection-bonding pad 162 positioned in the second region R2, that is, the fan out region to form a concavo-convex pattern 163.

For example, a special roughness treatment such as a CZ treatment may be performed on an upper surface of the wire connection-bonding pad 162 exposed through the opening 21 of the photoresist pattern 20 to form the concavo-convex pattern 163 in the upper surface of the wire connection-bonding pad 162. The CZ treatment may be a surface roughening treatment using an organic acid-type micro-etching solution (for example, CZ-8000 series of MEC company) to create a super-roughened copper surface. The concavo-convex pattern 163 may be an anchoring pattern. The concavo-convex pattern 163 may have a plurality of grooves that are formed in the upper surface of the wire connection-bonding pad 162 and are filled up with a ductile metal. In some example embodiments, the plurality of grooves may be non-uniform as illustrated in FIG. 8. Accordingly, it may be possible to increase adhesion or rigidity between the wire connection-bonding pad 162 and the ductile metal filled in the groove.

Figure 9:
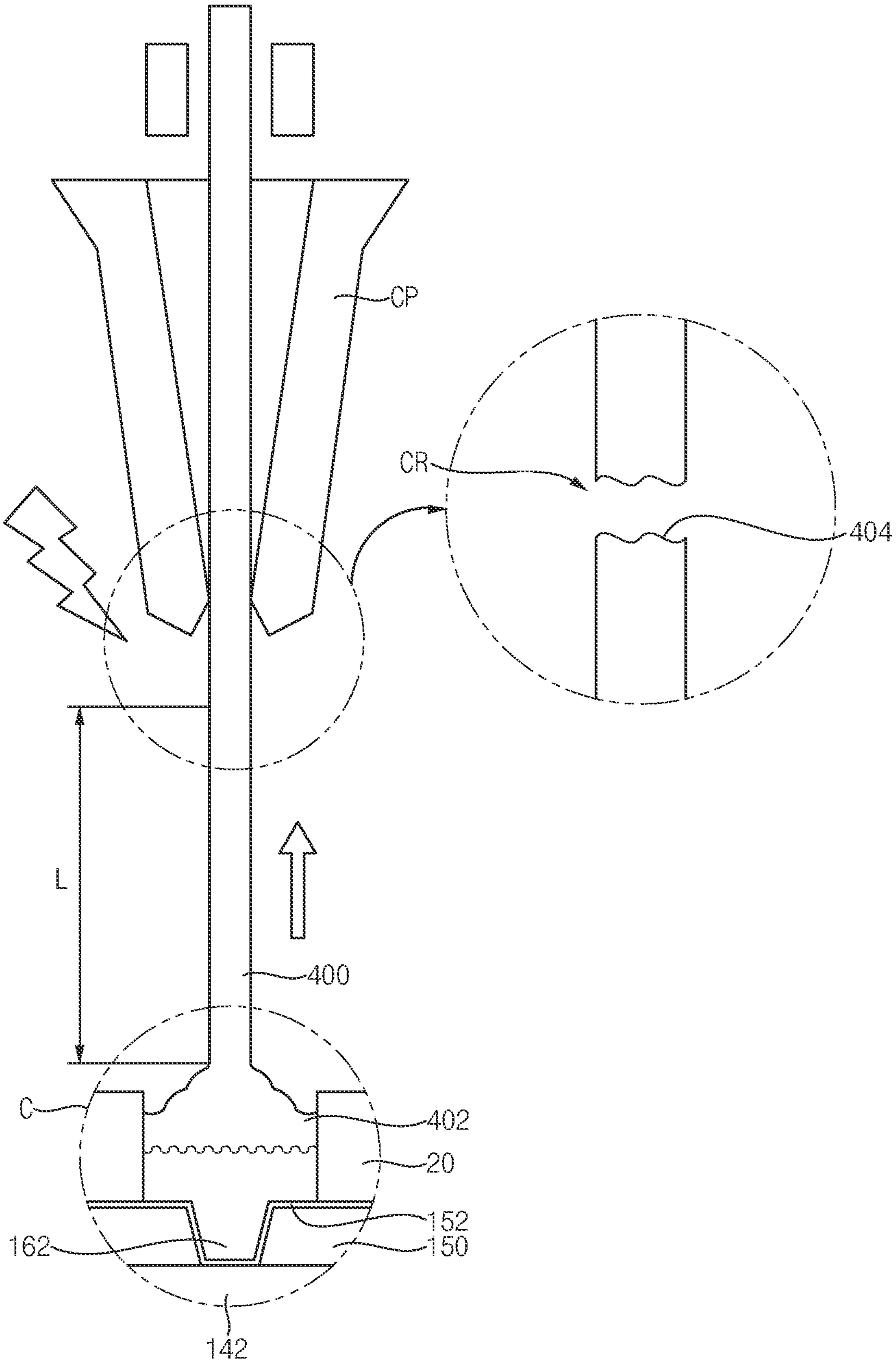
Figure 10:
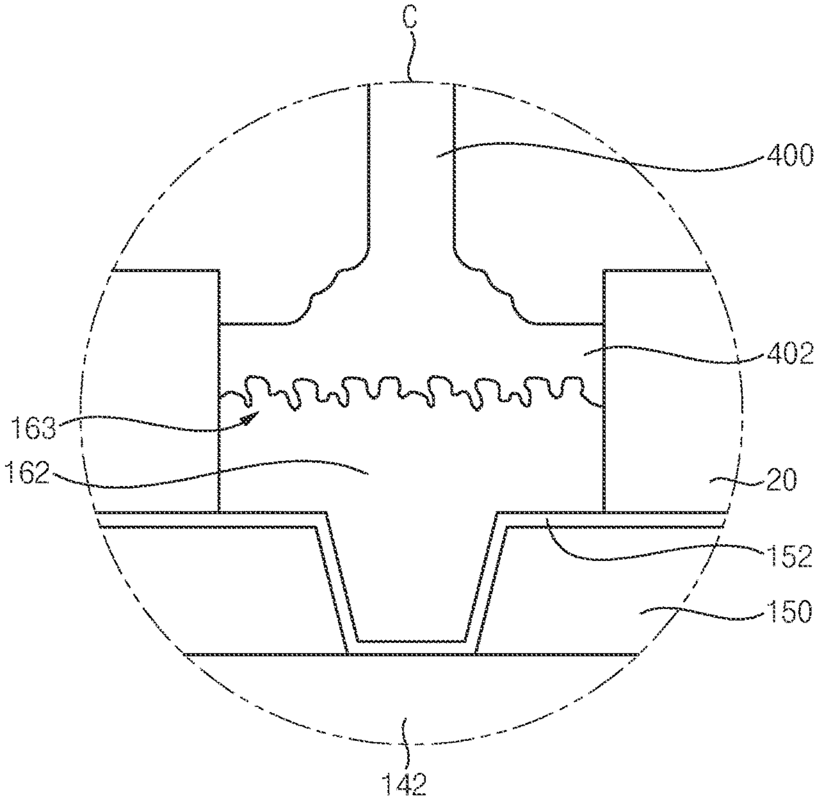

Then, as illustrated in FIGS. 9 and 10, a preliminary vertical conductive wire may be formed on the wire connection-bonding pad 162 having the concave-convex pattern 163.

For example, the preliminary vertical conductive wire may be formed by a bonding wire process. The preliminary vertical conductive wire may be a bonding wire formed by the bonding wire process.

As illustrated in FIG. 9, after one end portion of a wire drawn from a capillary CP is bonded to the wire connection-bonding pad 162, the capillary CP may continue to draw out the wire while moving in a vertical direction. Then, when the wire is extended by a predetermined length (L), a portion (CR) of the wire may be cut to form a conductive wire 400. Accordingly, the conductive wire 400 may have a first end portion 402 as a portion bonded to the wire connection-bonding pad 162.

Since the concave-convex pattern 163 is formed in the upper surface of the wire connection-bonding pad 162, a contact area between the wire connection-bonding pad 162 and the conductive wire 400 may be increased, and a conductive wire metal may fill the grooves of the concave-convex pattern 163 to thereby generate an anchoring effect. Accordingly, adhesion between the wire connection-bonding pad 162 and the conductive wire 400 may be increased to thereby improve the yield of the bonding wire process.

Figure 11:
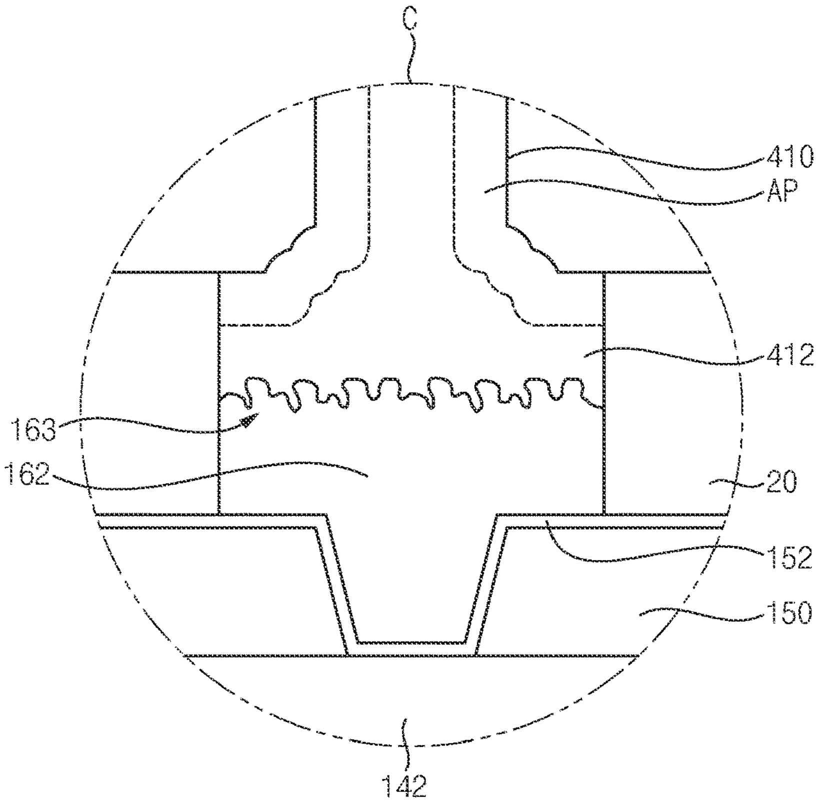

As illustrated in FIG. 11, an additional plating process on the conductive wire 400 may be performed to from an additional plating pattern AP on a surface of the conductive wire 400. Accordingly, vertical conductive wires 410 having a relatively large thickness may be formed on the wire connection-bonding pad 162 located in the second region R2. By the additional plating process, the additional plating pattern AP may be formed conformally on the exposed surface of the conductive wire 400 as a preliminary vertical conductive wire. The profile of the additional plating pattern AP may vary according to a depth of the first end portion 402 of the conductive wire 400 formed in the opening 21 of the photoresist pattern 20. For example, as a distance between an upper surface of the opening 21 and the first end portion 402 of the conductive wire 400 increases, that is, as a space inside the opening 21 increases, the profile of the additional plating pattern AP may increase.

Accordingly, since the rigidity of the vertical conductive wires 410 is increased, it may be possible to prevent wire sweep by a mold flow in a subsequent mold process. The additional plating process may be omitted when the thickness of the conductive wire is sufficiently large or for process simplification.

For example, the wire connection-bonding pad 162 may include copper, and the vertical conductive wires 410 may include copper, gold, silver, etc. The wire connection-bonding pad 162 may have a diameter of 2.5 μm to 500 μm, and the vertical conductive wires 410 may have a diameter of 1 μm to 100 μm.

Figure 12:
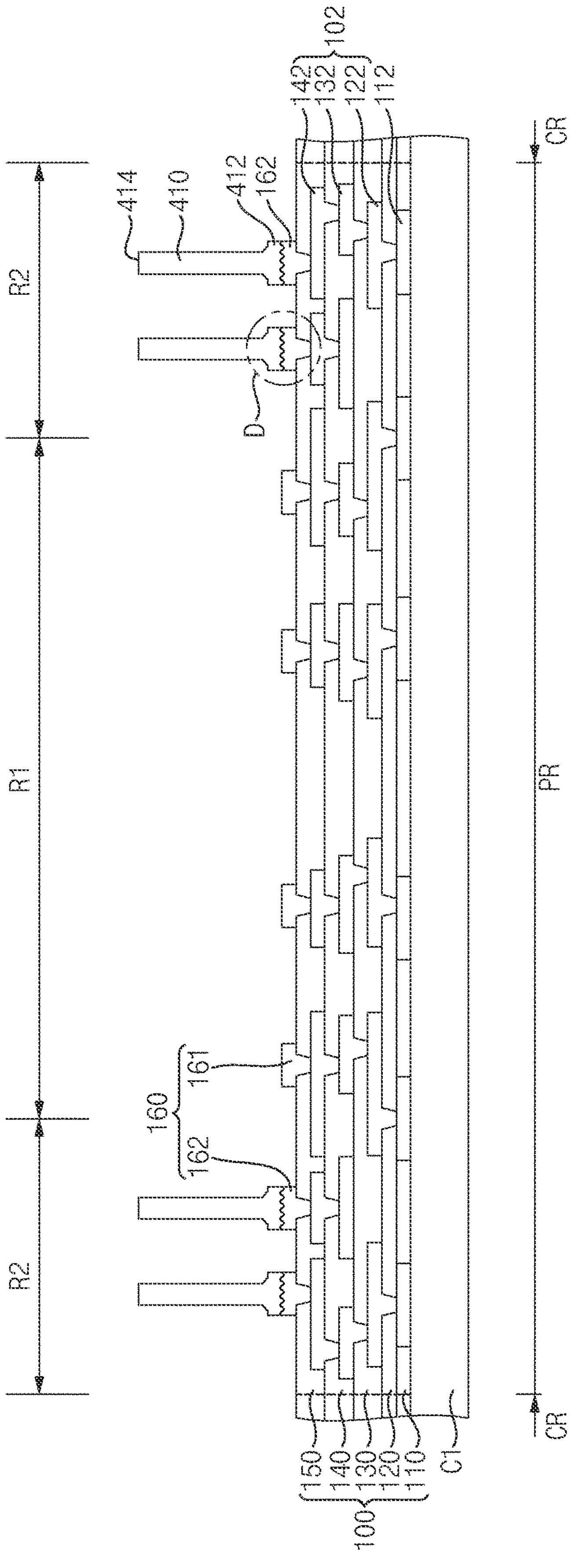
Figure 13:
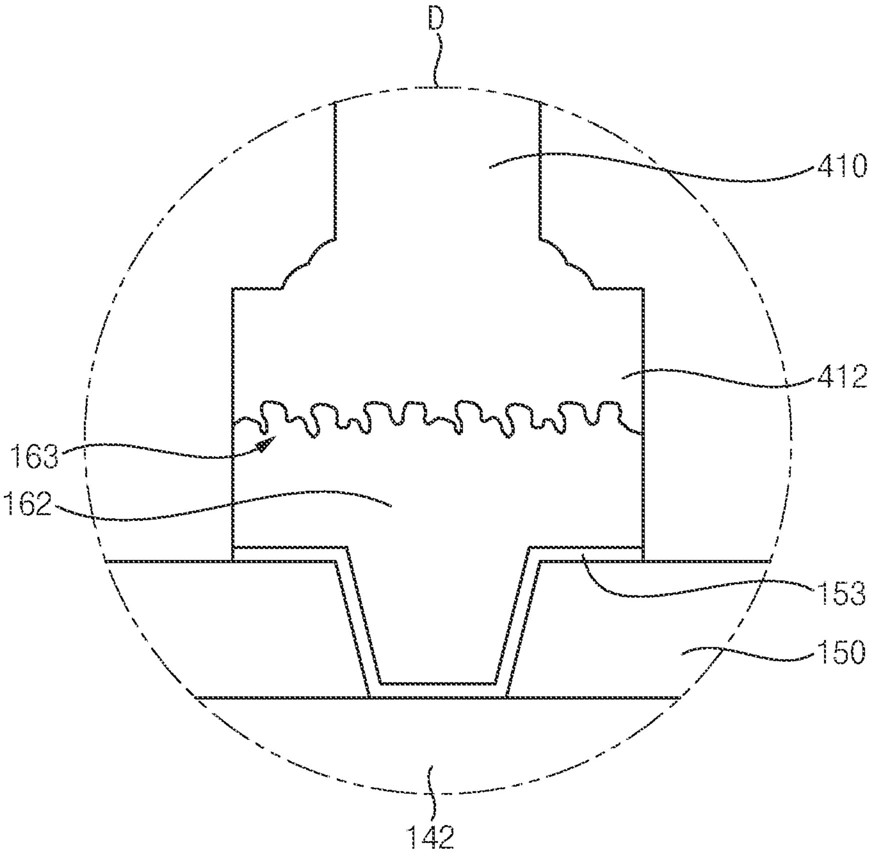

Then, as illustrated in FIGS. 12 and 13, the photoresist pattern 20 may be removed from the fifth lower insulating layer 150 and a portion of the seed layer 152 that is exposed by the photoresist pattern 20 may be removed to form a seed layer pattern 153.

As illustrated in FIG. 12, the second bonding pads 160 may be exposed from the upper surface of the lower redistribution wiring layer 100. The second bonding pads 160 may include chip connection-bonding pads 161 formed on the uppermost first redistribution wirings 142 located in the first region R1 and wire connection-bonding pads 162 formed on the uppermost first redistribution wirings 142 located in the second region R2.

For example, a special roughness treatment may be performed only on surfaces of the wire connection-bonding pads 162. Accordingly, the concavo-convex patterns 163 may be formed only on the surfaces of the wire connection-bonding pads 162 and not on the chip connection-bonding pads 161.

The vertical conductive wires 410 may extend upwardly from the wire connection-bonding pads 162. The vertical conductive wires 410 may be electrically connected to the first redistribution wirings 102. As will be described later, the vertical conductive wires 410 may be provided to penetrate the sealing member to serve as electrical connection paths. That is, the vertical conductive wires 410 may be provided in the fan out region R2 outside the region where the semiconductor chip (die) is disposed and used for electrical connection.

Figure 14:
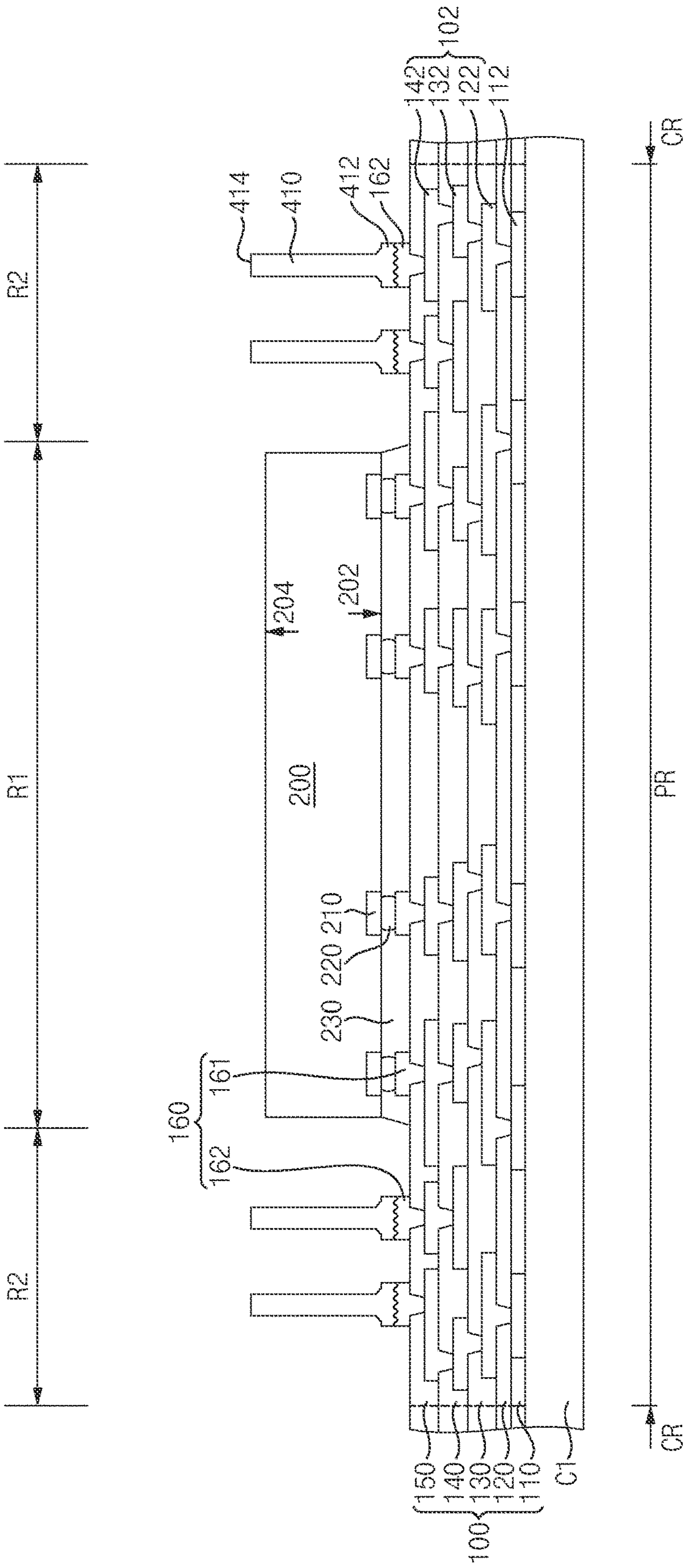

Referring to FIG. 14, at least one semiconductor chip 200 may be mounted on an upper surface of the lower redistribution wiring layer 100.

In some example embodiments, the semiconductor chip 200 may be disposed in the first region R1 that is a fan in region of the lower redistribution wiring layer 100. The semiconductor chip 200 may be mounted on the upper surface of the lower redistribution wiring layer 100 by a flip chip bonding method. The semiconductor chip 200 may be disposed such that a front surface 202 on which chip pads 210 are formed, that is, an active surface, faces the lower redistribution wiring layer 100. The chip pads 210 of the semiconductor chip 200 may be electrically connected to the first redistribution wirings 102 of the lower redistribution wiring layer 100 by conductive bumps 220. The conductive bumps 220 may be respectively bonded to the chip connection-bonding pads 161 on the uppermost first redistribution wirings 142. For example, the conductive bumps 220 may include micro bumps (uBumps).

An underfill member 230 may be underfilled between the semiconductor chip 200 and the lower redistribution wiring layer 100. The underfill member may include a material having relatively high fluidity to effectively fill a small space between the semiconductor chip and the lower redistribution wiring layer. For example, the underfill member may include an adhesive containing an epoxy material.

In some example embodiments, the semiconductor chip may be a logic chip including a logic circuit. In some example embodiments, the logic chip may be a controller that controls memory chips. In some example embodiments, the semiconductor chip may be an ASIC or a processor chip such as an application processor (AP) serving as a host such as a CPU, GPU, or SOC.

Figure 15:
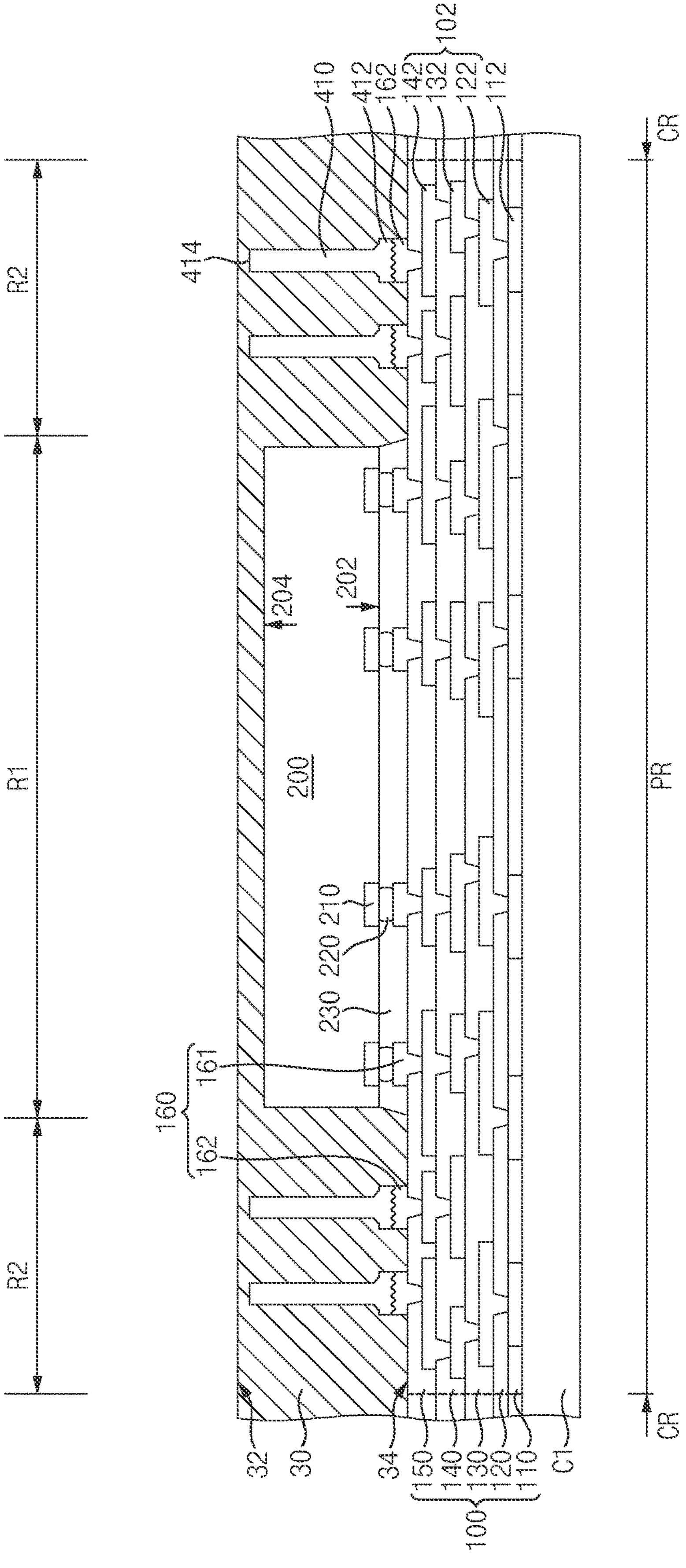

Referring to FIG. 15, a sealing material 30 may be formed on the upper surface of the lower redistribution wiring layer 100 to cover the semiconductor chip 200 and the plurality of vertical conductive wires 410.

The sealing material 30 may be formed to cover an upper surface 204 of the semiconductor chip 200 and upper surfaces of the plurality of vertical conductive wires 410. For example, the sealing material 30 may include an epoxy molding compound (EMC). The sealing material 30 may include UV resin, polyurethane resin, silicone resin, silica fillers, etc.

Figure 16:
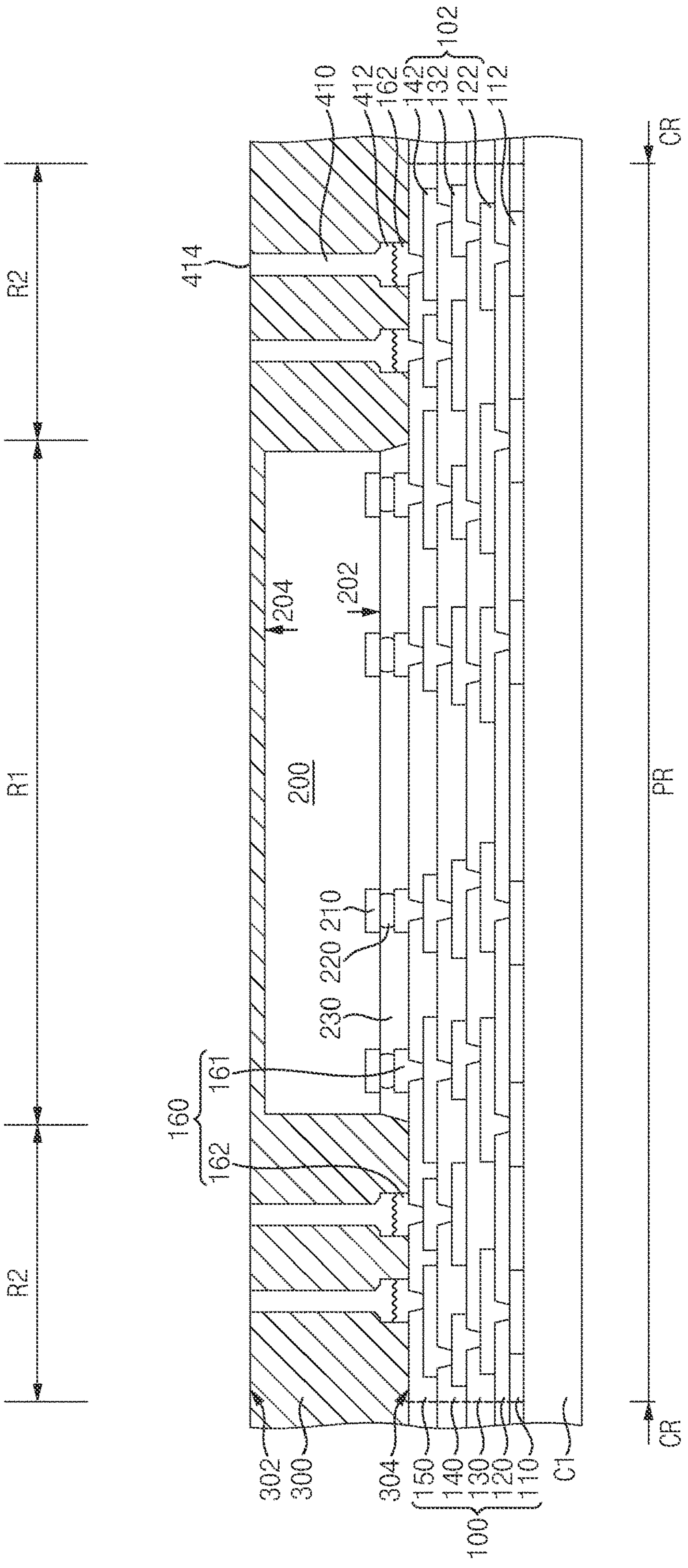

Referring to FIG. 16, an upper portion of the sealing material 30 may be partially removed to form a sealing member 300 that exposes the other end portions 414 of the plurality of vertical conductive wires 410. The upper portion of the sealing material 30 may be partially removed by a grinding process.

The sealing member 300 may include a first sealing portion covering the upper surface 204 of the semiconductor chip 200 and a second sealing portion covering the upper surface of the lower redistribution wiring layer 100 around the semiconductor chip 200.

Accordingly, the plurality of vertical conductive wires 410 may extend to penetrate the sealing member 300 on the upper surface of the fan out region R2 of the lower redistribution wiring layer 100. The vertical conductive wires 410 may serve as a through mold via (TMV) formed to extend through the second sealing portion of the sealing member 300.

Figure 17:
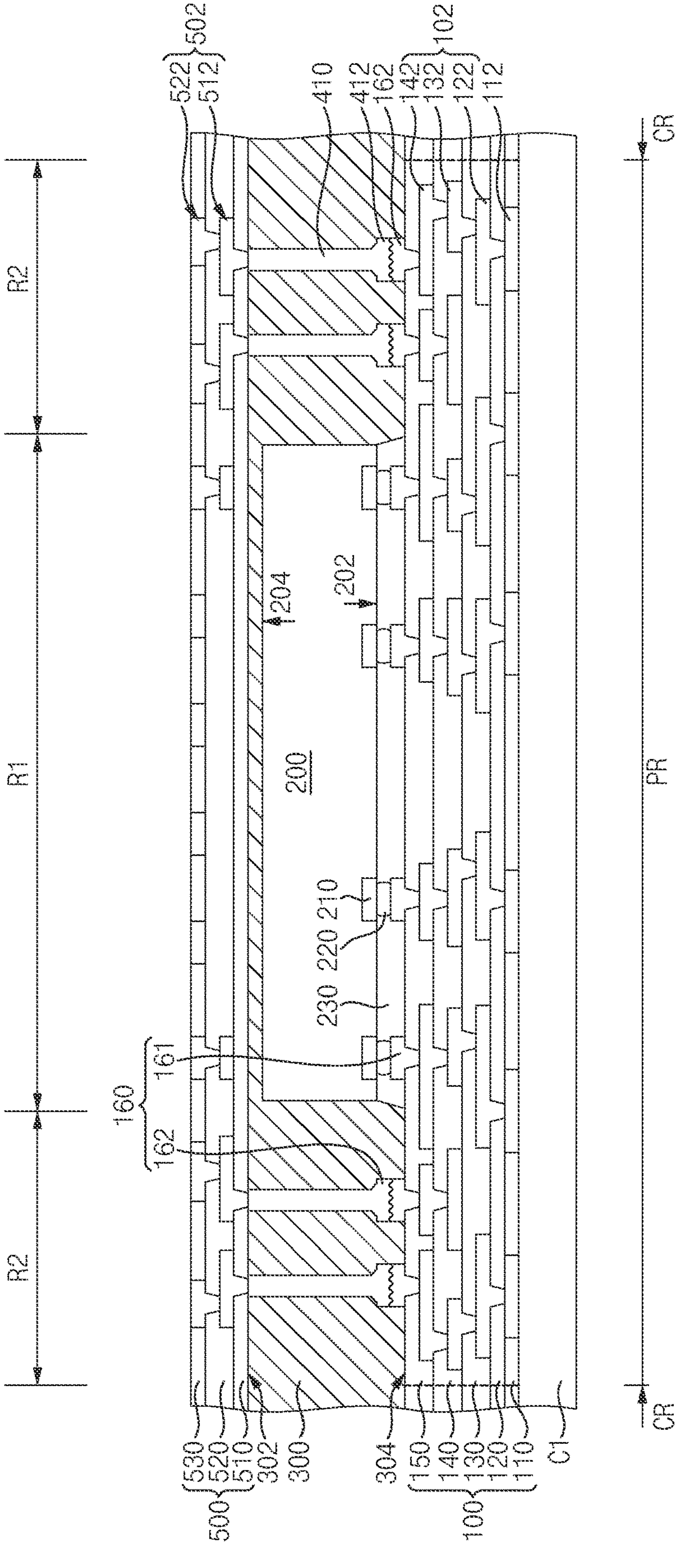

Referring to FIG. 17, an upper redistribution wiring layer 500 having a plurality of second redistribution wirings 502 electrically connected to the vertical conductive wires 410 may be formed on an upper surface 302 of the sealing member 300.

In some example embodiments, after a first upper insulating layer 510 is formed on the upper surface 302 of the sealing member 300, the first upper insulating layer 510 may be patterned to form openings that expose the other end portions 414 of the vertical conductive wires 410. The openings of the patterned first upper insulating layer 510 may expose the upper surfaces of the vertical conductive wires 410.

Then, after a seed layer is formed on portions of the exposed vertical conductive wires 410 that are exposed through the openings, the seed layer may be patterned and an electro plating process may be performed to form first upper redistribution wirings 512. Accordingly, at least portions of the first upper redistribution wirings 512 may be electrically connected to the vertical conductive wires 410 through the openings.

Then, after a second upper insulating layer 520 is formed on the first upper insulating layer 510, the second upper insulating layer 520 may be patterned to form openings that expose the first upper redistribution wirings 512. Then, second upper redistribution wirings 522 may be formed on the second upper insulating layer 520 to directly contact the first upper redistribution wirings 512 through the openings.

Thus, the second redistribution wirings 502 may include the first upper redistribution wiring 512 and the second upper redistribution wiring 522 stacked in at least two layers. In this case, the second upper redistribution wiring 522 may correspond to an uppermost redistribution wiring among the second redistribution wirings.

Then, upper bonding pads (not illustrated) may be formed on the second upper redistribution wirings 522 as the uppermost redistribution wirings, respectively, and a third upper insulating layer 530 may be formed on the second upper insulating layer 520 to expose at least portions of the upper bonding pads on the second upper redistribution wirings 522. The third upper insulating layer 530 may serve as a passivation layer.

Then, the carrier substrate C1 may be removed, and external connection members 550 (see FIG. 1) may be formed on the first bonding pads 112 on an outer surface, that is, a lower surface of the lower redistribution wiring layer 100.

Then, individual lower redistribution wiring layers 100 may be formed through a sawing process to complete the fan out wafer level package 10 of FIG. 1 including the sealing member 300, the lower redistribution wiring layer 100 formed on the lower surface 304 of the sealing member 300 and the upper redistribution wiring layer 500 formed on the upper surface 302 of the sealing member 300.

Figure 18:
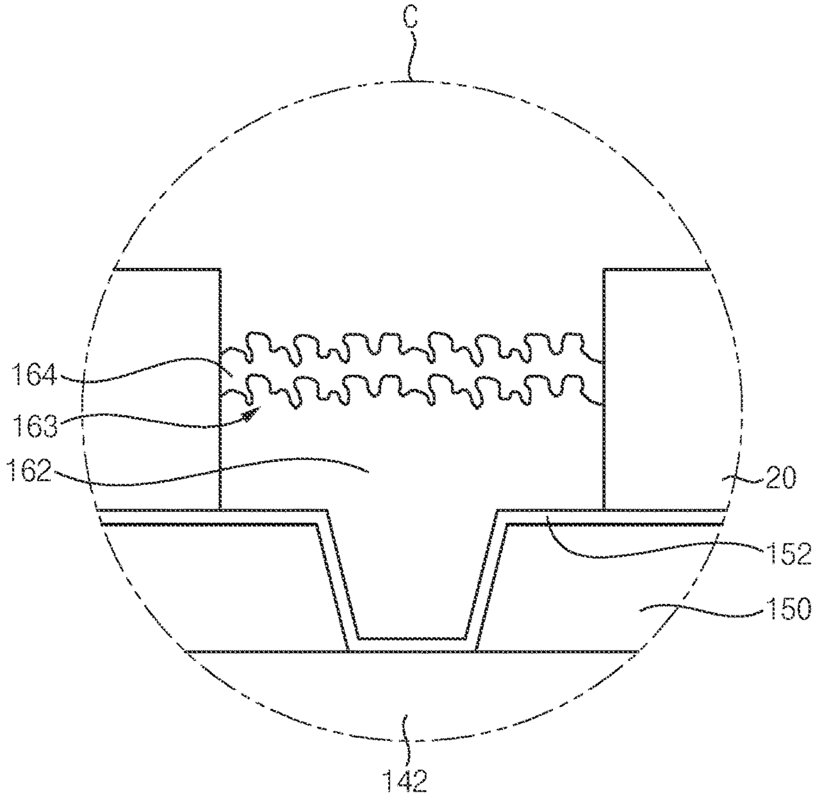
FIGS. 18 to 20 are cross-sectional views illustrating a method of manufacturing a semiconductor package in accordance with some example embodiments.
Figure 19:
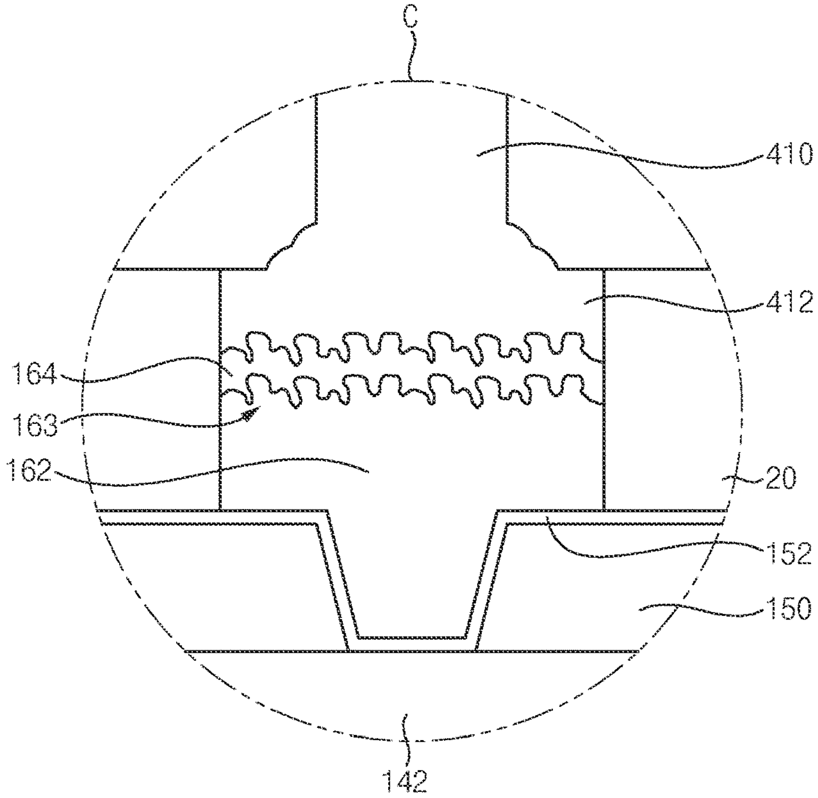
Figure 20:
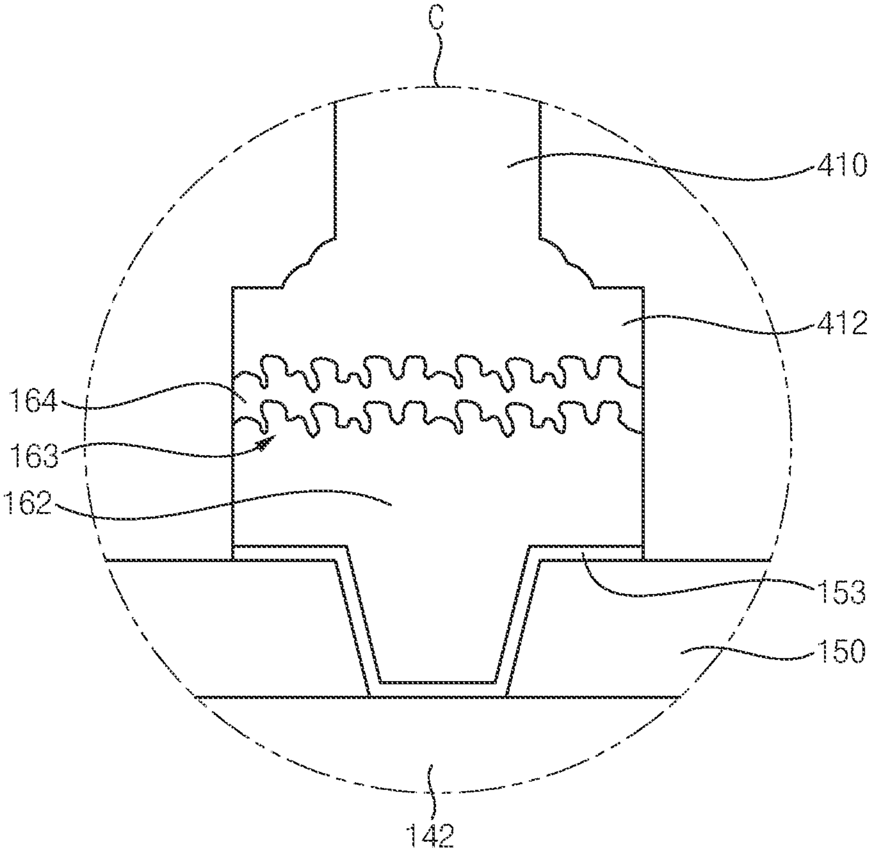

FIGS. 18 to 20 are cross-sectional views illustrating a method of manufacturing a semiconductor package in accordance with some example embodiments.

Referring to FIG. 18, processes the same as or similar to the processes described with reference to FIGS. 3 to 8 may be performed to form a concave-convex pattern 163 in an exposed surface of a wire connection-bonding pad 162 located in a second region R2 by surface treatment. A repeated detailed description of the processes described with reference to FIGS. 3-8 is omitted for conciseness. Then, a plating pattern 164 may be formed on the wire connection-bonding pad 162 as shown in FIG. 18.

For example, the plating pattern 164 may be formed by performing a plating process on the upper surface of the wire connection-bonding pad 162 having the concave-convex pattern 163. The plating pattern 164 may include nickel, gold, titanium, or an alloy of nickel, gold, or titanium. A portion of the plating pattern 164 may fill the plurality of grooves of the concavo-convex pattern 163, and the plating pattern 164 may also have a second concavo-convex pattern in an upper surface thereof similar to the concavo-convex pattern 164.

Referring to FIG. 19, processes the same as or similar to the processes described with reference to FIGS. 9 to 11 may be performed to form vertical conductive wires 410 on the plating pattern 164 having the second concave-convex pattern. A repeated detailed description of the processes described with reference to FIGS. 9-11 is omitted for conciseness.

For example, first, a preliminary vertical conductive wire may be formed on the plating pattern 164 by a bonding wire process. Since the plating pattern 164 also has the second concavo-convex pattern, the conductive wire metal may fill the plurality of grooves of the plating pattern 164 to generate an anchoring effect. Accordingly, adhesion between the wire connection-bonding pad 162 and the conductive wire 400 may be improved to increase the yield of the bonding wire process.

Then, an additional plating process may be performed on the preliminary vertical conductive wire to form an additional plating pattern on the surface of the preliminary vertical conductive wire. Accordingly, vertical conductive wires 410 having a relatively large thickness may be formed on the wire connection-bonding pad 162 located in the second region R2. The additional plating pattern may be conformally formed on the exposed surface of the preliminary vertical conductive wire by the additional plating process.

Referring to FIG. 20, processes the same as or similar to the described with reference to FIGS. 12 and 13 may be performed. A repeated detailed description of the processes described with reference to FIGS. 12-13 is omitted for conciseness. For example, a photoresist pattern 20 may be removed from a fifth lower insulating layer 150, and a portion of a seed layer 152 that is exposed by removing the photoresist pattern 20 may be removed to form a seed layer pattern 153.

Thus, the plating pattern 164 may be additionally formed on the wire connection-bonding pad 162 on the uppermost first redistribution wiring 142 located in the second region R2, and the vertical conductive wires 410 may extend upwardly on the plating pattern 164. Bondability of the vertical conductive wires 410 may be further improved by the plating pattern 164.

FIGS. 21 to 24 are cross-sectional views illustrating a method of manufacturing a semiconductor package in accordance with some example embodiments.

Figure 21:
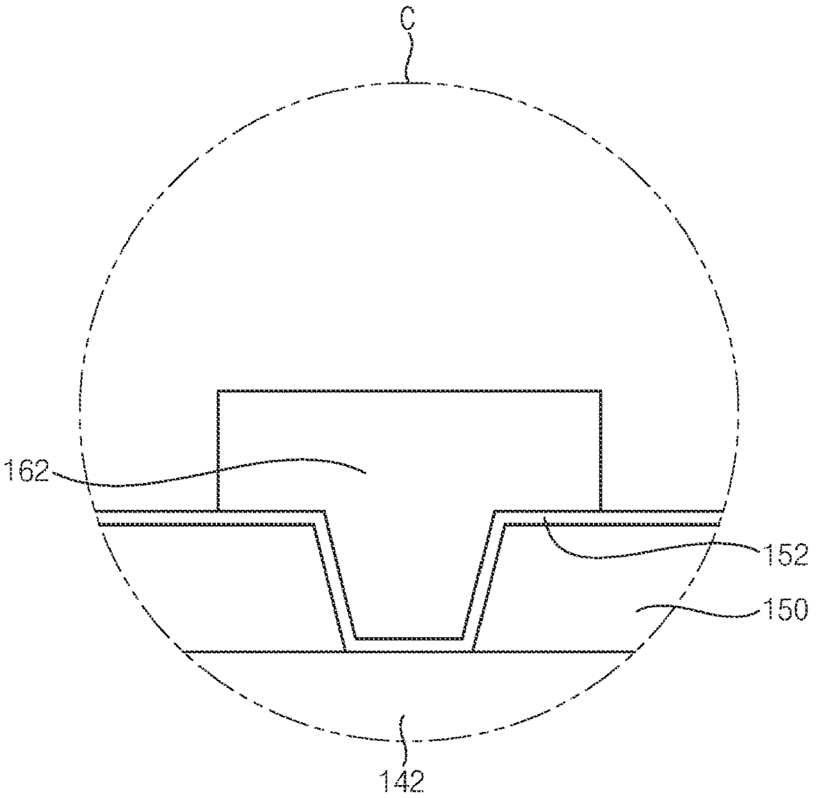
FIGS. 21 to 24 are cross-sectional views illustrating a method of manufacturing a semiconductor package in accordance with some example embodiments.

Referring to FIG. 21, processes the same as or similar to the processes described with reference to FIGS. 3 to 7 may be performed to form a wire connection-bonding pad 162 on an uppermost first redistribution wiring 142 located in a second region R2, and a photoresist pattern 20 may be removed from a fifth lower insulating layer 150. A repeated detailed description of the processes described with reference to FIGS. 3-7 is omitted for conciseness. Accordingly, an upper surface and an outer surface of the wire connection-bonding pad 162 may be exposed from the fifth lower insulating layer 150.

Figure 22:
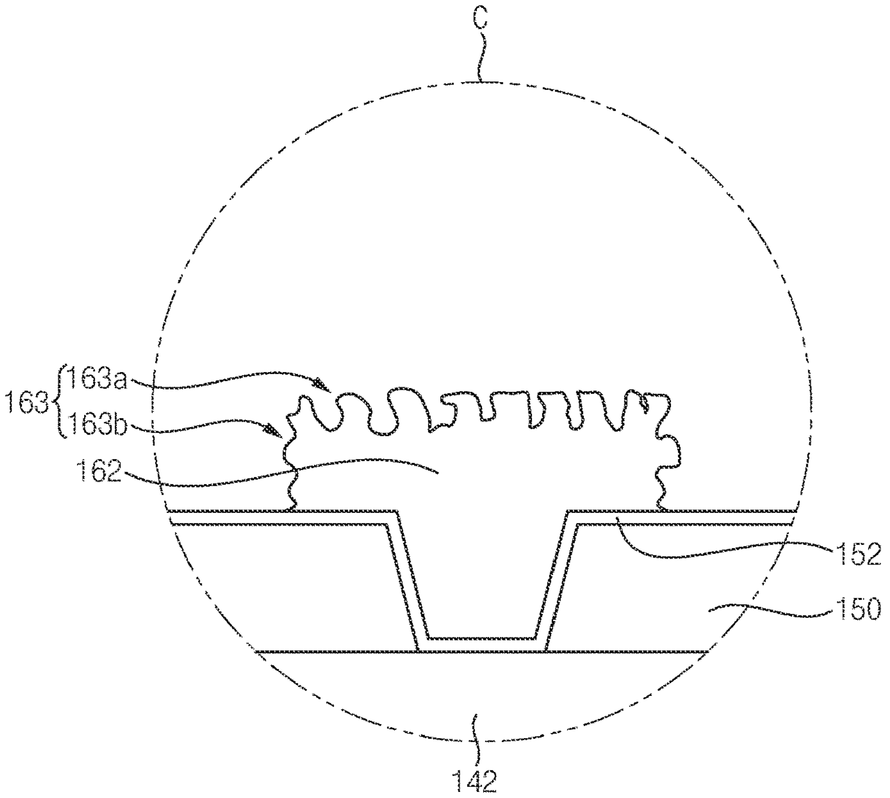

Referring to FIG. 22, processes the same as or similar to the processes described with reference to FIG. 8 may be performed to form a concavo-convex pattern 163 in the exposed surfaces of the wire connection-bonding pad 162 by surface treatment. A repeated detailed description of the processes described with reference to FIG. 8 is omitted for conciseness. The concavo-convex pattern 163 may include a first concavo-convex pattern 163*a* formed in the upper surface of the wire connection-bonding pad 162 and a second concavo-convex pattern 163*b* formed in the outer surface of the wire connection-bonding pad 162. Thus, the concavo-convex pattern 163 may be provided in both the upper surface of the wire connection-bonding pad 162 and side surfaces of the wire connection-bonding pad 162.

Figure 23:
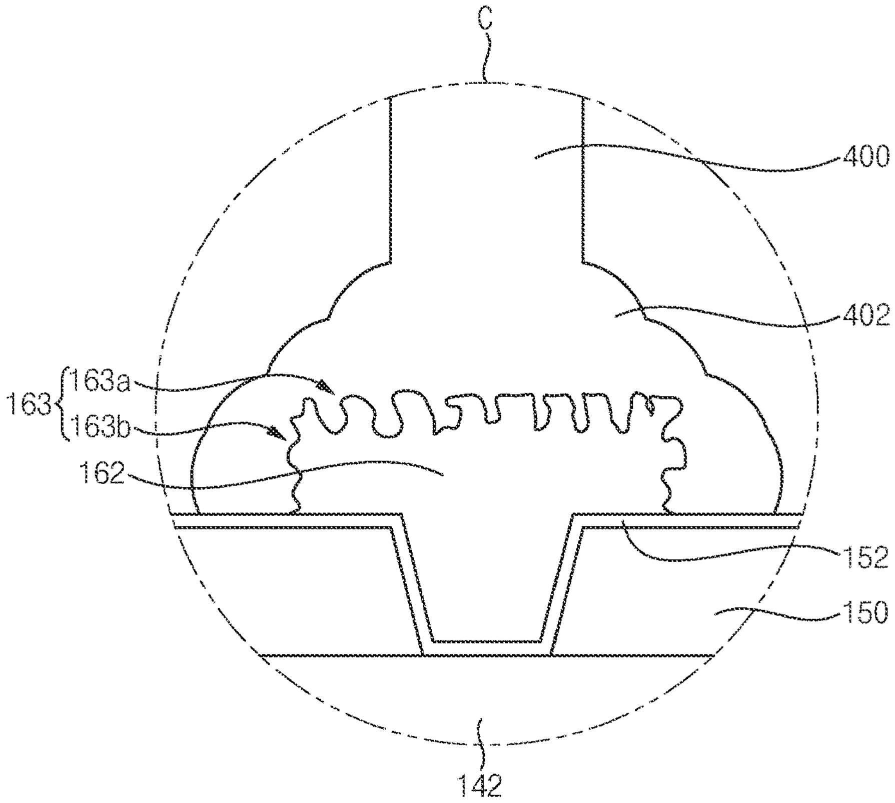

Referring to FIG. 23, processes the same as or similar to the processes described with reference to FIGS. 9 and 10 may be performed to from a conductive wire 400 on the wire connection-bonding pad 162 having the concavo-convex pattern 163. A repeated detailed description of the processes described with reference to FIGS. 9-10 is omitted for conciseness.

A lower end portion 402 of the conductive wire 400 may cover the upper surface and the outer surfaces of the wire connection-bonding pad 162. That is, the lower end portion 402 of the conductive wire 400 may cover the upper surface of the wire connection-bonding pad 162 and side surfaces of the wire connection-bonding pad 162. In this configuration, the lower end portion 402 of the conductive wire 400 may have a diameter greater than a diameter of the wire connection-bonding pad 162. Accordingly, the lower end portion 402 of the conductive wire 400 may be bonded to the first concavo-convex pattern 163*a* and the second concavo-convex pattern 163*b*. In this configuration, the conductive wire 400 may have a maximum diameter greater than a diameter of the wire connection-bonding pad 162.

Figure 24:
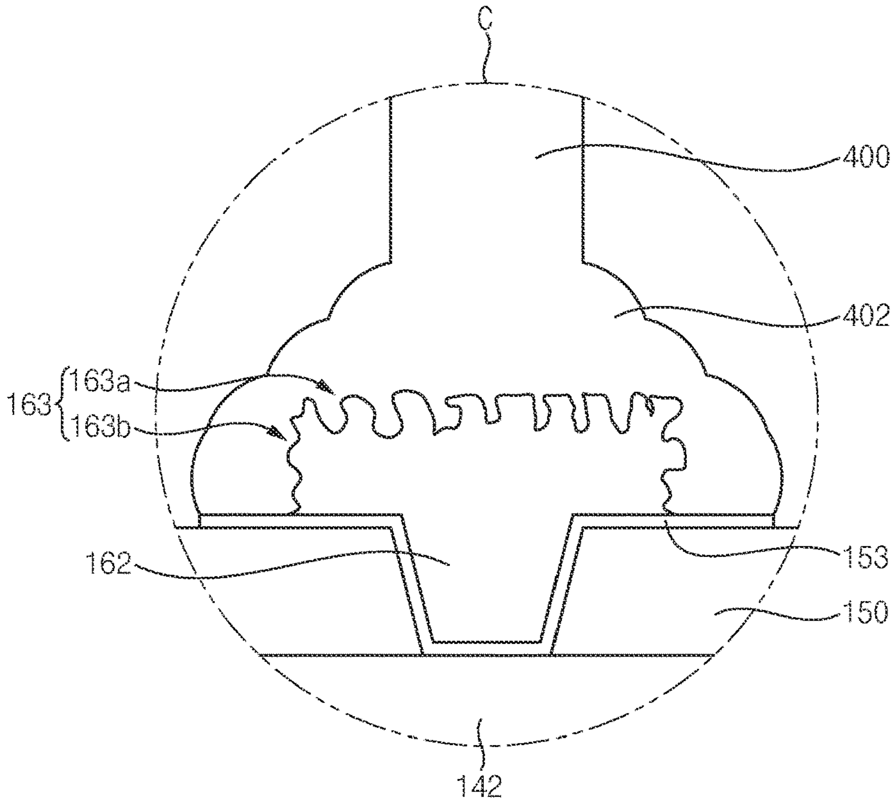

Referring to FIG. 24, a portion of a seed layer 152 exposed by the lower end portion 402 of the conductive wire 400 may be removed to form a seed layer pattern 153.

Accordingly, the concavo-convex pattern 163 may be formed on the upper surface and the outer surfaces of the wire connection-bonding pad 162, and the conductive wire 400 may be bonded to the first concavo-convex pattern 163*a* and the second concavo-convex pattern 163*b*. The lower end portion 402 of the conductive wire 400 may have a larger diameter than a diameter of the wire connection-bonding pad 162. In some example embodiments, the conductive wire 400 may correspond to the vertical conductive wire 410 in FIG. 1.

FIGS. 25 to 28 are cross-sectional views illustrating a method of manufacturing a semiconductor package in accordance with some example embodiments.

Figure 25:
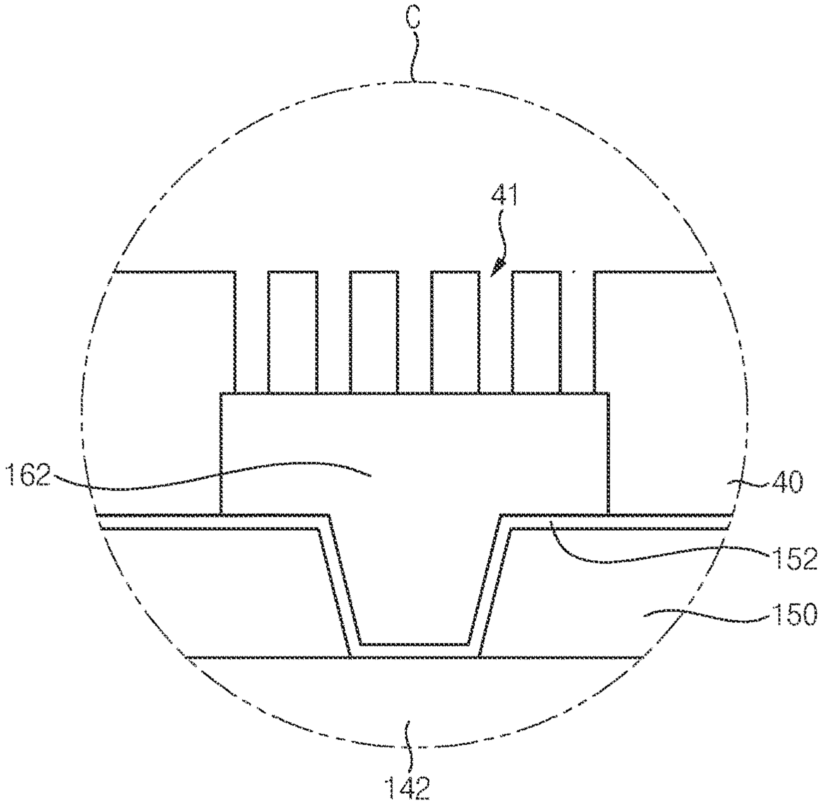
FIGS. 25 to 28 are cross-sectional views illustrating a method of manufacturing a semiconductor package in accordance with some example embodiments.

Referring to FIG. 25, processes the same as or similar to the processes described with reference to FIGS. 3 to 7 may be performed to form a wire connection-bonding pad 162 on an uppermost first redistribution wiring 142 located in a second region R2. A repeated detailed description of the processes of FIGS. 3-7 is omitted for conciseness. A second photoresist pattern 40 having a plurality of openings 41 may be formed on the wire connection-bonding pad 162 on a seed layer 152.

The plurality of openings 41 may expose a plurality of embossed regions on an upper surface of the wire connection-bonding pad 162.

Figure 26:
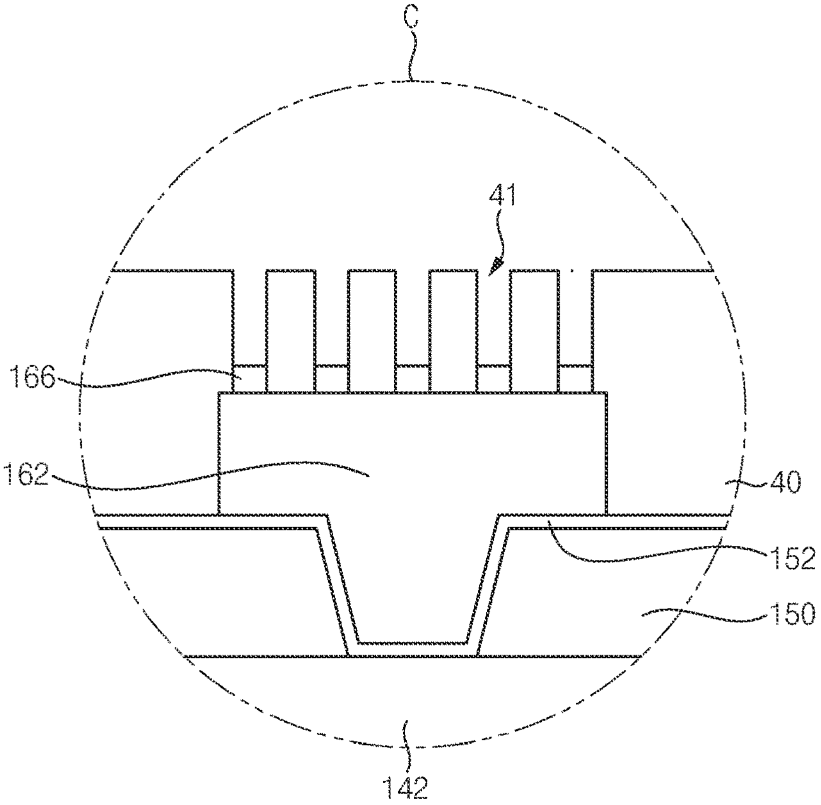
Figure 27:
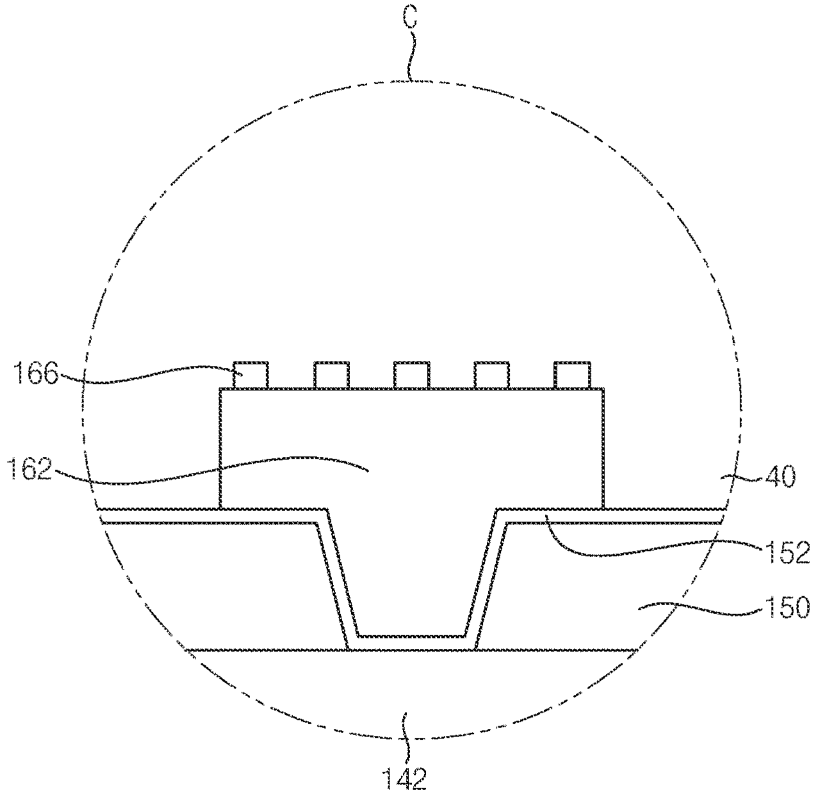

Referring to FIGS. 26 and 27, a plating process may be performed to form an embossed plating pattern 166 in the openings 41 of the second photoresist pattern 40, and the second photoresist pattern 40 may be removed from a fifth lower insulating layer 150.

The embossed plating pattern 166 may be provided as concave-convex pattern on the upper surface of the wire connection-bonding pad 162. The embossed plating pattern 166 may have a plurality of protrusions spaced apart from each other on the upper surface of the wire connection-bonding pad 162. The embossed plating pattern 166 may include nickel, gold, titanium, or an alloy of nickel, gold, or titanium.

Figure 28:
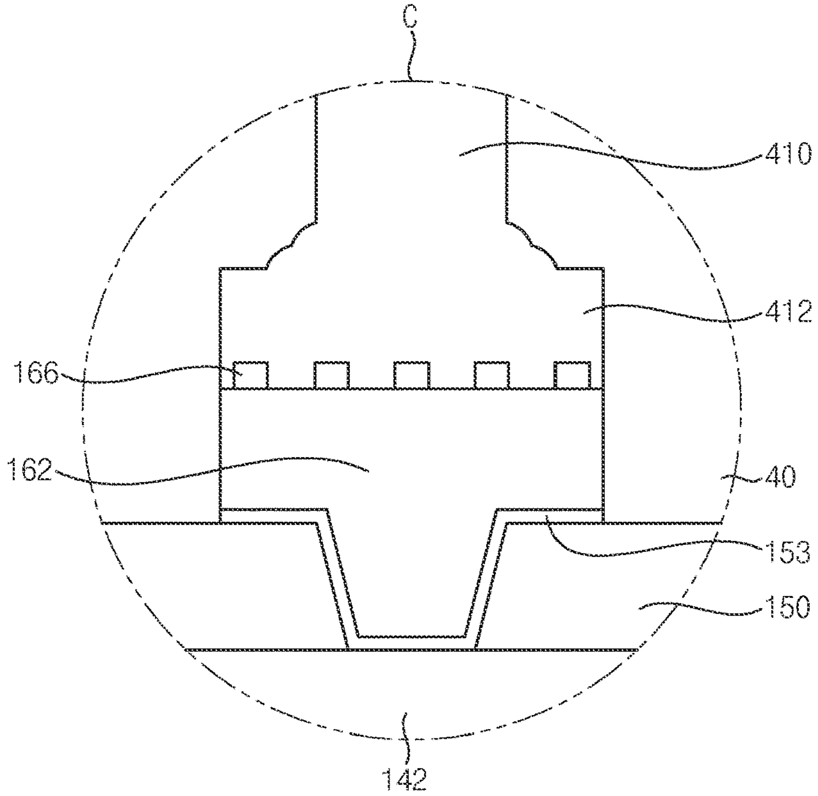

Referring to FIG. 28, the processes the same as or similar to the processes described with reference to FIGS. 9 to 11 may be performed to form vertical conductive wires 410 on the wire connection-bonding pads 162 having the embossed plating pattern 166 formed thereon. A repeated detailed description of the processes of FIGS. 9-11 is omitted for conciseness. A portion of the seed layer exposed by the wire connection-bonding pad 162 may be removed to form a seed layer pattern 153.

Since the embossed plating pattern 166 on the upper surface of the wire connection-bonding pad 162 also has a concavo-convex shape, the conductive wire metal may fill a plurality of grooves defined between the protrusions of the embossed plating pattern 166 to generate an anchoring effect. Accordingly, adhesion between the wire connection-bonding pad 162 and the conductive wire may be improved to increase the yield of the bonding wire process.

Figure 29:
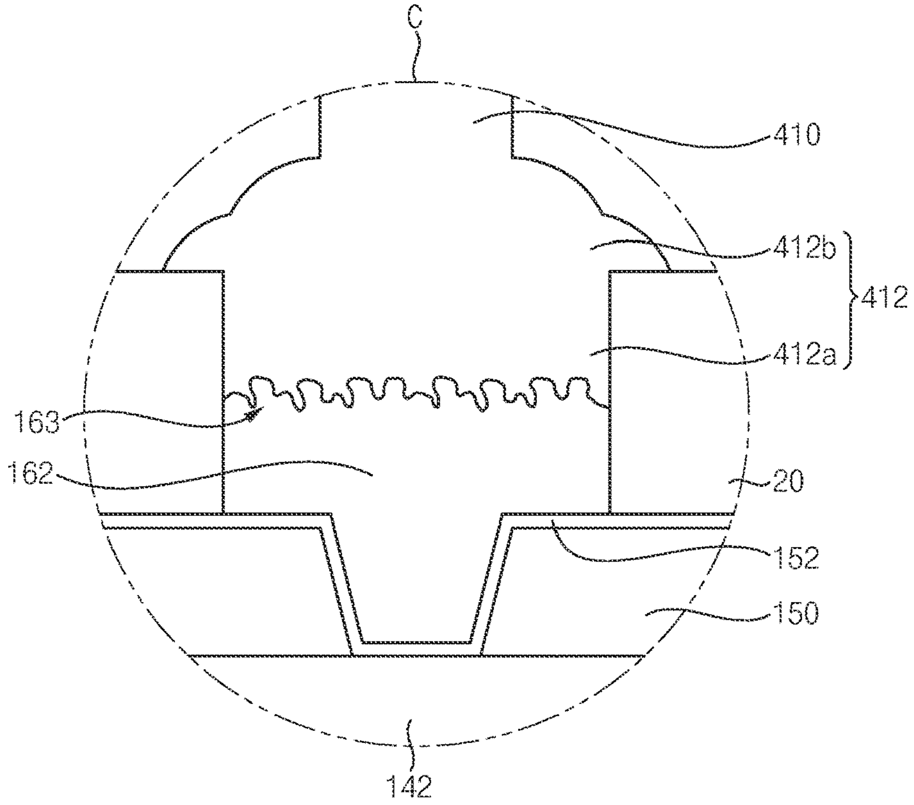
FIGS. 29 and 30 are cross-sectional views illustrating a method of manufacturing a semiconductor package in accordance with some example embodiments.
Figure 30:
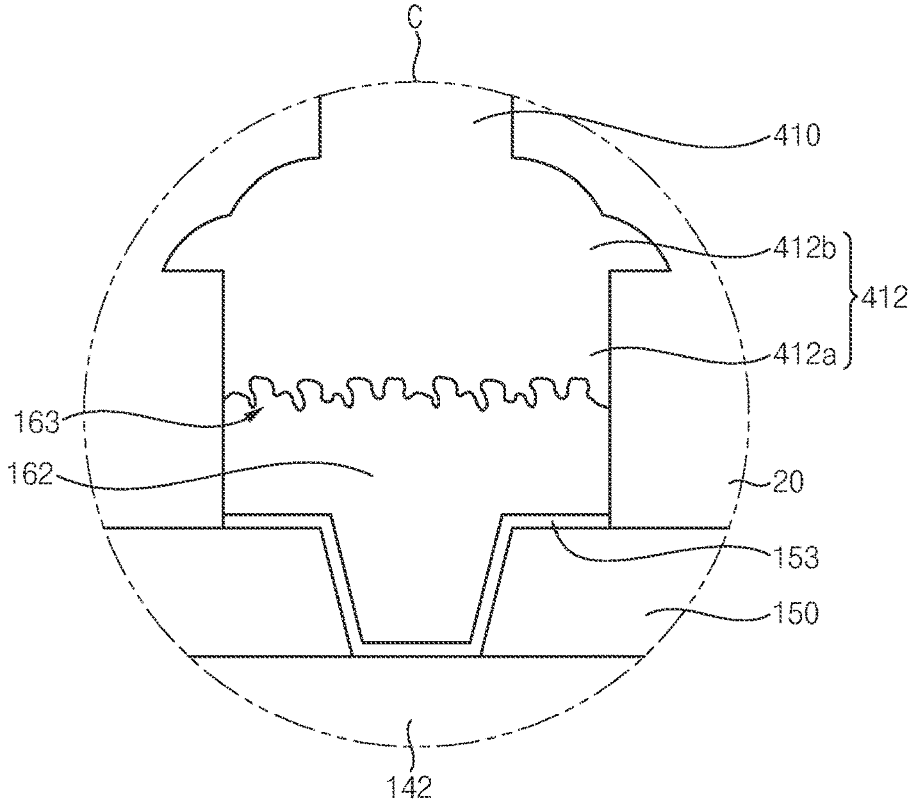

FIGS. 29 and 30 are cross-sectional views illustrating a method of manufacturing a semiconductor package in accordance with some example embodiments.

Referring to FIG. 29, processes the same as or similar to the processes described with reference to FIGS. 3 to 8 may be is performed to form a concavo-convex pattern 163 in an exposed surface of a wire connection-bonding pad 162 located in a second region R2 by surface treatment, and processes the same as or similar to the processes described with reference to FIGS. 9 to 11 may be performed to form vertical conductive wires 410 on the wire connection-bonding pads 162. A repeated detailed description of the processes of FIGS. 3-8 and 9-11 is omitted for conciseness.

In this case, a lower end 412 of the vertical conductive wires 410 may have a diameter greater than a diameter of an opening 21 of a photoresist pattern 20. That is, the lower end portion 412 of the vertical conductive wires 410 may include a first lower end portion 412*a* filling the opening 21 of the photoresist pattern 20 and a second lower end portion 412*b* covering an upper surface of the photoresist pattern 20 adjacent to the opening 21.

Referring to FIG. 30, processes the same as or similar to the processes described with reference to FIGS. 12 and 13 may be performed to remove the photoresist pattern 20 from a fifth lower insulating layer 150, and a portion of the seed layer 152 that is exposed by removing the photoresist pattern 20 may be removed to form a seed layer pattern 153.

Thus, the first lower end portion 412*a* of the vertical conductive wires 410 may have a diameter the same as diameter of the wire connection-bonding pad 162, and the second lower end portion 412*b* of the vertical conductive wires 410 may have a diameter greater than the diameter of the wire connection-bonding pad 162. Accordingly, a maximum diameter of a vertical conductive wire 410 may be greater than a diameter of the wire connection-bonding pad 162.

Figure 31A:
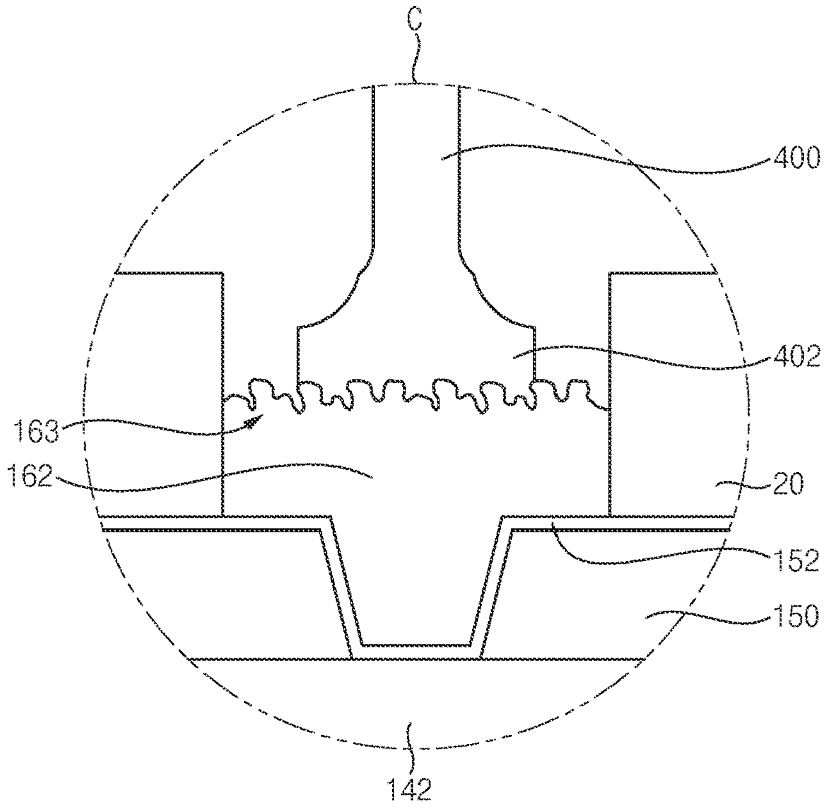
FIGS. 31A and 31B are cross-sectional views illustrating a method of manufacturing a semiconductor package in accordance with some example embodiments.
Figure 31B:
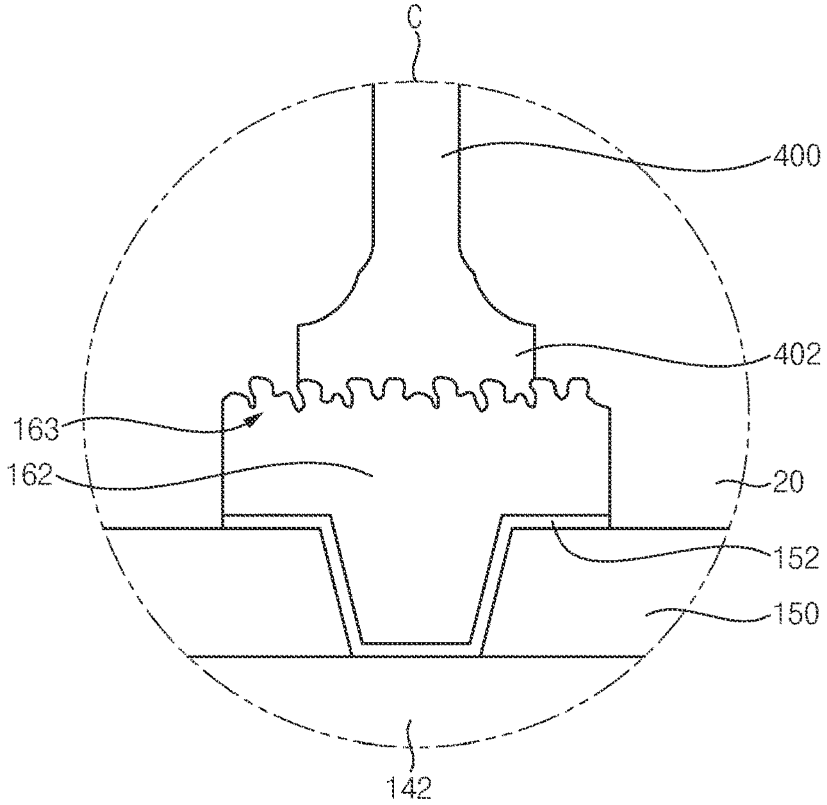

FIGS. 31A and 31B are cross-sectional views illustrating a method of manufacturing a semiconductor package in accordance with some example embodiments.

Referring to FIG. 31A, processes the same as or similar to the processes described with reference to FIGS. 9 and 10 may be performed to form a conductive wire 400 on a wire connection-bonding pad 162 having a concavo-convex pattern 163. A repeated detailed description of the processes of FIGS. 9-10 is omitted for conciseness.

In this case, a lower end portion 402 of the conductive wire 400 may be formed on a central portion of an upper surface of the wire connection-bonding pad 162. Accordingly, the lower end portion 402 of the conductive wire 400 may be bonded to a portion of the concavo-convex pattern 163, that is, to the central portion thereof. The lower end portion 402 of the conductive wire 400 may have a diameter less than a diameter of an opening 21 of a photoresist pattern 20.

In this case, an additional plating process may be performed on an exposed surface of the conductive wire 400. In some example embodiments, the additional plating process may be omitted to simplify the process.

Referring to FIG. 31B, processes the same as or similar to the processes described with reference to FIGS. 12 and 13 may be performed to remove the photoresist pattern 20 from a fifth lower insulating layer 150, and a portion of the seed layer 152 that is exposed by removing the photoresist pattern 20 may be removed to form a seed layer pattern 153.

Thus, the lower end portion 402 of the conductive wire 400 may have the diameter less than a diameter of the wire connection-bonding pad 162.

As mentioned above, a special roughness treatment may be performed on the wire connection-bonding pad 162 including copper (Cu) and then a bonding wire process may be performed directly without performing an Au finish. In some example embodiments, the processes may be varied depending on the shape and structure of the wire connection-bonding pad 162.

Furthermore, the contact area with the bonding wire may be adjusted by adjusting the opening area of the bonding pad. By forming and patterning a different metal or the same metal on the bonding pad to form a concave-convex pattern, a hybrid bonding structure may be provided to improve the yield of the wire bonding process.

Figure 32:
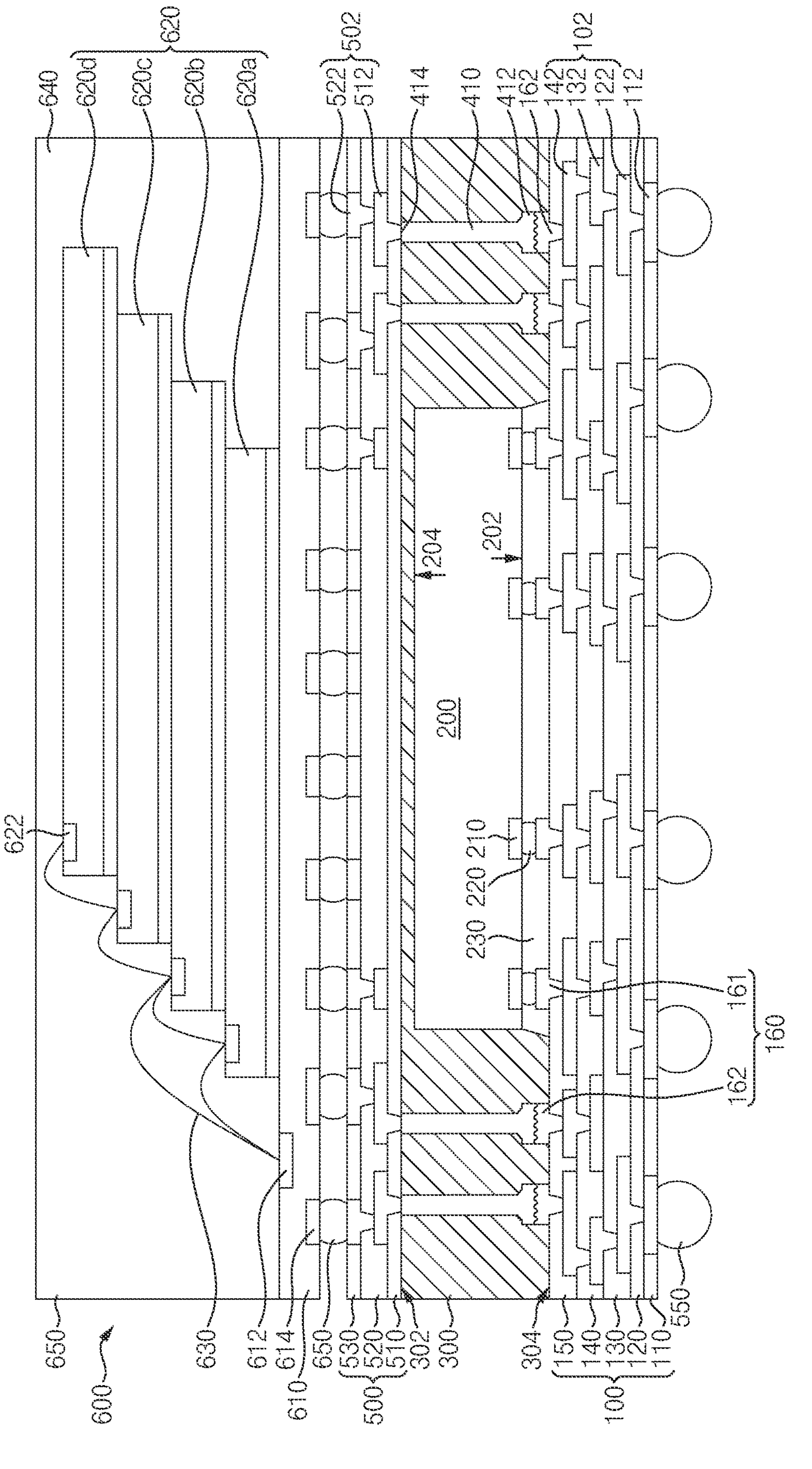
FIG. 32 is a cross-sectional view illustrating a semiconductor package in accordance with some example embodiments.

FIG. 32 is a cross-sectional view illustrating a semiconductor package in accordance with some example embodiments. The semiconductor package may be substantially the same as the semiconductor package described with reference to FIG. 1 except for an additional configuration of a second package. Thus, same reference numerals may be used to refer to the same or like elements and any further repetitive explanation concerning the above elements will be omitted for conciseness.

Referring to FIG. 32, a semiconductor package 11 may include a first package and a second package 600 stacked on the first package. The first package may include a lower redistribution wiring layer 100, a semiconductor chip 200, a sealing member 300 and an upper redistribution wiring layer 500. The first package may be substantially the same as or similar to a unit package described with reference to FIG. 1.

In some example embodiments, the second package 600 may include a second package substrate 610, a plurality of second semiconductor chips 620 mounted on the second package substrate 610, and a sealing member 640 on the second package substrate 610 to cover the second semiconductor chips 620.

The second package 600 may be stacked on the first package via conductive connection members 650. For example, the conductive connection members 650 may include solder balls, conductive bumps, and the like. The conductive connection member 650 may be disposed between a bonding pad on a second upper redistribution wiring 422 of the upper redistribution wiring layer 500 and a second connection pad 614 of the second package substrate 610. Accordingly, the first package and the second package 600 may be electrically connected to each other by the conductive connection members 650.

The plurality of second semiconductor chips 620*a*, 620*b*, 620*c* and 620*d* may be sequentially stacked on the second package substrate 610 by adhesive members. Bonding wires 630 may connect second chip pads 622 of the second semiconductor chips 620 to first connection pads 612 of the second package substrate 610. The second semiconductor chips 620 may be electrically connected to the second package substrate 610 through the bonding wires 630.

Although the second package 600 includes four semiconductor chips mounted by a wire bonding method, it will be appreciated that the number of the semiconductor chips in the second package and the mounting method are not limited thereto.

In some example embodiments, the semiconductor package 11 may further include a heat sink (not illustrated) stacked on the second package 600. The heat sink may be provided on the second package 600 to dissipate heat from the first and second packages to the outside. The heat sink may be attached on the second package 600 by using a thermal interface material (TIM).

Figure 33:
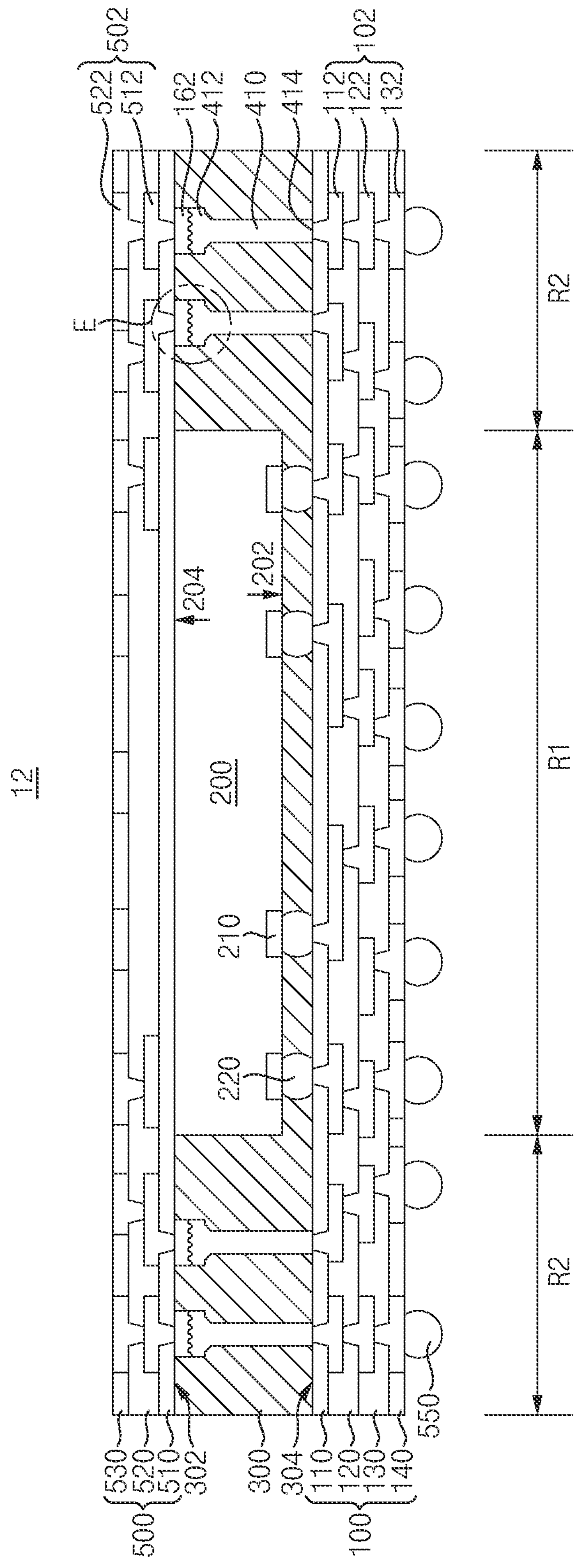
FIG. 33 is a cross-sectional view illustrating a semiconductor package in accordance with some example embodiments.
Figure 34:
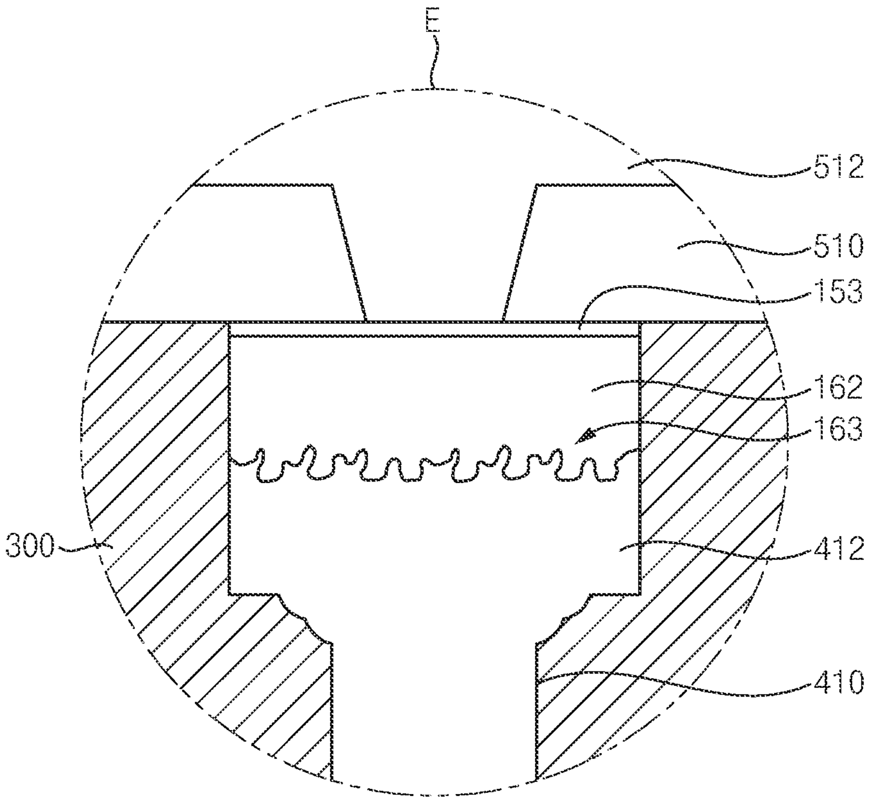
FIG. 34 is an enlarged cross-sectional view illustrating portion 'E' in FIG. 33.

FIG. 33 is a cross-sectional view illustrating a semiconductor package in accordance with some example embodiments. FIG. 34 is an enlarged cross-sectional view illustrating portion 'E' in FIG. 33. The semiconductor package may be substantially the same as the semiconductor package described with reference to FIGS. 1 and 2 except for an arrangement of a semiconductor chip and connection structures of vertical conductive wires. Thus, same reference numerals may be used to refer to the same or like elements and any further repetitive explanation concerning the above elements will be omitted for conciseness.

Referring to FIGS. 33 and 34, a semiconductor package 12 may include a lower redistribution wiring layer 100, a semiconductor chip 200 disposed on the lower redistribution wiring layer 100, a sealing member 300 disposed on the lower redistribution wiring layer 100 and covering at least one side of the semiconductor chip 200, an upper redistribution wiring layer 500 disposed on the sealing member 300, and a plurality of vertical conductive wires 410 penetrating the sealing member 300 and electrically connecting the lower redistribution wiring layer 100 and the upper redistribution wiring layer 500. The lower redistribution wiring layer 100 may be referred to as a first redistribution wiring layer and the upper redistribution wiring layer 500 may be referred to as a second redistribution wiring layer. In some example embodiments, the semiconductor package 12 may further include external connection members 550 disposed on an outer surface of the lower redistribution wiring layer 100.

In some example embodiments, the semiconductor chip 200 may have a plurality of chip pads 210 on a first surface 202, that is, an active surface. The semiconductor chip 200 may be accommodated in the sealing member 300 such that the first surface 202 on which the chip pads 210 are formed faces the lower redistribution wiring layer 100. The sealing member 300 may cover an outer surface of the semiconductor chip 200. The first surface 202 of the semiconductor chip 200 may be exposed from a second surface 304 of the sealing member 300, and a second surface 204 opposite to the first surface 202 of the semiconductor chip 200 may be exposed from a first surface 302 of the sealing member 300.

The semiconductor chip 200 may be mounted on the lower redistribution wiring layer 100 via the conductive bumps 220. The conductive bump 220 may be disposed between a first lower redistribution wiring 112 of the lower redistribution wiring layer 100 and the chip pad 210 of the semiconductor chip 200 to electrically connect the lower redistribution wiring layer 100 and the semiconductor chip 200.

The sealing member 300 may cover at least a portion of the semiconductor chip 200 on an upper surface of the lower redistribution wiring layer 100. The sealing member 300 may include a first sealing portion covering the first surface 202 of the semiconductor chip 200 and a second sealing portion covering the upper surface of the lower redistribution wiring layer 100 around the semiconductor chip 200.

In some example embodiments, the plurality of vertical conductive wires 410 may extend in a vertical direction to penetrate the sealing member 300. The vertical conductive wires 410 may extend in the vertical direction from the first surface 302 of the sealing member 300 to the second surface 304. One end portion 414 of the vertical conductive wires 410 may be exposed from the second surface 304 of the sealing member 300.

As illustrated in FIG. 34, a plurality of wire connection-bonding pads 162 may be respectively provided on the other end portions 412 of the vertical conductive wires 410. The wire connection-bonding pads 162 may have a concave-convex pattern 163 in an upper surface thereof. The vertical conductive wires 410 may be bonded to the concave-convex pattern 163 of the wire connection-bonding pads 162 respectively.

The vertical conductive wires 410 may extend downwardly from the wire connection-bonding pads 162 having the concave-convex pattern 163. The vertical conductive wires 410 may be formed by a bonding wire process. Since the concavo-convex pattern 163 is formed in the surface of the wire connection-bonding pads 162, a contact area between the wire connection-bonding pad 162 and the vertical conductive wire 410 may be increased and a bonding wire metal may fill grooves of the concavo-convex pattern 163 to thereby generate an anchoring effect. Thus, adhesion between the wire connection-bonding pad 162 162 and the vertical conductive wire 410 may be improved.

In some example embodiments, the lower redistribution wiring layer 100 may be disposed on the second surface 304 of the sealing member 300 and the first surface 202 of the semiconductor chip 200. The lower redistribution wiring layer 100 may include a plurality of first redistribution wirings 102. The first redistribution wirings 102 may be electrically connected to the conductive bumps 220 on the chip pads 210 and the vertical conductive wires 410, respectively. The first redistribution wirings 302 may be provided on the front surface 202 of the semiconductor chip 200 and the second surface 304 of the sealing member 300 to serve as front redistribution wirings. Accordingly, the lower redistribution wiring layer 100 may be a front redistribution wiring layer of a fan out package.

For example, the lower redistribution wiring layer 100 may include first to fourth lower insulating layers 110, 120, 130 and 140 sequentially stacked on one another. The first redistribution wirings 102 may include first to third lower redistribution wirings 112, 122 and 132 provided in the first to fourth lower insulating layers 110, 120, 130 and 140. The first lower redistribution wirings 112 may be electrically connected to the conductive bumps 220 and the other end portions 414 of the vertical conductive wires 410.

In some example embodiments, the upper redistribution wiring layer 500 may be disposed on the first surface 302 of the sealing member 300 and the second surface 204 of the semiconductor chip 200 and may include second redistribution wirings 502 electrically connected to the vertical conductive wires 410 respectively. The second redistribution wirings 502 may include upper redistribution wirings 512 and 522 stacked in at least two layers. The second redistribution wirings 502 may be provided on the sealing member 300 to serve as rear redistribution wirings. Accordingly, the upper redistribution wiring layer 500 may be a rear redistribution wiring layer of the fan out package.

A first upper insulating layer 510 may be provided on the first surface 302 of the sealing member 300 and the second surface 204 of the semiconductor chip 200 and may have openings that expose upper surfaces of the bonding pads 162. First upper redistribution wirings 512 may be formed on the first upper insulating layer 510 and at least portions of the first upper redistribution wirings 512 may directly contact the bonding pads 162 through the openings of the first upper insulation layer 510.

A second upper insulating layer 520 may be provided on the first upper insulating layer 510 and may have openings that expose the first upper redistribution wirings 512. Second upper redistribution wirings 522 may be formed on the second upper insulating layer 520 and at least portions of the second upper redistribution wirings 522 may directly contact the first upper redistributable wirings 512 through the openings of the second upper insulating layer 520.

Bonding pads (not illustrated) may be respectively provided on the second upper redistribution wirings 522. A third upper insulating layer 530 may be provided on the second upper insulating layer 520 and may expose at least portions of the bonding pads. The third upper insulating layer 530 may serve as a passivation layer.

In some example embodiments, external connection members 550 may be disposed on package pads on the third lower redistribution wirings 132 on the outer surface of the lower redistribution wiring layer 100. For example, the external connection member 550 may include a solder ball. The semiconductor package 12 may be mounted on a module substrate (not illustrated) via the solder balls to form a memory module.

As mentioned above, the wire connection-bonding pads 162 may be provided on the first upper redistribution wiring 512 of the upper redistribution wiring layer 500. The vertical conductive wires 410 may be bonded to the wire connection-bonding pads 162. The vertical conductive wires 410 may extend downwardly from the wire connection-bonding pads 162 and may be connected to the first lower redistribution wiring 112 of the lower redistribution wiring layer 100. The concave-convex pattern 163 may be provided in the surface of the wire connection-bonding pads 162. The concavo-convex pattern 163 may have the grooves that are filled with the metal of the vertical conductive wire.

Accordingly, a contact area between the wire connection-bonding pad 162 and the vertical conductive wire 410 may be increased and the wire metal may fill the grooves of the concavo-convex pattern 163 to generate an anchoring effect. Thus, adhesion between the wire connection-bonding pad 162 and the vertical conductive wire 410 may be improved to secure structural stability of the vertical conductive wire 410.

Hereinafter, a method of manufacturing the semiconductor package of FIG. 33 will be described.

Figure 39:
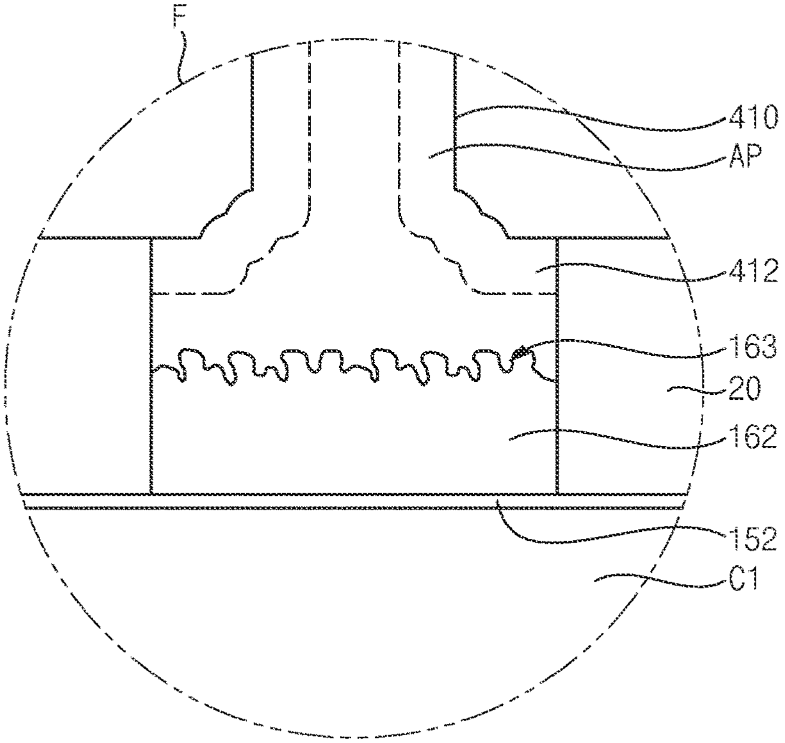
Figure 40:
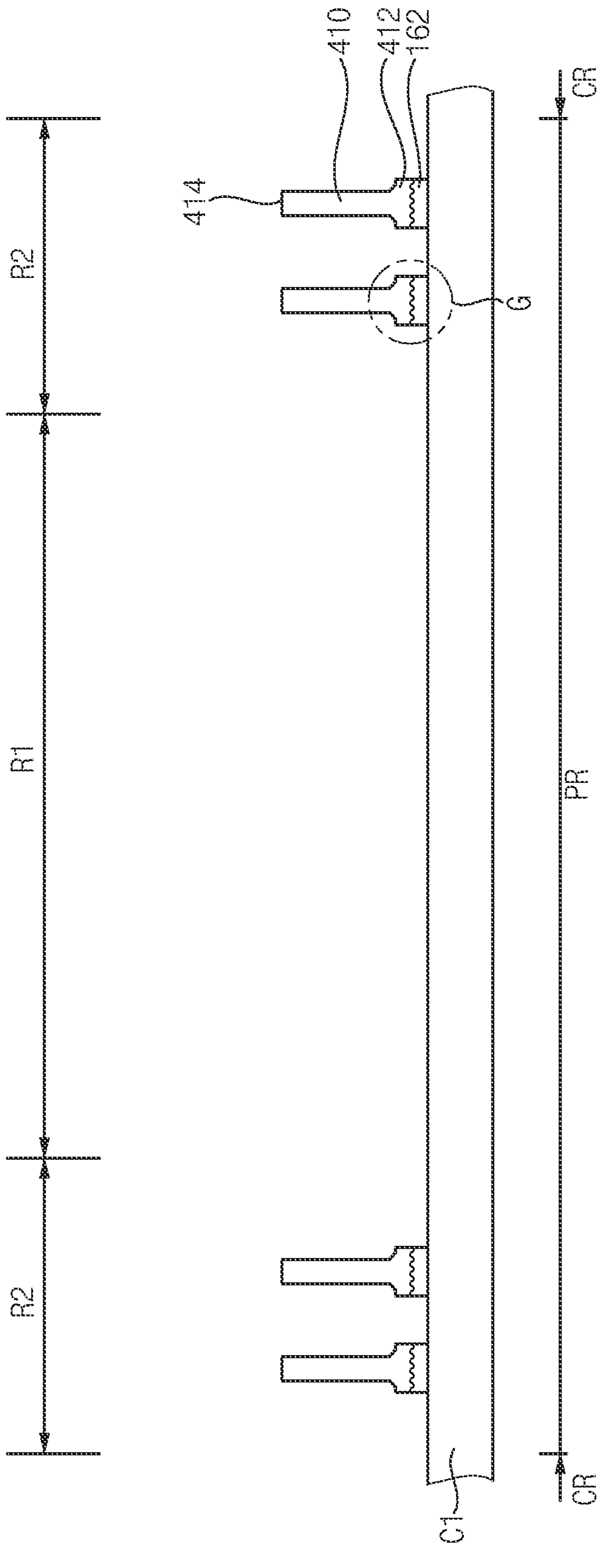
Figure 41:
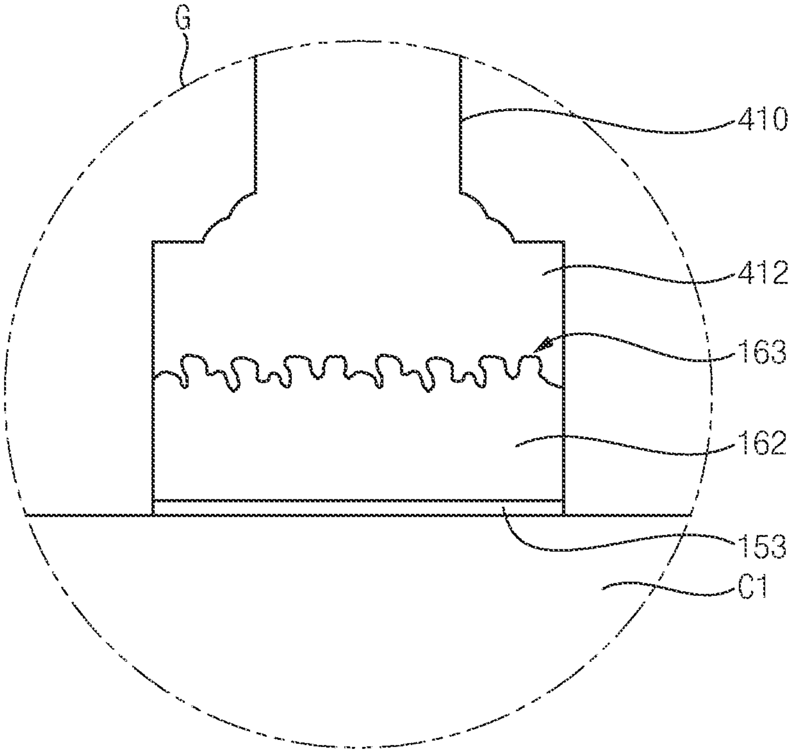

FIGS. 35 to 46 are cross-sectional views illustrating a method of manufacturing a semiconductor package in accordance with some example embodiments. FIGS. 35, 40 and 42 to 46 are cross-sectional views illustrating a method of manufacturing a semiconductor package in accordance with some example embodiments. FIGS. 36 to 39 are enlarged cross-sectional views illustrating portion 'F' in FIG. 35. FIG. 41 is an enlarged sectional view illustrating portion 'G' in FIG. 40.

Referring to FIGS. 35 to 41, wire connection-bonding pads 162 and vertical conductive wires 410 may be formed on a first carrier substrate C1.

Figure 35:
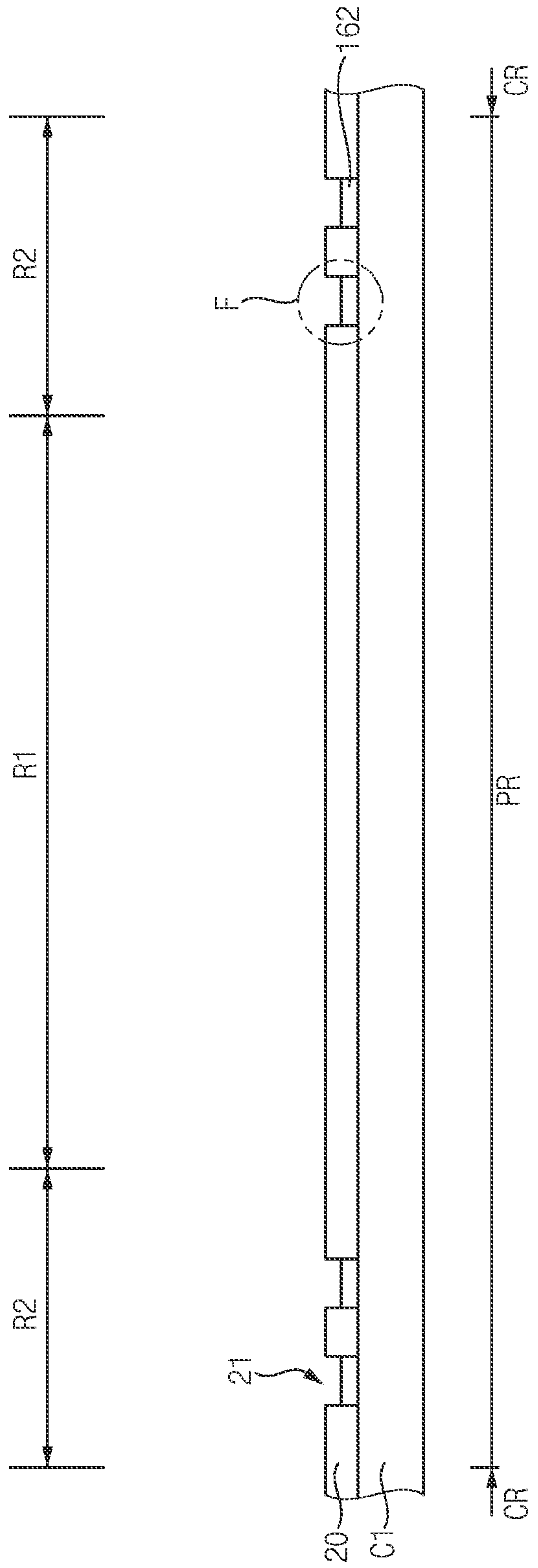
FIGS. 35 to 46 are cross-sectional views illustrating a method of manufacturing a semiconductor package in accordance with some example embodiments.
Figure 36:
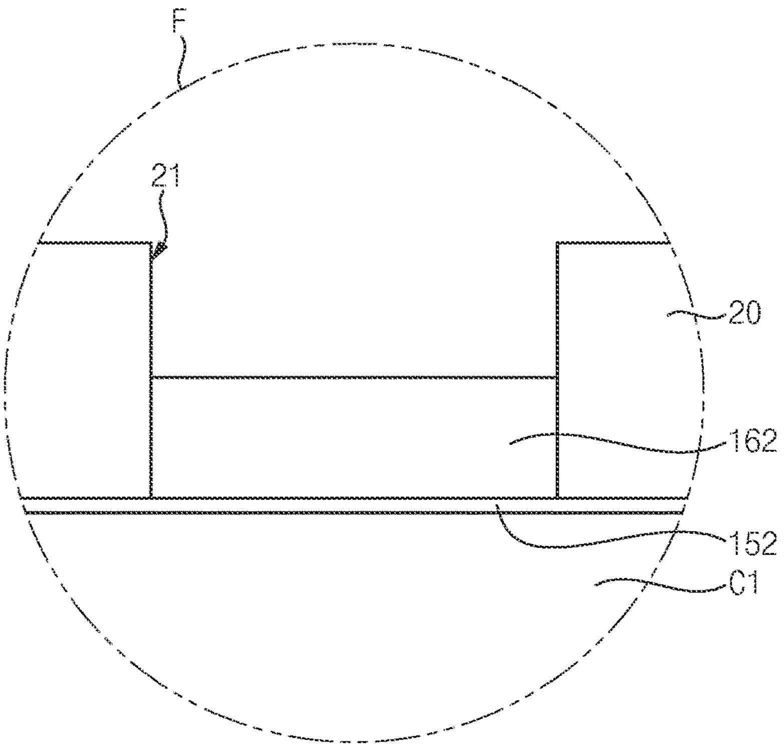

First, as illustrated in FIGS. 35 and 36, the first carrier substrate C1 including a package region PR on which a semiconductor chip is mounted and a cutting region CA surrounding the package region PR may be provided.

In some example embodiments, the first carrier substrate C1 may be used as a base substrate for stacking the semiconductor chips and forming a molding member covering the semiconductor chip. The first carrier substrate C1 may have a shape corresponding to a wafer on which a semiconductor process is performed. The first carrier substrate C1 may include a first region R1 overlapping the semiconductor chip and a second region R2 surrounding the first region R1. The second region R2 may be a fan out region outside a region where the semiconductor chip is disposed.

Then, a seed layer 152 may be formed on the first carrier substrate C1, and a photoresist pattern 20 having an opening 21 that expose a bonding pad region may be formed on the seed layer 152. Then, a plating process may be performed on the seed layer to form wire connection-bonding pads 162 in the openings. The wire connection-bonding pads 162 may be formed in the second region R2.

Figure 37:
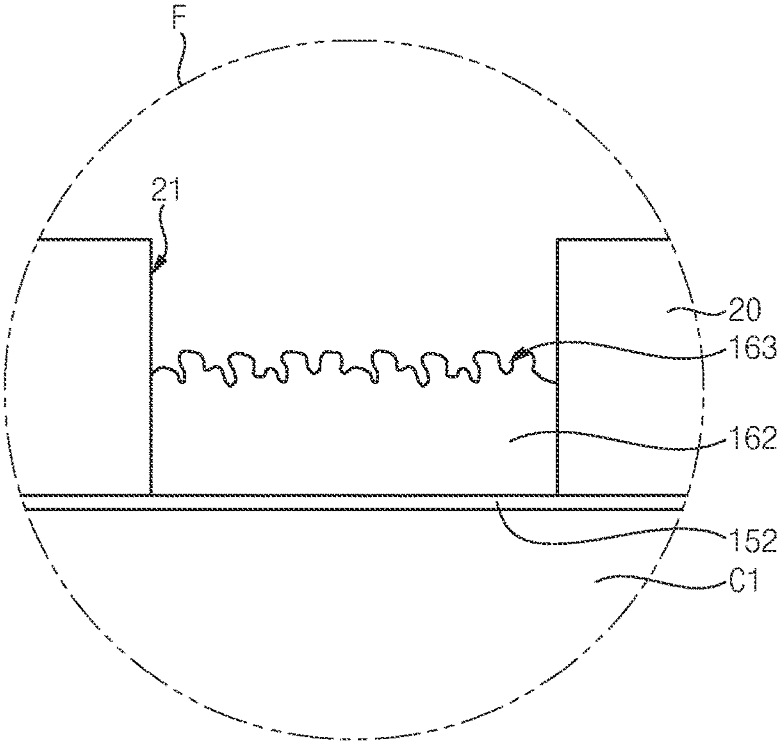

As illustrated in FIG. 37, processes the same as or similar to the processes described with reference to FIG. 8 may be performed to form a concavo-convex pattern 163 on an exposed surface of the wire connection-bonding pads 162 by surface treatment.

For example, a special roughness treatment such as CZ treatment may be performed on the upper surface of the wire connection-bonding pad 162 exposed through the opening 21 of the photoresist pattern 20 to form the concavo-convex pattern 163 in the upper surface of the wire connection-bonding pads 162. The concavo-convex pattern 163 may be an anchoring pattern. The concavo-convex pattern 163 may have grooves formed in the upper surface of the wire connection-bonding pad 162 to be filled with a ductile metal.

Figure 38:
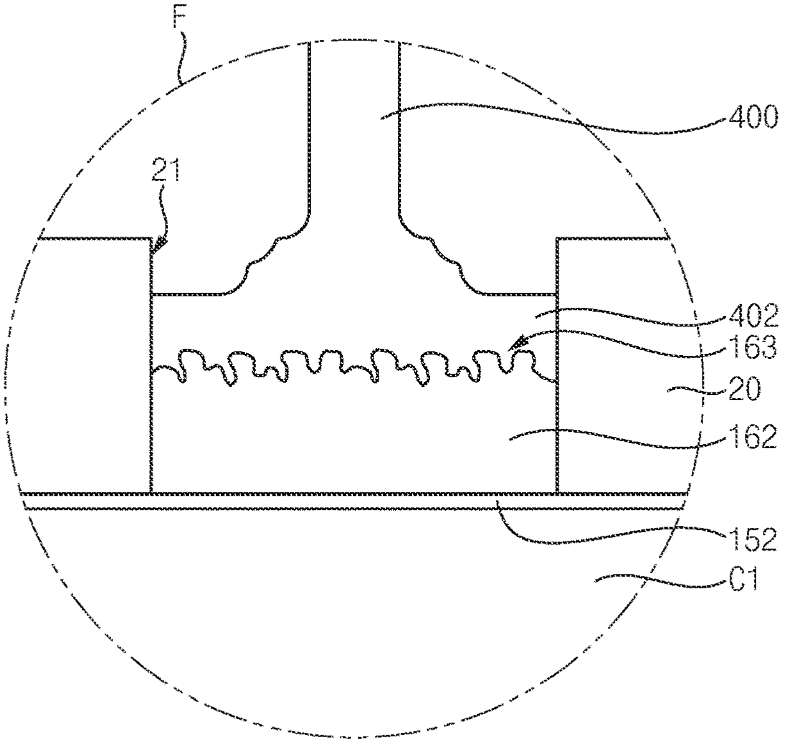

As illustrated in FIG. 38, processes the same as or similar to the processes described with reference to FIGS. 9 and 10 may be performed for form a conductive wire 400 on the wire connection-bonding pad 162 having the concavo-convex pattern 163.

For example, the conductive wire 400 may be formed by a bonding wire process. The conductive wire 400 may have a first end portion 402 as a portion bonded to the wire connection-bonding pad 162. Since the concavo-convex pattern 163 is formed in the upper surface of the wire connection-bonding pad 162, a contact area between the wire connection-bonding pad 162 and the conductive wire 400 may be increased and a portion of the conductive wire metal may be formed to fill the grooves of the concavo-convex pattern 163 to generate an anchoring effect. Accordingly, adhesion between the wire connection-bonding pad 162 and the conductive wire 400 may be improved to increase the yield of the bonding wire process.

As illustrated in FIG. 39, processes the same as or similar to the processes described with reference to FIG. 11 may be form an additional plating pattern AP on a surface of the conductive wire 400 by an additional plating process. Accordingly, vertical conductive wires 410 having a relatively large thickness may be formed on the wire connection-bonding pads 162 located in the second region R2.

Then, as illustrated in FIGS. 40 and 41, the photoresist pattern 20 may be removed from the first carrier substrate C1 and a portion of the seed layer 152 exposed by removing the photoresist pattern 20 may be removed to form a seed layer pattern 153.

Accordingly, the plurality of vertical conductive wires 410 may be respectively formed on the bonding pads 162 positioned in the second region R2 and having the concave-convex patterns 163.

Figure 42:
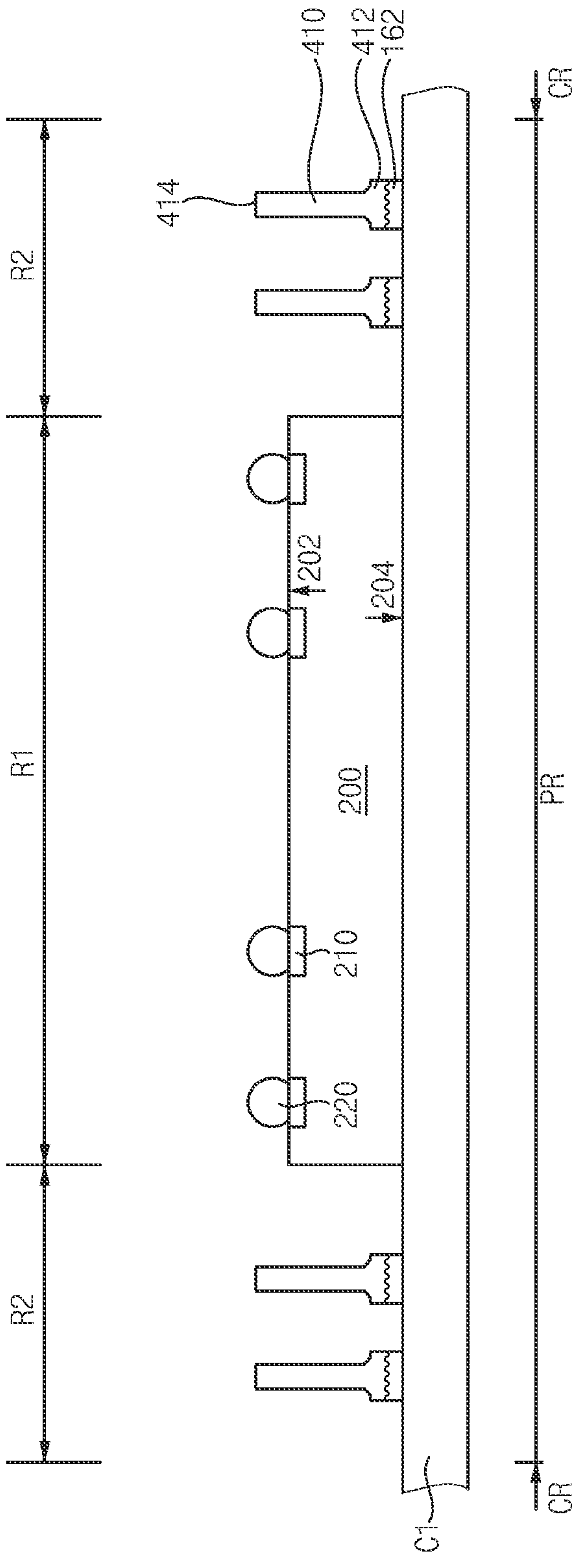

Referring to FIG. 42, at least one semiconductor chip 200 may be disposed on the first carrier substrate C1.

In some example embodiments, conductive bumps 220 are formed on chip pads 210 of the semiconductor chip 200, and the semiconductor chip 200 may be arranged such that a backside surface 204 opposite to a front surface 202 on which the chip pads 210 are formed, that is, an active surface faces the first carrier substrate C1. The semiconductor chip 200 may be disposed in the first region R1 that is a fan-in region of the first carrier substrate C1. The plurality of vertical conductive wires 410 may be disposed in the second region R2 around the semiconductor chip 200.

The conductive bump 220 may include a pillar bump formed on the chip pad 210 of the semiconductor chip 200 and a solder bump formed on the pillar bump. In some example embodiments, the conductive bump 220 may include a solder bump formed on the chip pad 210 of the semiconductor chip 200.

Figure 43:
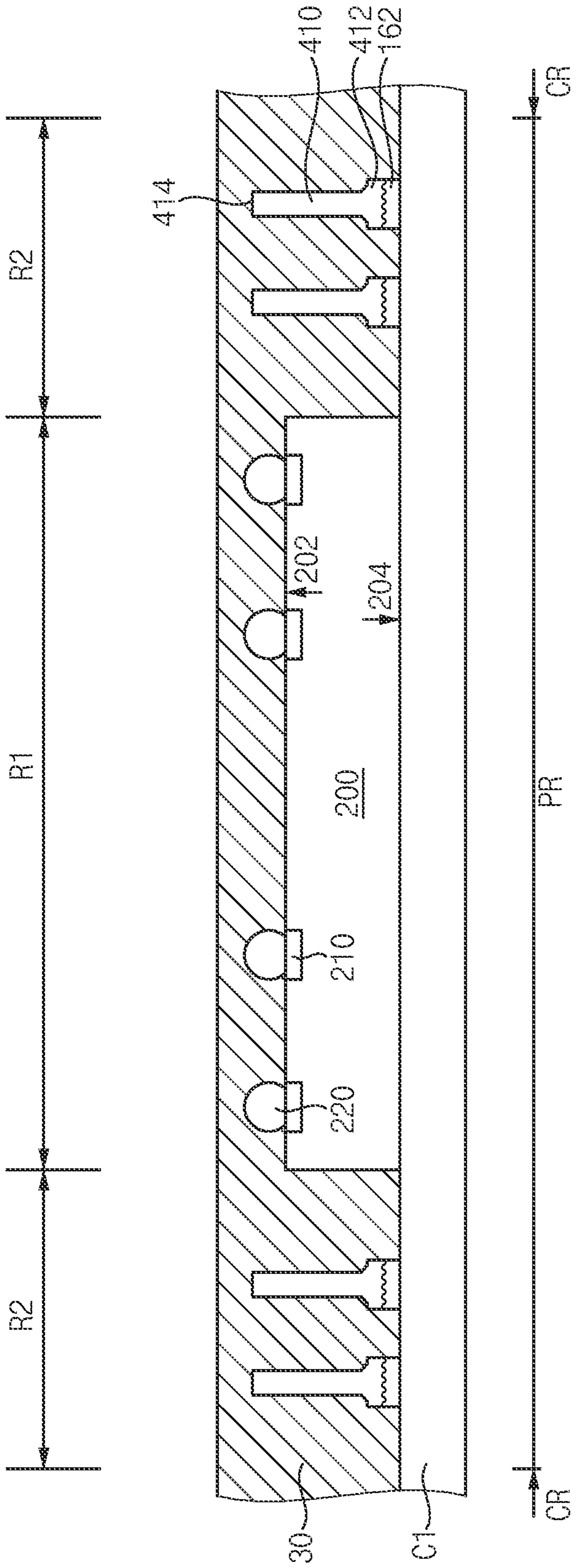
Figure 44:
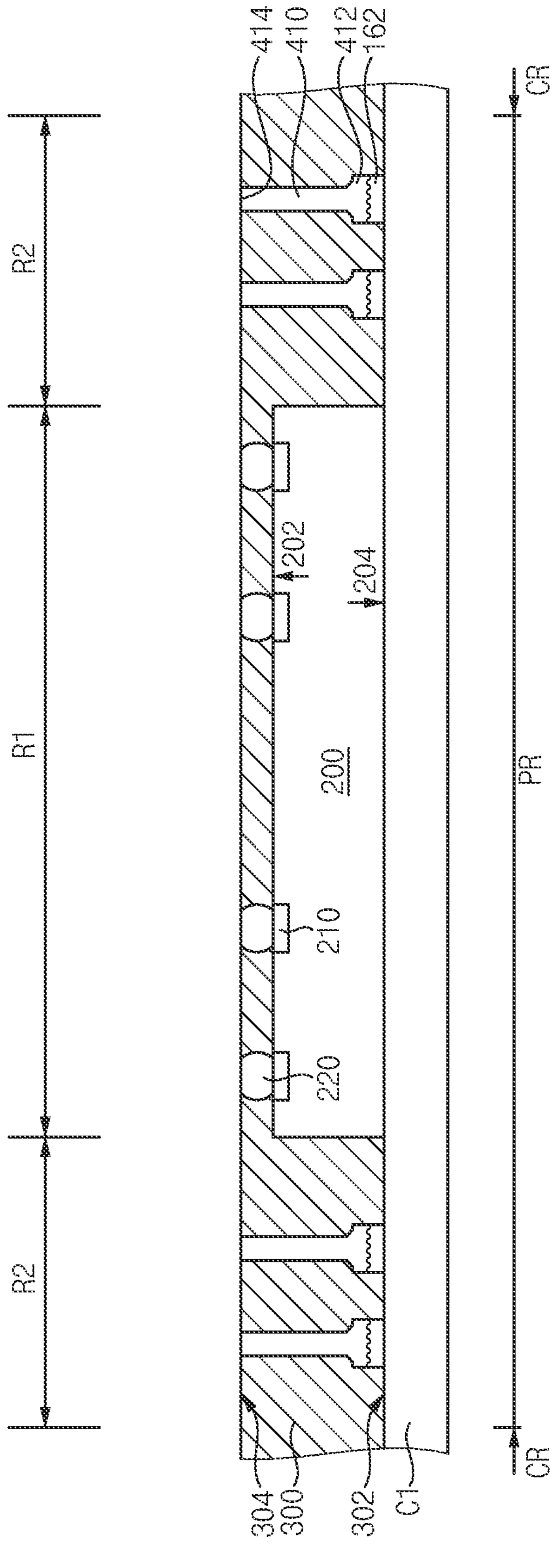

Referring to FIGS. 43 and 44, a sealing material 30 may be formed on a first carrier substrate C1 to cover the semiconductor chip 200 and the plurality of vertical conductive wires 410, and an upper portion of the sealing material 30 may be partially removed to form a sealing member 300 that exposes upper surfaces of the conductive bumps 220 on the front surface 202 of the semiconductor chip 200 and upper surfaces of the plurality of vertical conductive wires 410.

The sealing material 30 may be formed to cover the front surface 202 of the semiconductor chip 200 and the upper surfaces of the plurality of vertical conductive wires 410. For example, the sealing material 30 may include an epoxy molding compound (EMC).

The upper portion of the sealing material 30 may be partially removed by a grinding process. As the upper portion of the sealing material 30 is removed, the conductive bumps 220 on the front surface 202 of the semiconductor chip 200 and the plurality of vertical conductive wires 410 may be exposed from a second surface 304 of the sealing member 300. The sealing member 300 may include a first sealing portion covering the front surface 202 of the semiconductor chip 200 and a second sealing portion covering a side surface of the semiconductor chip 200. The upper surfaces of the conductive bumps 220 on the front surface 202 of the semiconductor chip 200 may be exposed by the first sealing portion of the sealing member 300.

Figure 45:
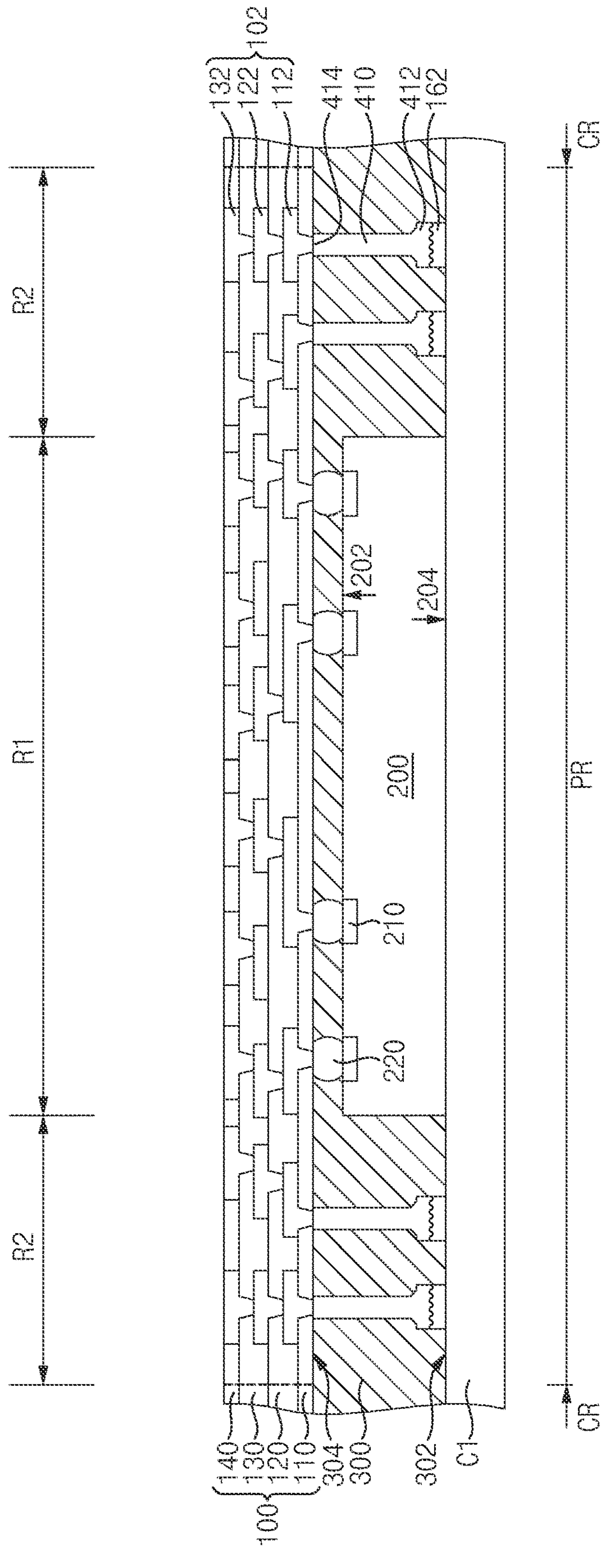

Referring to FIG. 45, a lower redistribution wiring layer 100 having first redistribution wiring 102 may be formed on the second surface 304 of the sealing member 300 and the front surface 202 of the semiconductor chip 200.

In some example embodiments, after a first lower insulating layer 110 is formed on the second surface 304 of the sealing member 300 and the front surface of the semiconductor chip 200, the first lower insulating layer 110 may be patterned to form openings that expose the vertical conductive wires 410 and the conductive bumps 220. Some of the openings of the patterned first lower insulating layer 110 may expose the vertical conductive wires 410 and other of the openings may expose the conductive bumps 220.

After a seed layer is formed on the vertical conductive wires 410 and the conductive bumps 220 and in the openings, the seed layer may be patterned and an electroplating process may be performed to form the first lower redistribution wirings 112. Accordingly, at least portions of the first lower redistribution wirings 112 may directly contact second end portions 414 of the vertical conductive wires 410 and the conductive bumps 220 through the openings of the first lower insulating layer 110.

Similarly, after a second lower insulating layer 120 is formed on the first lower insulating layer 110, the second lower insulating layer 120 may be patterned to form openings that expose the first lower redistribution wirings 112. Then, second lower redistribution wirings 122 may be formed on the second lower insulating layer 120 to directly contact the first lower redistribution wirings 112 through the openings of the second lower insulating layer 120.

Then, after a third lower insulating layer 130 is formed on the second lower insulating layer 120, the third lower insulating layer 130 may be patterned to form openings that expose the second lower redistribution wirings 122. Then, third lower redistribution wirings 132 may be formed on the third lower insulating layer 130 to directly contact the second lower redistribution wirings 122 through the openings of the third lower insulating layer 130.

Then, package pads (not illustrated) may be formed on the third lower redistribution wirings 132, and a fourth lower insulating layer 140 may be formed on the third lower redistribution layer 130 to exposed at least portions of the package pads on the third lower insulating wirings 132. The fourth lower insulating layer 140 may serve as a passivation layer.

Figure 46:
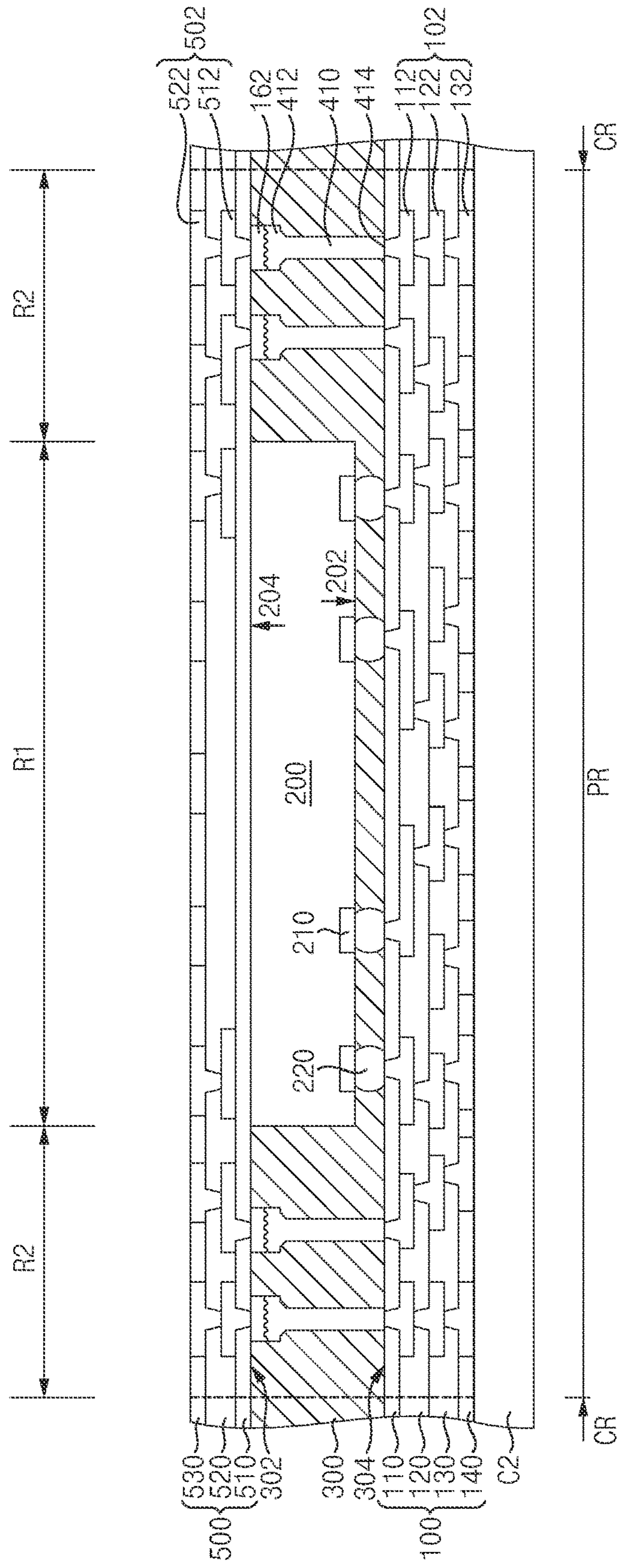

Referring to FIG. 46, after removing the first carrier substrate C1, the structure of FIG. 45 may be turned over, and processes the same as or similar to the processes described with reference to FIG. 17 may be performed to form an upper redistribution wiring layer 500 on the first surface 302 of the sealing member 300. The upper redistribution wiring layer 500 may have second redistribution wirings 502 electrically connected to the vertical conductive wires 410.

In some example embodiments, after a first upper insulating layer 510 is formed on the first surface 302 of the sealing member 300, the first upper insulating layer 510 may be patterned to form openings that expose the wire connection-bonding pads 162. The openings of the patterned first upper insulating layer 510 may expose the wire connection-bonding pads 162.

Then, after a seed layer is formed on portions of the exposed wire connection-bonding pads 162 and in the openings, the seed layer may be patterned and an electro plating process may be performed to form first upper redistribution wirings 512. Accordingly, at least portions of the first upper redistribution wirings 512 may be electrically connected to the vertical conductive wires 410 through the openings of the first upper redistribution wiring layer 510.

Then, after a second upper insulating layer 520 is formed on the first upper insulating layer 510, the second upper insulating layer 520 may be patterned to form openings that expose the first upper redistribution wirings 512. Then, second upper redistribution wirings 522 may be formed on the second upper insulating layer 520 to directly contact the first upper redistribution wirings 512 through the openings of the second upper insulating layer 520.

Accordingly, the second redistribution wirings 502 may include the first upper redistribution wiring 512 and the second upper redistribution wiring 522 stacked in at least two layers. In this case, the second upper redistribution wiring 522 may correspond to an uppermost redistribution wiring among the second redistribution wirings.

Then, upper bonding pads (not illustrated) may be formed on the second upper redistribution wirings 522 as the uppermost redistribution wirings, respectively, and a third upper insulating layer 530 may be formed on the second upper insulating layer 520 to expose at least a portion of the upper bonding pad on the second upper redistribution wiring 522. The third upper insulating layer 530 may serve as a passivation layer.

Then, the second carrier substrate C2 may be removed, and external connection members 550 (see FIG. 33) may be formed on the package pads on the outer surface, that is, the lower surface of the lower redistribution wiring layer 100.

Then, the lower redistribution wiring layer 100 may be separated into individual lower redistribution wiring layers 100 through a sawing process to complete a fan out wafer level package 12 of FIG. 33 including the sealing member 300, the lower redistribution wiring layer 100 formed on the lower surface 304 of the sealing member 300 and the upper redistribution wiring layer 500 formed on the upper surface 302 the sealing member 300.

Figure 47:
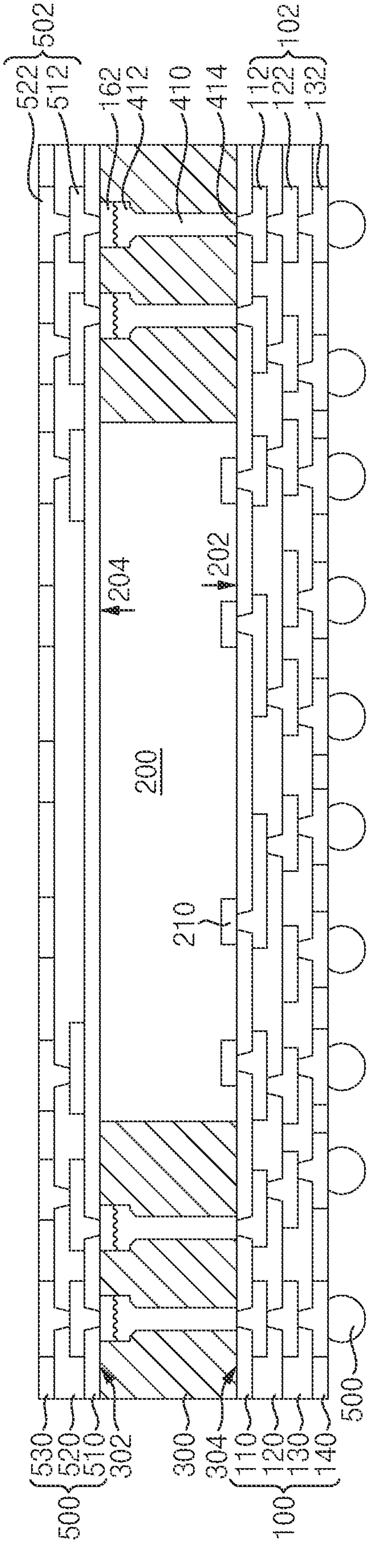
FIG. 47 is a cross-sectional view illustrating a semiconductor package in accordance with some example embodiments.

FIG. 47 is a cross-sectional view illustrating a semiconductor package in accordance with some example embodiments. The semiconductor package may be substantially the same as the semiconductor package described with reference to FIG. 33 except for a connection relationship between a semiconductor chip and a lower redistribution wiring layer. Thus, same reference numerals may be used to refer to the same or like elements and any further repetitive explanation concerning the above elements will be omitted for conciseness.

Referring to FIG. 47, a semiconductor package 13 may include a lower redistribution wiring layer 100, a semiconductor chip 200 disposed on the lower redistribution wiring layer 100, a sealing member 300 on the lower redistribution wiring layer 100 to cover at least one side surface of the semiconductor chip 200, an upper redistribution wiring layer 500 disposed on the sealing member 300, and a plurality of vertical conductive wires 410 penetrating the sealing member 300 and electrically connect the lower redistribution wiring layer 100 and the upper redistribution wiring layer 500 to each other. In some example embodiments, the semiconductor package 12 may further include external connection members 550 disposed on an outer surface of the lower redistribution wiring layer 100.

In some example embodiments, the semiconductor chip 200 may have a plurality of chip pads 210 on a first surface 202, that is, an active surface thereof. The semiconductor chip 200 may be accommodated in the sealing member 300 such that the first surface 302 on which the chip pads 210 are formed faces the lower redistribution wiring layer 100. The sealing member 300 may cover an outer surface of the semiconductor chip 200. The first surface 202 of the semiconductor chip 200 may be exposed from a second surface 304 of the sealing member 300, and a second surface 204 opposite to the first surface 202 of the semiconductor chip 200 may be exposed from a first surface 302 of the sealing member 300.

In some example embodiments, the lower redistribution wiring layer 100 may be disposed on the second surface 304 of the sealing member 300 and the first surface 202 of the semiconductor chip 200. The lower redistribution wiring layer 100 may include a plurality of first redistribution wirings 102. The first redistribution wirings 102 may be electrically connected to the chip pads 210 of the semiconductor chip 200 and the vertical conductive wires 410. The first redistribution wirings 302 may be provided on the front surface 202 of the semiconductor chip 200 and the second surface 304 of the sealing member 300 to serve as front redistribution wirings. Accordingly, the lower redistribution wiring layer 100 may be a front redistribution wiring layer of a fan out package.

Hereinafter, a method of manufacturing the semiconductor package of FIG. 47 will be described.

FIGS. 48 to 52 are cross-sectional views illustrating a method of manufacturing a semiconductor package in accordance with some example embodiments.

Figure 48:
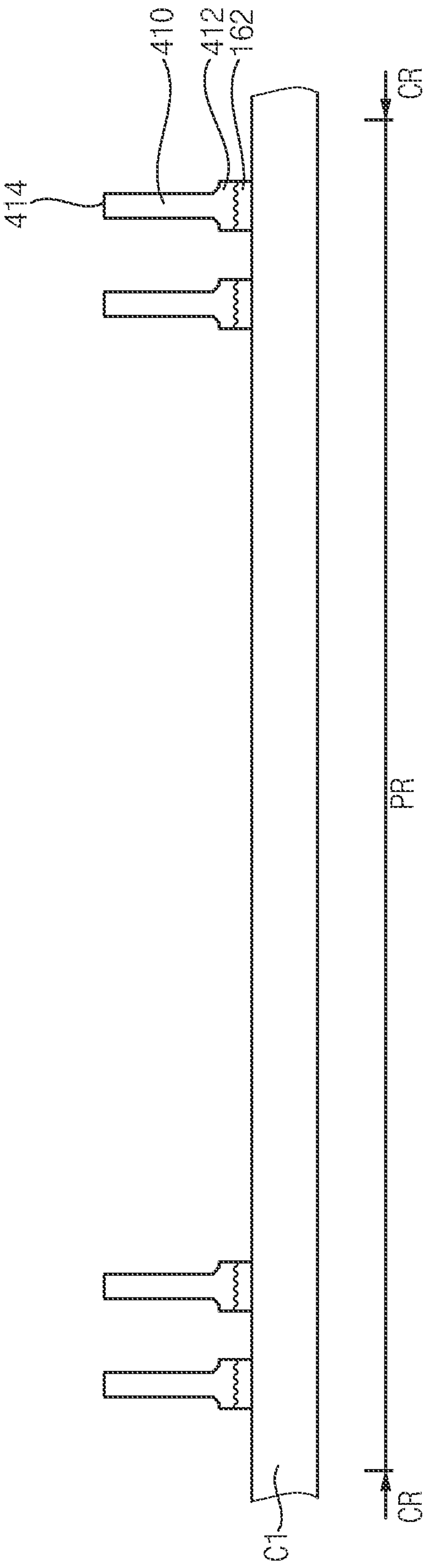

Referring to FIG. 48, first, processes the same as or similar to the described with reference to FIGS. 35 to 41 may be performed to form wire connection-bonding pads 162 and vertical conductive wires 410.

Figure 49:
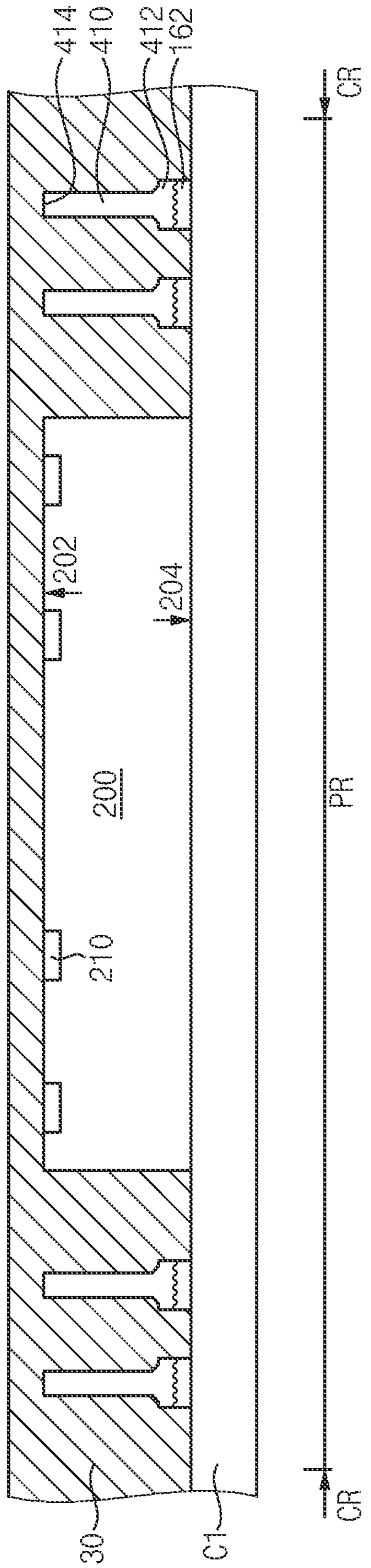

Referring to FIG. 49, at least one semiconductor chip 200 may be disposed on a first carrier substrate C1, and a sealing material 30 may be disposed on the first carrier substrate C1 to form the semiconductor chip 200 and the plurality of vertical conductive wires 410.

In some example embodiments, the semiconductor chip 200 may be disposed in a fan-in region of the first carrier substrate C1. The vertical conductive wires 410 may be arranged around the semiconductor chip 200. The semiconductor chip 200 may be disposed such that a backside surface 204 opposite to a front surface 202 on which chip pads 210 are formed, that is, an active surface faces the first carrier substrate C1.

Figure 50:
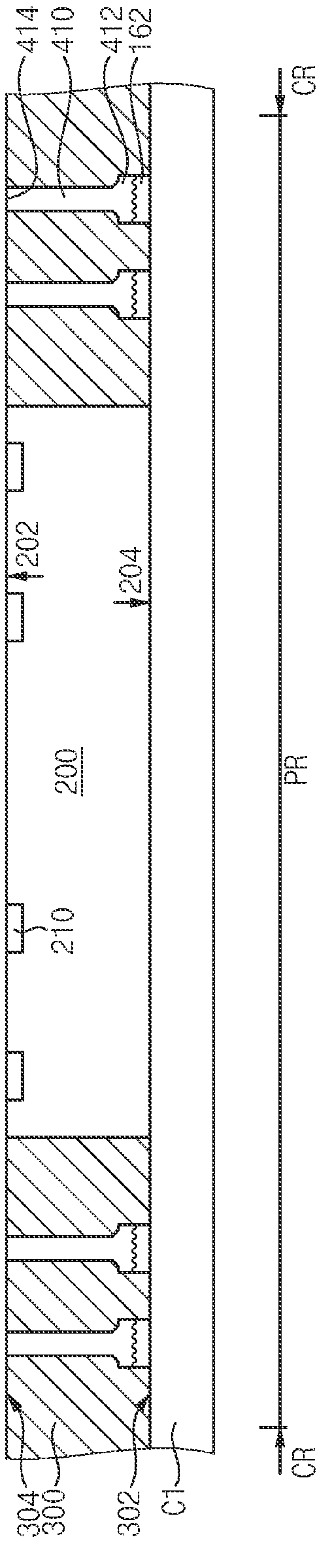

Referring to FIG. 50, an upper portion of the sealing material 30 may be removed to form a sealing member 300 that expose the front surface 202 of the semiconductor chip 200 and first end portions 414 of the plurality of vertical conductive wires 410.

The upper portion of the sealing material 30 may be partially removed by a grinding process. As the upper portion of the sealing material 30 is removed, the chip pads 210 on the front surface 202 of the semiconductor chip 200 and the first end portions 414 of the plurality of vertical conductive wires 410 may be exposed from a second surface 304 of the sealing member 300. The sealing member 300 may cover the side surface of the semiconductor chip 200.

Figure 51:
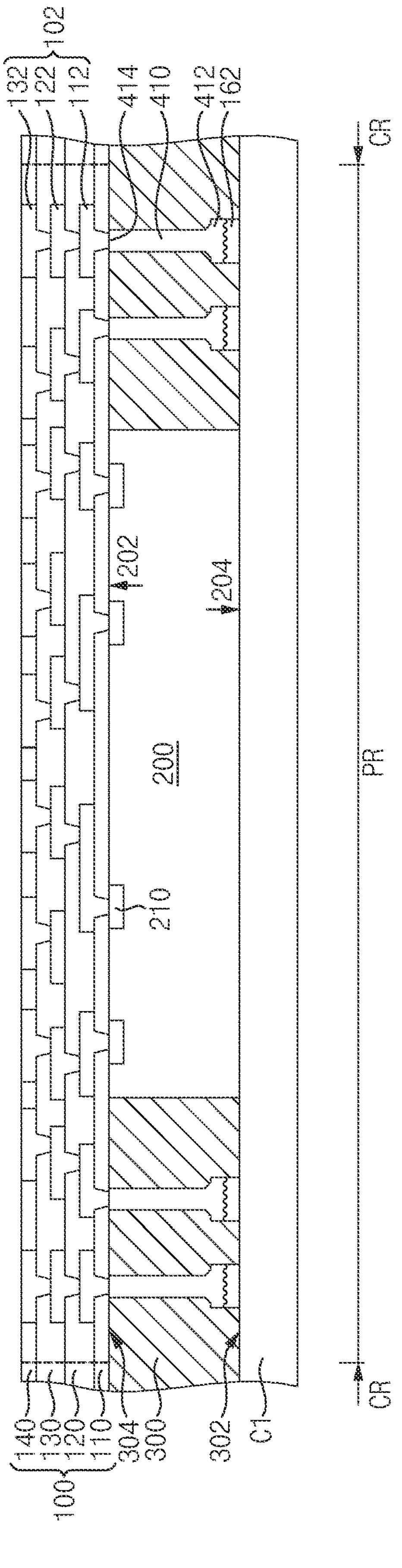

Referring to FIG. 51, processes the same as or similar to the processes described with reference to FIG. 45 may be performed to form a lower redistribution wiring layer 100 having first redistribution wirings 102 on the second surface 304 of the sealing member 300 and the front surface 202 of the semiconductor chip 200.

In some example embodiments, after a first lower insulating layer 110 is formed on the second surface 304 of the sealing member 300, the first lower insulating layer 110 may be patterned to form openings that expose the vertical conductive wires 410 and the chip pads 210 of the semiconductor chip 200, respectively. Some of the openings of the patterned first upper insulating layer 410 may expose the vertical conductive wires 410 and other of the openings may expose the chip pads 210 of the semiconductor chip 200.

After a seed layer is formed on the vertical conductive wires 410 and the chip pads 210 and in the openings, the seed layer may be patterned and an electro plating process may be performed to form first lower redistribution wirings 112. Accordingly, at least portions of the first lower redistribution wirings 112 may directly contact the vertical conductive wires 410 and the chip pads 210 through the openings of the first lower insulating layer 110.

Then, after a second lower insulating layer 120 is formed on the first lower insulating layer 110, the second lower insulating layer 120 may be patterned to form openings that expose the first lower redistribution wirings 122. Then, second lower redistribution wirings 132 may be formed on the second lower insulating layer 120 to directly contact the first lower redistribution wirings 122 through the openings of the second lower insulating layer 120.

Then, after a third lower insulating layer 130 is formed on the second lower insulating layer 120, the third lower insulating layer 130 may be patterned to form openings that expose the second lower redistribution wirings 122. Then, third lower redistribution wirings 132 may be formed on the third lower insulating layer 130 to directly contact the second lower redistribution wirings 122 through the openings of the third lower insulating layer 130.

Then, package pads (not illustrated) may be formed on the third lower redistribution wirings 132, and a fourth lower insulating layer 140 may be formed on the third lower insulating layer 130 to expose at least a portion of the package pad on the third lower redistribution wiring 132. The fourth lower insulating layer 140 may serve as a passivation layer.

Figure 52:
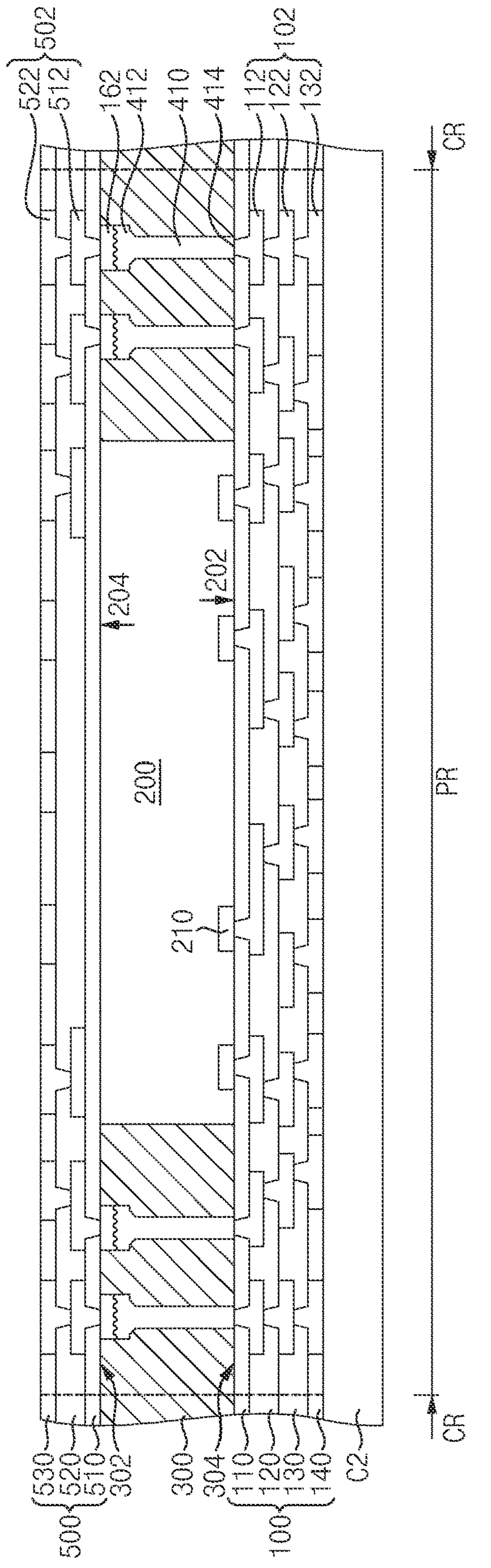

Referring to FIG. 52, processes the same as or similar to the processes described with reference to FIG. 46 may be performed to an upper redistribution wiring layer 500 having second redistribution wirings 502 electrically connected to the vertical conductive wires 410 on the upper surface 302 of the sealing member 300, and external connection members 550 may be formed on an outer surface of the lower redistribution wiring layer 100 respectively to be electrically connected to the first redistribution wirings 102, to complete the fan out wafer level package 13 of FIG. 29.

In some example embodiments, the semiconductor package may include semiconductor devices such as logic devices or memory devices. In some example embodiments, the semiconductor package may include logic devices such as central processing units (CPUs), main processing units (MPUs), or application processors (APs), or the like, and volatile memory devices such as DRAM devices, HBM devices, or non-volatile memory devices such as flash memory devices, PRAM devices, MRAM devices, ReRAM devices, or the like.

The foregoing is illustrative of example embodiments and is not to be construed as limiting thereof. Although a few example embodiments have been described, those skilled in the art will readily appreciate that many modifications are possible without materially departing from the novel teachings and advantages of the present disclosure. Accordingly, all such modifications are intended to be included within the scope of example embodiments as defined in the claims.

What is claimed is:

1. A semiconductor package comprising:

a first redistribution wiring layer having a first region and a second region surrounding the first region, the first redistribution wiring layer including a plurality of first insulating layers and a plurality of first redistribution wirings provided in the plurality of first insulating layers;

a semiconductor chip disposed on the first region of the first redistribution wiring layer and electrically connected to the plurality of first redistribution wirings;

a sealing member on the first redistribution wiring layer, the sealing member covering the semiconductor chip on the first redistribution wiring layer;

a plurality of vertical conductive wires penetrating the sealing member on the second region of the first redistribution wiring layer and electrically connected to the plurality of first redistribution wirings;

a second redistribution wiring layer disposed on the sealing member, the second redistribution wiring layer including a plurality of second insulating layers and a plurality of second redistribution wirings provided in the plurality of second insulating layers and electrically connected to the plurality of vertical conductive wires; and a plurality of bonding pads disposed on an upper surface of an uppermost first redistribution wiring among the plurality of first redistribution wirings of the first redistribution wiring layer and exposed from an uppermost first insulating layer of the plurality of first insulating layers, or disposed on a lower surface of a lowermost second redistribution wiring among the plurality of second redistribution wirings of the second redistribution wiring layer and exposed from a lowermost second insulating layer of the plurality of second insulating layers, each of the plurality of bonding pads having a concavo-convex pattern formed in a surface of the bonding pad, wherein the plurality of vertical conductive wires are bonded to the concavo-convex patterns of the plurality of bonding pads, respectively.

2. The semiconductor package of claim 1, wherein each of the plurality of bonding pads includes copper, and each of the plurality of vertical conductive wires includes at least one of gold, silver and copper.

3. The semiconductor package of claim 1, wherein each of the plurality of vertical conductive wires are made of a metal, and the concavo-convex pattern has a plurality of grooves filled with the metal of the corresponding vertical conductive wire that is bonded to the concavo-convex pattern.

4. The semiconductor package of claim 1, wherein the concavo-convex pattern is provided in the surface of the bonding pad and a side surface of the bonding pad.

5. The semiconductor package of claim 1, further comprising:

a plating pattern provided on the concavo-convex pattern.

6. The semiconductor package of claim 5, wherein the plating pattern includes at least one of nickel, gold and titanium.

7. The semiconductor package of claim 1, wherein the concavo-convex pattern includes an embossed plating pattern formed on the surface of the bonding pad.

8. The semiconductor package of claim 1, wherein the vertical conductive wire covers a side surface of the bonding pad.

9. The semiconductor package of claim 1, wherein the bonding pad has a diameter of 1 μm to 500 μm, and the vertical conductive wire has a maximum diameter of 2.5 μm to 100 μm.

10. The semiconductor package of claim 1, further comprising:

a second package disposed on the second redistribution wiring layer, wherein the second package includes a package substrate and at least one second semiconductor chip stacked on the package substrate.

11. A semiconductor package comprising:

a first redistribution wiring layer including a plurality of first insulating layers and a plurality of first redistribution wirings provided in the plurality of first insulating layers;

a semiconductor chip disposed on the first redistribution wiring layer such that a first surface of the semiconductor chip on which a plurality of chip pads are formed faces the first redistribution wiring layer;

a sealing member on the first redistribution wiring layer, the sealing member covering the semiconductor chip on the first redistribution wiring layer;

a plurality of vertical conductive wires penetrating the sealing member and electrically connected to the plurality of first redistribution wirings;

a second redistribution wiring layer disposed on the sealing member; and a plurality of bonding pads bonded to first end portions of the plurality of vertical conductive wires respectively, wherein each of the plurality of bonding pads is disposed on an uppermost first redistribution wiring among the plurality of first redistribution wirings and exposed from an uppermost first insulating layer of the plurality of first insulating layers, and wherein each of the plurality of bonding pads has a concavo-convex pattern formed in a bonding surface thereof, and the concavo-convex pattern has a plurality of grooves filled with a metal of the corresponding vertical conductive wire.

12. The semiconductor package of claim 11, wherein each of the plurality of bonding pads includes copper, and each of the plurality of vertical conductive wires includes at least one of gold, silver and copper.

13. The semiconductor package of claim 11, wherein the concavo-convex pattern is provided in an upper surface and a side surface of the bonding pad.

14. The semiconductor package of claim 11, further comprising:

a plating pattern provided on the concavo-convex pattern.

15. The semiconductor package of claim 14, wherein the plating pattern includes at least one nickel, gold and titanium.

16. The semiconductor package of claim 11, wherein the concavo-convex pattern includes an embossed plating pattern formed on an upper surface of the bonding pad.

17. The semiconductor package of claim 11, wherein at least one of the plurality of vertical conductive wires covers a side surface of the bonding pad.

18. The semiconductor package of claim 11, wherein the semiconductor chip is mounted on the first redistribution wiring layer via conductive bumps.

19. The semiconductor package of claim 11, further comprising:

a second package disposed on the second redistribution wiring layer, wherein the second package includes a package substrate and at least one second semiconductor chip stacked on the package substrate.

20. A semiconductor package comprising:

a lower redistribution wiring layer having a first region and a second region surrounding the first region, the lower redistribution wiring layer including a plurality of first insulating layers and a plurality of first redistribution wirings provided in the plurality of first insulating layers;

a semiconductor chip disposed on the first region of the lower redistribution wiring layer and disposed such that a first surface of the semiconductor chip on which a plurality of chip pads are formed faces the lower redistribution wiring layer;

a sealing member on the lower redistribution wiring layer, the sealing member covering the semiconductor chip on the lower redistribution wiring layer;

a plurality of vertical conductive wires penetrating the sealing member on the second region of the lower redistribution wiring layer and electrically connected to the plurality of first redistribution wirings;

an upper redistribution wiring layer disposed on the sealing member, the upper redistribution wiring layer including a plurality of second redistribution wirings electrically connected to the plurality of vertical conductive wires; and a plurality of bonding pads bonded to first end portions of the plurality of vertical conductive wires respectively, wherein each of the plurality of bonding pads is disposed on an uppermost first redistribution wiring among the plurality of first redistribution wirings and exposed from an uppermost first insulating layer of the plurality of first insulating layers, and wherein each of the plurality of bonding pads has a concavo-convex pattern formed in a bonding surface thereof, and the concavo-convex pattern has a plurality of grooves filled with a metal of the corresponding vertical conductive wire.

* * * * *